United States Patent
Takahashi et al.

(10) Patent No.: US 9,052,594 B2
(45) Date of Patent: Jun. 9, 2015

(54) POSITIVE PHOTOSENSITIVE COMPOSITION AND METHOD OF FORMING PATTERN USING THE SAME

(75) Inventors: Hyou Takahashi, Shizuoka (JP); Naoya Sugimoto, Shizuoka (JP); Kunihiko Kodama, Shizuoka (JP); Kei Yamamoto, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/293,290

(22) Filed: Nov. 10, 2011

(65) Prior Publication Data

US 2012/0058431 A1     Mar. 8, 2012

Related U.S. Application Data

(62) Division of application No. 11/657,106, filed on Jan. 24, 2007, now Pat. No. 8,080,361.

(30) Foreign Application Priority Data

Jan. 24, 2006    (JP) ................................. 2006-015348
Mar. 9, 2006    (JP) ................................. 2006-064476

(51) Int. Cl.
| | | |
|---|---|---|
| G03F 7/004 | (2006.01) | |
| G03F 7/26 | (2006.01) | |
| G03F 7/039 | (2006.01) | |
| G03F 7/38 | (2006.01) | |

(52) U.S. Cl.
CPC .............. G03F 7/0397 (2013.01); G03F 7/38 (2013.01); G03F 7/26 (2013.01); *Y10S 430/106* (2013.01); *Y10S 430/111* (2013.01)

(58) Field of Classification Search
CPC ........... G03F 7/0397; G03F 7/26; G03F 7/38; C08F 224/00
USPC ........ 430/270.1, 905, 910, 326; 526/281, 282
See application file for complete search history.

(56) References Cited

U.S. PATENT DOCUMENTS

| | | | |
|---|---|---|---|
| 5,443,690 | A | 8/1995 | Takechi et al. |
| 6,165,674 | A | 12/2000 | Taylor et al. |
| 6,280,898 | B1 | 8/2001 | Hasegawa et al. |
| 6,639,035 | B1 * | 10/2003 | Chen et al. ............... 526/266 |
| 7,005,230 | B2 | 2/2006 | Yamamoto et al. |
| 7,078,148 | B2 | 7/2006 | Shima et al. |
| 7,122,291 | B2 * | 10/2006 | Padmanaban et al. ..... 430/270.1 |
| 7,179,578 | B2 | 2/2007 | Sato et al. |
| RE41,580 | E | 8/2010 | Hasegawa et al. |
| 7,906,268 | B2 | 3/2011 | Inabe et al. |
| 2003/0232270 | A1 | 12/2003 | Chen et al. |
| 2004/0146802 | A1 | 7/2004 | Yamamoto et al. |
| 2004/0259028 | A1 | 12/2004 | Sato |
| 2005/0019689 | A1 | 1/2005 | Kodama et al. |
| 2005/0058938 | A1 | 3/2005 | Tachibana et al. |
| 2005/0064329 | A1 | 3/2005 | Takahashi |
| 2005/0123859 | A1 | 6/2005 | Wada et al. |
| 2006/0040203 | A1 | 2/2006 | Kodama et al. |
| 2006/0057489 | A1 * | 3/2006 | Sumida et al. ............. 430/270.1 |
| 2006/0068320 | A1 | 3/2006 | Takahashi et al. |
| 2006/0234153 | A1 | 10/2006 | Nishimura et al. |

(Continued)

FOREIGN PATENT DOCUMENTS

| | | |
|---|---|---|
| EP | 0 663 616 A2 | 7/1995 |
| EP | 0 877 293 A2 | 11/1998 |

(Continued)

OTHER PUBLICATIONS

Official Communication for EP 07001487 dated Mar. 6, 2009.
Office Action dated Aug. 10, 2010 on European Application No. 07 001 487.3-2222.
Office Action dated Jun. 14, 2011 on Japanese Patent Application No. 2007-012723.
Notice of Reasons for Rejection dated Nov. 1, 2011 from the Japanese Patent Office in couterpart Japanese application No. 2007-012723.

(Continued)

*Primary Examiner* — John Chu
(74) *Attorney, Agent, or Firm* — Sughrue Mion, PLLC

(57) ABSTRACT

A positive photosensitive composition includes: a resin (A) whose dissolution rate in an alkaline developing solution increases by the action of an acid, the resin (A) containing an acid decomposable repeating unit represented by a general formula (I) and an acid nondecomposable repeating unit represented by a general formula (II); and a compound (B) capable of generating an acid upon irradiation with one of active rays and radiations:

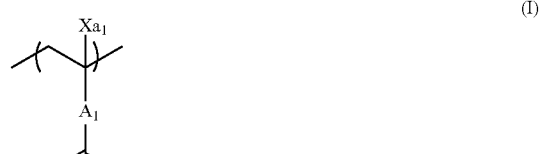

(I)

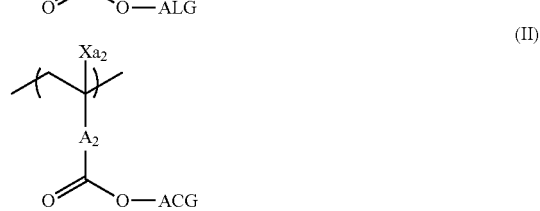

(II)

wherein $Xa_1$ represents one of a hydrogen atom, an alkyl group, a cyano group, and a halogen atom, $A_1$ represents one of a single bond and a divalent connecting group, ALG represents an acid leaving hydrocarbon group, $Xa_2$ represents one of a hydrogen atom, an alkyl group, a cyano group, and a halogen atom, $A_2$ represents one of a single bond and a divalent connecting group, and ACG represents an acid nonleaving hydrocarbon group.

21 Claims, 1 Drawing Sheet

(56) References Cited

U.S. PATENT DOCUMENTS

| | | |
|---|---|---|
| 2007/0042292 A1 | 2/2007 | Yoneda et al. |
| 2007/0269754 A1 | 11/2007 | Fujiwara et al. |
| 2009/0075202 A1 | 3/2009 | Kodama et al. |
| 2009/0148790 A1 | 6/2009 | Nishimura et al. |
| 2009/0305161 A1 | 12/2009 | Nakamura et al. |
| 2011/0076622 A1 | 3/2011 | Inabe et al. |

FOREIGN PATENT DOCUMENTS

| | | |
|---|---|---|
| EP | 1273970 A2 | 1/2003 |
| EP | 1 589 375 A | 10/2005 |
| EP | 1 684 119 A | 7/2006 |
| EP | 1953595 A1 | 8/2008 |
| EP | 1961739 A1 | 8/2008 |
| JP | 09-073173 A | 3/1997 |
| JP | 09-274318 A | 10/1997 |
| JP | 11-338150 A | 12/1999 |
| JP | 2000-159758 A | 6/2000 |
| JP | 2003-167347 A | 6/2003 |
| JP | 2003-223001 A | 8/2003 |
| JP | 2003-238629 A | 8/2003 |
| JP | 2004-279804 A | 10/2004 |
| JP | 2004300403 A | 10/2004 |
| JP | 2004-334156 A | 11/2004 |
| JP | 2005-043852 A | 2/2005 |
| JP | 200531624 A | 2/2005 |
| JP | 200568418 A | 3/2005 |
| JP | 2005-091976 A | 4/2005 |
| JP | 2005-173549 A | 6/2005 |
| JP | 2005139250 A | 6/2005 |
| JP | 2005154427 A | 6/2005 |
| JP | 2005156726 A | 6/2005 |
| JP | 2005-266764 A | 9/2005 |
| JP | 2005-266766 A | 9/2005 |
| JP | 2006-047533 A | 2/2006 |
| JP | 200645136 A | 2/2006 |
| JP | 200645387 A | 2/2006 |
| JP | 200652373 A | 2/2006 |
| JP | 200663016 A | 3/2006 |
| JP | 2006126365 A | 5/2006 |
| JP | 2006243293 A | 9/2006 |
| JP | 200752182 A | 3/2007 |
| JP | 200779552 A | 3/2007 |
| JP | 2007155925 A | 6/2007 |
| KR | 1020040104934 A | 12/2004 |
| TW | I225970 | 1/2005 |
| WO | 2007/058345 A1 | 5/2007 |

OTHER PUBLICATIONS

European Office Action dated Dec. 1, 2011 issued in corresponding European Application No. 07001487.3.

Office Action dated Oct. 12, 2012 in Taiwanese Application No. 096102480.

Office Action dated Jul. 23, 2013 issued by the Korean Intellectual Property Office in counterpart Korean Application No. 1020070007648.

Office Action, dated Jul. 16, 2013 issued by the Japanese Patent Office in counterpart Japanese Application No. 2011-287028.

Office Action dated Jul. 24, 2013 issued by the Taiwanese Patent Office in Taiwanese Application No. 096102480.

Office Action dated Dec. 3, 2013, issued by the Japan Patent Office in corresponding Japanese Application No. 2011-287028.

Office Action dated Jan. 28, 2014 in Korean Application No. 10-2007-0007648.

Office Action dated May 7, 2014, issued by the Japanese Patent Office in counterpart Japanese Patent Application No. 2011-287028.

* cited by examiner

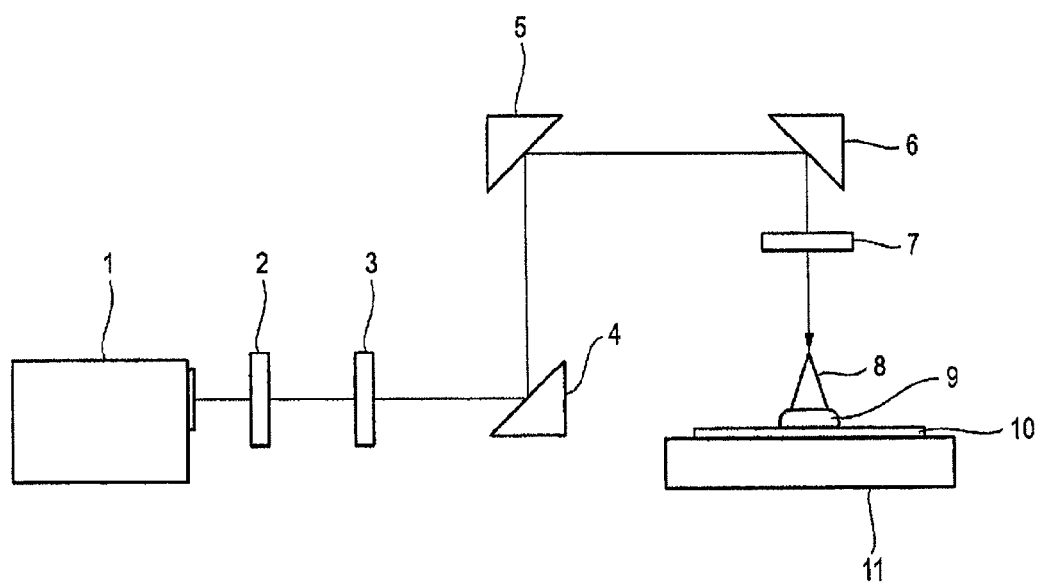

POSITIVE PHOTOSENSITIVE COMPOSITION AND METHOD OF FORMING PATTERN USING THE SAME

This is a Divisional Application of U.S. patent application Ser. No. 11/657,106, filed Jan. 24, 2007 which claims priority from Japanese Appln. Nos. 2006-015348 filed Jan. 24, 2006 and 2006-064476 filed Mar. 9, 2006, the disclosures of which are incorporated by reference herein.

BACKGROUND OF THE INVENTION

1. Field of the Invention

The present invention relates to a positive photosensitive composition which is used for the manufacture of semiconductors such as IC or the manufacture of circuit boards of a liquid crystal, a thermal head, etc. and is further used for other photofabrication steps and to a method of forming pattern using the same. More specifically, the invention relates to a positive photosensitive composition which is suitable in the case of using an irradiation source such as exposure light sources such as far ultraviolet rays of not more than 250 nm, and preferably not more than 220 nm and electron beams and to a method of forming pattern using the same.

2. Background Art

Chemical amplification type photosensitive compositions are a pattern forming material which generates an acid in an exposed area upon irradiation with active rays such as far ultraviolet rays or radiations and changes dissolution properties in a developing solution between an irradiated area and a non-irradiated area of the active rays or radiations by reaction with this acid as a catalyst to form a pattern on a substrate.

In the case of using a KrF excimer laser as an exposure light source, since a resin having, as a basic skeleton, poly(hydroxystyrene) which is low in absorption mainly in a region of 248 nm is used as the principal component, such a chemical amplification type photosensitive composition has high sensitivity and high resolution and forms a good pattern so that they are a good system as compared with related-art naphthoquinonediazide/novolak resin systems.

On the other hand, in the case of using, as an exposure light source, a light source with a shorter wavelength, for example, an ArF excimer laser (193 nm), since an aromatic group-containing compound essentially exhibits large absorption in a region of 193 nm, even the foregoing chemical amplification type photosensitive compositions were not sufficient.

For that reason, there have been developed resists for an ArF excimer laser containing a resin having an alicyclic hydrocarbon structure. For example, JP-A-2003-167347 (the term "JP-A" as used herein means an "unexamined published Japanese patent application")) and JP-A-2003-223001 describe a composition containing a resin containing a polycyclic acid decomposable repeating unit and an acid nondecomposable repeating unit. However, in forming a fine pattern with a line width of, for example, not more than 100 nm, even if the resolution performance is excellent, there were involved a problem of pattern collapse in which the formed line pattern collapses and becomes a defect at the time of manufacturing a device and a problem of development defects by a development residue or the like at the time of development caused due to hydrophobicity of a resist polymer.

Furthermore, JP-A-2004-334156 describes a resist composition containing an acid decomposable resin containing at least two kinds of repeating units having an alicyclic hydrocarbon structure.

However, the related-art resist compositions still involve insufficient points, and further improvements regarding resolving power, isolated DOF and PFE temperature dependency.

That is, under a circumstance where the formation of a fine pattern with a line width of, for example, not more than 100 nm is necessitated, especially in forming an isolated pattern, it has become difficult to make sure of a defocus latitude (DOF), and a resist composition having a broader DOF performance is being demanded.

Moreover, in the case of using a large-sized wafer, it is already known that a scattering in the temperature in post exposure baking (PEB) by a hot plate, etc. affects the resulting pattern. Thus, an improvement of the PEB temperature dependency is being demanded.

SUMMARY OF THE INVENTION (1) A positive photosensitive composition comprising:
  a resin (A) whose dissolution rate in an alkaline developing solution increases by the action of an acid, the resin (A) containing an acid decomposable repeating unit represented by a general formula (I) and an acid nondecomposable repeating unit represented by a general formula (II); and
  a compound (B) capable of generating an acid upon irradiation with one of active rays and radiations:

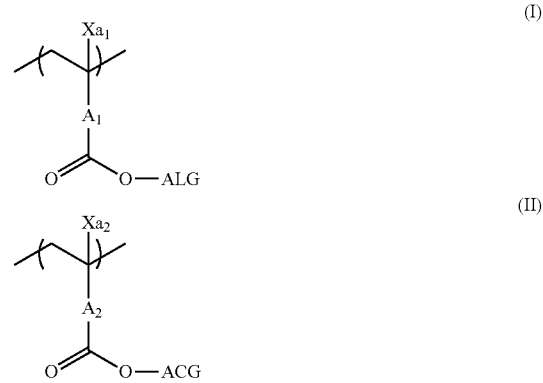

In the general formula (I),
  $Xa_1$ represents one of a hydrogen atom, an alkyl group, a cyano group and a halogen atom,
  $A_1$ represents one of a single bond and a divalent connecting group,
  ALG represents an acid leaving hydrocarbon group.

In the general formula (II),
  $Xa_2$ represents one of a hydrogen atom, an alkyl group, a cyano group, and a halogen atom,
  $A_2$ represents one of a single bond and a divalent connecting group, and
  ACG represents an acid nonleaving hydrocarbon group.

(2) The positive photosensitive composition according to the item (1), wherein the resin (A) is a resin (A 1) in which at least one of the repeating unit represented by the general formula (I) and the repeating unit represented by the general formula (II) does not have a polycyclic hydrocarbon structure.

(3) The positive photosensitive composition according to the item (1) or (2), wherein the acid decomposable repeating unit represented by the general formula (I) is an acid decomposable repeating unit represented by a general formula (I-1):

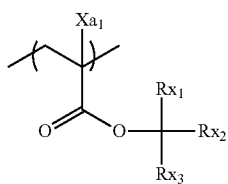
(I-1)

In the general formula (I-I),

Xa$_1$ represents one of a hydrogen atom, an alkyl group, a cyano group and a halogen atom, and Rx$_1$ to Rx$_3$ each independently represents a linear or branched alkyl group, or a monocyclic or polycyclic alkyl group, provided that at least two of Rx$_1$ to Rx$_3$ may be taken together to form one of a monocyclic and polycyclic alkyl group.

(4) The positive photosensitive composition according to the item (2), wherein ACG in the general formula (II) has a polycyclic hydrocarbon structure, and ALG in the general formula (I) does not have a polycyclic hydrocarbon structure.

(5) The positive photosensitive composition according to the item (2), wherein ALG in the general formula (I) has a polycyclic hydrocarbon structure, and ACG in the general formula (II) does not have a polycyclic hydrocarbon structure.

(6) The positive photosensitive composition according to item (2), wherein both ALG in the general formula (I) and ACG in the general formula (II) do not have a polycyclic hydrocarbon structure.

(7) The positive photosensitive composition according to the item (1) or (2), wherein the acid decomposable repeating unit represented by the general formula (I) is an acid decomposable repeating unit represented by one of formulae (I-1a) and (I-1b):

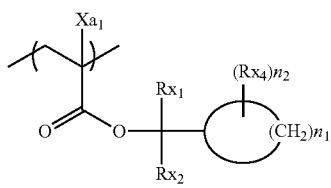
(I-1a)

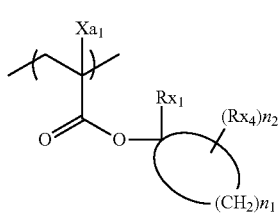
(I-1b)

In the general formulae (I-1a) and (I-1b),

Xa$_1$ represents one of a hydrogen atom, an alkyl group, a cyano group and a halogen atom, Rx$_1$ and Rx$_2$ each independently represents a linear or branched alkyl group, or a monocyclic alkyl group, Rx$_4$ represents a linear or branched alkyl group, or a monocyclic alkyl group, n$_1$ represents one of 4 and 5, and n$_2$ represents from 0 to 3.

(8) The positive photosensitive composition according to the item (1) or (2), wherein the acid nondecomposable repeating unit represented by the general formula (II) is an acid nondecomposable repeating unit represented by a formula (II-1):

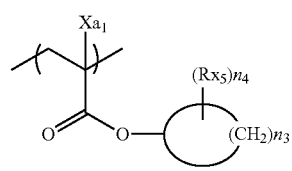
(II-1)

In the general formula (II-1),

Xa$_2$ represents one of a hydrogen atom, an alkyl group, a cyano group and a halogen atom, Rx$_5$ represents a linear or branched alkyl group, or a monocyclic alkyl group, n$_3$ represents one of 4 and 5, and n$_4$ represents from 0 to 3.

(9) The positive photosensitive composition according to any one of the items (1) to (8), wherein the component (B) further comprises at least one kind of a repeating unit selected from a lactone group-containing repeating unit, a hydroxyl group-containing repeating unit, a cyano group-containing repeating unit, and an acid group-containing repeating unit.

(10) The positive photosensitive composition according to claim 1, wherein the resin (A) is a resin (A2) in which the repeating unit represented by the general formula (I) is at least one kind of a repeating unit selected from a repeating unit represented by a general formula (1) and a repeating unit represented by a general formula (2); and the repeating unit represented by the general formula (II) is a repeating unit represented by a general formula (3):

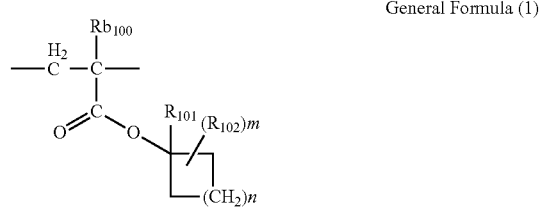
General Formula (1)

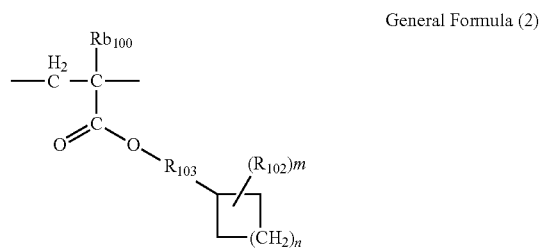
General Formula (2)

General Formula (3)

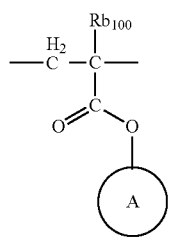

In the general formulae (1) to (3)

$R_{100}$ represents one of a hydrogen atom and an alkyl group, $R_{101}$ represents an alkyl group, $R_{102}$ represents an alkyl group, provided that when plural $R_{102}$s are present, the plural $R_{102}$s may be the same or different, or may be taken together to form a ring, $R_{103}$ represents a connecting group containing a tertiary carbon atom, with the tertiary carbon atom being bound to the cyclic structure in the general formula (2), A represents a nonleaving group having a cyclic structure which comprises a carbon atom and a hydrogen atom, n represents an integer of from 0 to 5, and m represents an integer of from 0 to (n+2).

(11) The positive photosensitive composition according to the item (10), wherein the resin component (A) further comprising a repeating unit represented by the following general formula (4):

General Formula (4)

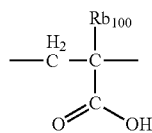

In the general formula (4), $R_{100}$ represents one of a hydrogen atom and an alkyl group.

(12) The positive photosensitive composition according to the item (10) or (11), further comprising a basic compound (C).

(13) A method of forming pattern comprising: forming a photosensitive layer by the positive photosensitive composition according to any one of the items (1) to (12); and exposing and developing the photosensitive layer.

According to the invention, it is possible to provide a positive photosensitive composition which even in forming a fine pattern of not more than 100 nm, is improved in pattern collapse, is less in development defects and is excellent in various performances including resolving power, isolated DOF and PEB temperature dependency and a method of forming a pattern using the same.

BRIEF DESCRIPTION OF THE DRAWINGS

The invention disclosed herein will be understood better with reference to the following drawings of which:

FIG. 1 is an outline view of a two-beam interference exposure experimental device.

DETAILED DESCRIPTION OF THE INVENTION

Best modes for carrying out the invention are hereunder described.

Incidentally, in the expressions of the groups (atomic groups) in this specification, it should be construed that the expression which does not specifically express "substituted" or "unsubstituted" includes both a group not containing a substituent and a group containing a substituent. For example, the term "alkyl group" as referred to herein includes not only a substituent-free alkyl group (unsubstituted alkyl group) but also a substituent-containing alkyl group (substituted alkyl group).

The positive photosensitive composition of the invention contains a resin (A) whose dissolution rate in an alkaline developing solution increases by the action of an acid, the resin (A) containing an acid decomposable repeating unit represented by the following general formula (I) and an acid nondecomposable repeating unit represented by the following general formula (II); and a compound (B) capable of generating an acid upon irradiation with active rays or radiations.

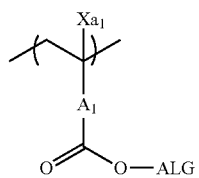

(I)

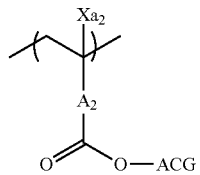

(II)

In the general formula (I), $Xa_1$ represents a hydrogen atom, an alkyl group, a cyano group, or a halogen atom, $A_1$ represents a single bond or a divalent connecting group, and ALG represents an acid leaving group.

In the general formula (II), $Xa_2$ represents a hydrogen atom, an alkyl group, a cyano group, or a halogen atom, $A_2$ represents a single bond or a divalent connecting group, and ACG represents an acid nonleaving hydrocarbon group.

In the invention, by using the foregoing resin (A), a positive photosensitive composition which is improved in view of various performances including pattern collapse, development defects, resolving power, isolated DOF, and PEB temperature dependency can be provided.

In particular, by using a resin (A1) in which at least one of the repeating unit represented by the general formula (I) and the repeating unit represented by the general formula (II) does not have a polycyclic hydrocarbon structure, a positive photosensitive composition which is excellent in view of pattern collapse and development defects can be provided. Then, in particular, by using a resin (A2) in which the repeating unit represented by the general formula (I) is at least one kind of a repeating unit selected from a repeating unit represented by the following general formula (1) and a repeating unit represented by the following general formula (2); and the repeating unit represented by the general formula (II) is a repeating unit represented by the following general formula (3), a positive photosensitive composition which is excellent in view of resolving power, isolated DOF and PEB temperature dependency can be provided.

[1] Resin (A) Whose Dissolution Rate in an Alkaline Developing Solution Increases by the Action of an Acid:

The resin (A) whose dissolution rate in an alkaline developing solution increases by the action of an acid is a resin containing an acid decomposable repeating unit represented by the following general formula (I) and an acid nondecomposable repeating unit represented by the following general formula (II).

In addition, it is preferable that the resin (A) is a resin (A1) in which at least one of the repeating unit represented by the general formula (I) and the repeating unit represented by the general formula (II) does not have a polycyclic hydrocarbon structure.

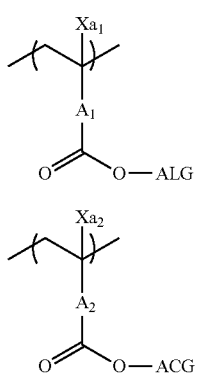

In the general formula (I), $Xa_1$ represents a hydrogen atom, an alkyl group, a cyano group, or a halogen atom, $A_1$ represents a single bond or a divalent connecting group, and ALG represents an acid leaving hydrocarbon group.

In the general formula (II), $Xa_2$ represents a hydrogen atom, an alkyl group, a cyano group, or a halogen atom, $A_2$ represents a single bond or a divalent connecting group, and ACG represents an acid nonleaving hydrocarbon group.

In the general formula (I), $Xa_1$ represents a hydrogen atom, an alkyl group, a cyano group, or a halogen atom. The alkyl group represented by $Xa_1$ may be substituted with a hydroxyl group or a halogen atom. $Xa_1$ is preferably a hydrogen atom or a methyl group.

$A_1$ represents a single bond or a divalent connecting group. The divalent connecting group is preferably —$CO_2$-(alkylene group)- in which —$CO_2$— and an alkylene group are connected to each other. Examples of the alkylene group in the —$CO_2$-(alkylene group)- include a divalent connecting group obtainable by elimination of two hydrogen atoms from methylene or norbornane and a divalent connecting group obtainable by elimination of two hydrogen atom from adamantane.

ALG represents an acid leaving hydrocarbon group, and any group can be used as ALG so far as it leaves from an oxygen atom in the formula by the action of an acid to generate a carboxyl group. ALG is preferably a hydrocarbon group containing a tertiary carbon atom bound to the oxygen atom in the formula.

The acid decomposable repeating unit represented by the general formula (I) is preferably an acid decomposable repeating unit represented by the following general formula (I-1).

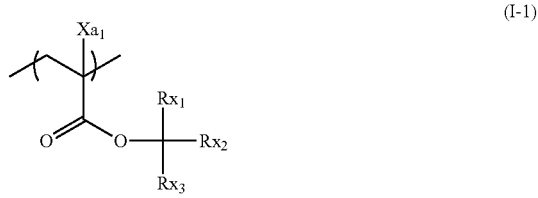

In the general formula (I-1), $Xa_1$ represents a hydrogen atom, an alkyl group, a cyano group, or a halogen atom, and $Rx_1$ to $Rx_3$ each independently represents a linear or branched alkyl group or a monocyclic or polycyclic alkyl group, provided that at least two of $Rx_1$ to $Rx_3$ may be taken together to form a monocyclic or polycyclic alkyl group.

In the general formula (I-1), $Xa_1$ is synonymous with $Xa_1$ in the general formula (I).

As the linear or branched alkyl group represented by $Rx_1$ to $Rx_3$, an alkyl group having from 1 to 4 carbon atoms such as a methyl group, an ethyl group, an n-propyl group, an isopropyl group, an n-butyl group, an isobutyl group, and a t-butyl group is preferable.

As the monocyclic or polycyclic alkyl group represented by $Rx_1$ to $Rx_3$, a monocyclic alkyl group having from 3 to 10 carbon atoms such as a cyclopentyl group and a cyclohexyl group; and a polycyclic alkyl group having from 7 to 15 carbon atoms such as a norbornyl group, a tetracyclodecanyl group, a tetracyclododecanyl group, and an adamantyl group are preferable.

As the monocyclic or polycyclic alkyl group formed when at least two of $Rx_1$ to $Rx_3$ are taken together, a monocyclic alkyl group having from 3 to 10 carbon atoms such as a cyclopentyl group and a cyclohexyl group; and a polycyclic alkyl group having from 7 to 15 carbon atoms such as a norbornyl group, a tetracyclodecanyl group, a tetracyclododecanyl group, and an adamantyl group are preferable. An embodiment wherein $Rx_1$ is a methyl group or an ethyl group and $Rx_2$ and $Rx_3$ are taken together to form the foregoing monocyclic or polycyclic alkyl group is preferable.

When the acid decomposable repeating unit represented by the general formula (I) does not have a polycyclic hydrocarbon structure, the acid decomposable repeating unit represented by the general formula (I) is preferably an acid decomposable repeating unit containing a monocyclic alkyl group represented by the following general formula (I-1a) or (I-1b).

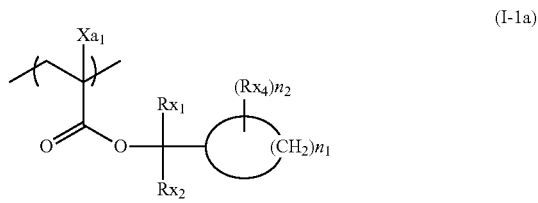

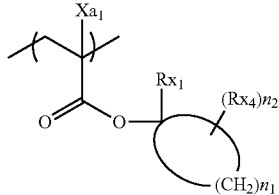

(I-1b)

In the general formulae (I-1a) and (I-1b), $Xa_1$ represents a hydrogen atom, an alkyl group, a cyano group, or a halogen atom, $Rx_1$ and $Rx_2$ each independently represent a linear or branched alkyl group or a monocyclic alkyl group, $Rx_4$ represents a linear or branched alkyl group, or a monocyclic alkyl group, $n_1$ represents 4 or 5, and $n_2$ represents from 0 to 3.

In the general formulae (I-1a) and (I-1b), $Xa_1$ is synonymous with $Xa_1$ in the general formula (I).

As the linear or branched alkyl group or the monocyclic alkyl group represented by $Rx_1$ and $Rx_2$, linear or branched alkyl groups or monocyclic alkyl groups the same as those enumerated in the foregoing $Rx_1$ and $Rx_2$ of the general formula (I-1) are enumerated.

As the linear or branched alkyl group or the monocyclic alkyl group represented by $Rx_4$, linear or branched alkyl groups or monocyclic alkyl groups the same as those enumerated in the foregoing $Rx_1$ and $Rx_2$ are enumerated.

Specific examples of the acid decomposable repeating unit represented by the general formula (I-1a) are given below, but it should not be construed that the invention is limited thereto.

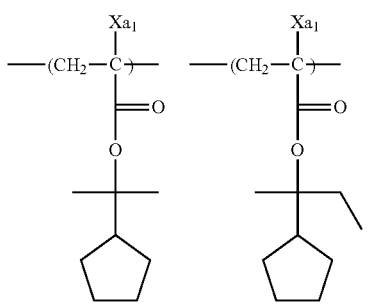

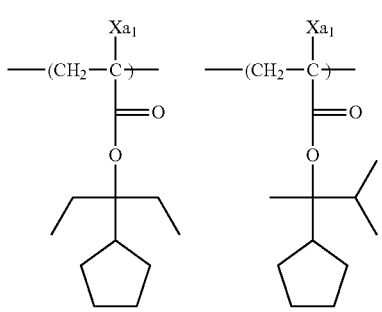

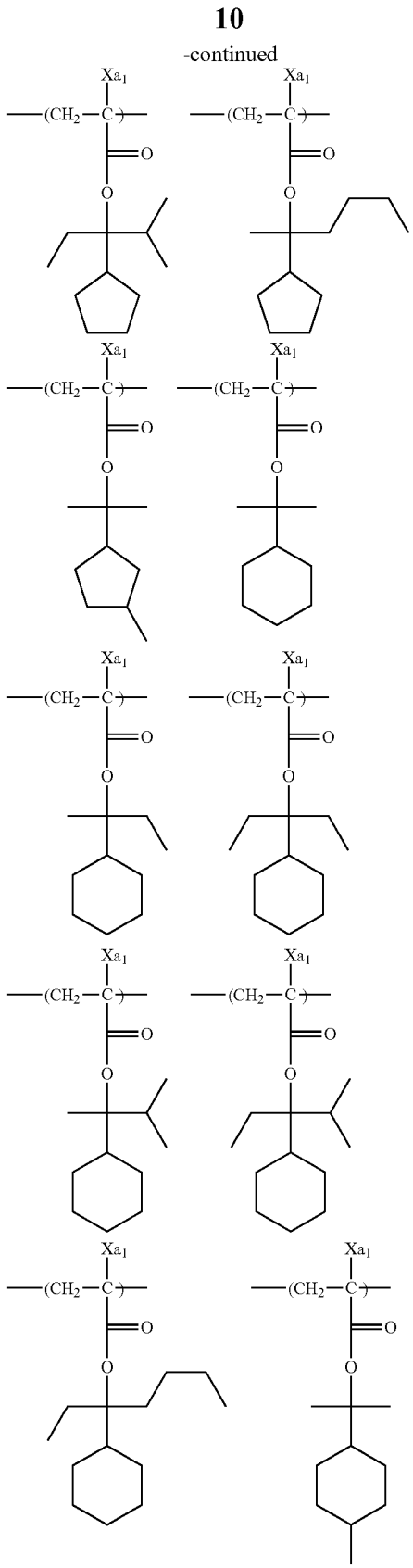

Specific examples of the acid decomposable repeating unit represented by the general formula (I-1b) are given below, but it should not be construed that the invention is limited thereto.

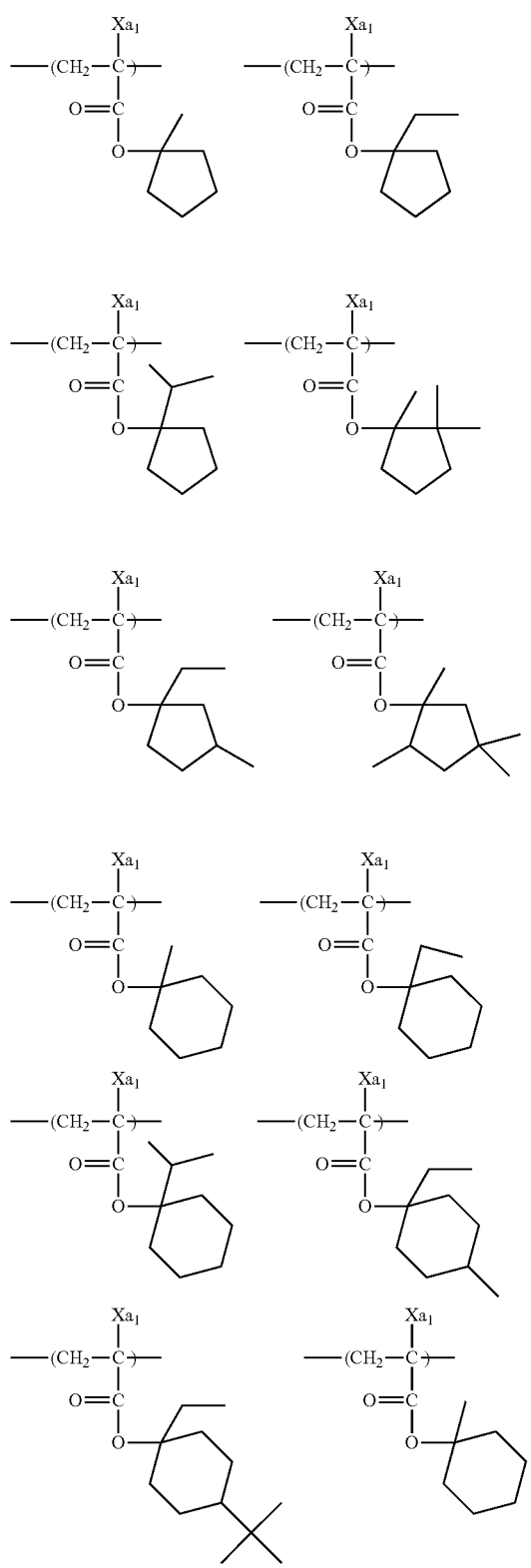

Specific examples of the acid decomposable repeating unit having a linear or branched hydrocarbon structure represented by ALG in the general formula (I) are given below, but it should not be construed that the invention is limited thereto.

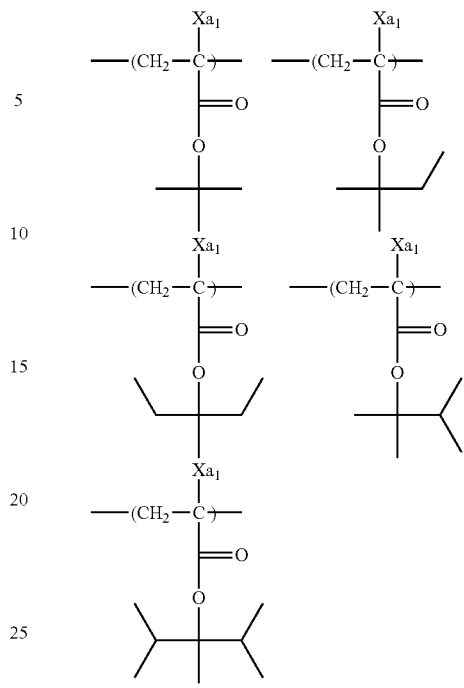

Specific examples of the acid decomposable repeating unit having a polycyclic hydrocarbon structure represented by ALG in the general formula (I) are given below, but it should not be construed that the invention is limited thereto.

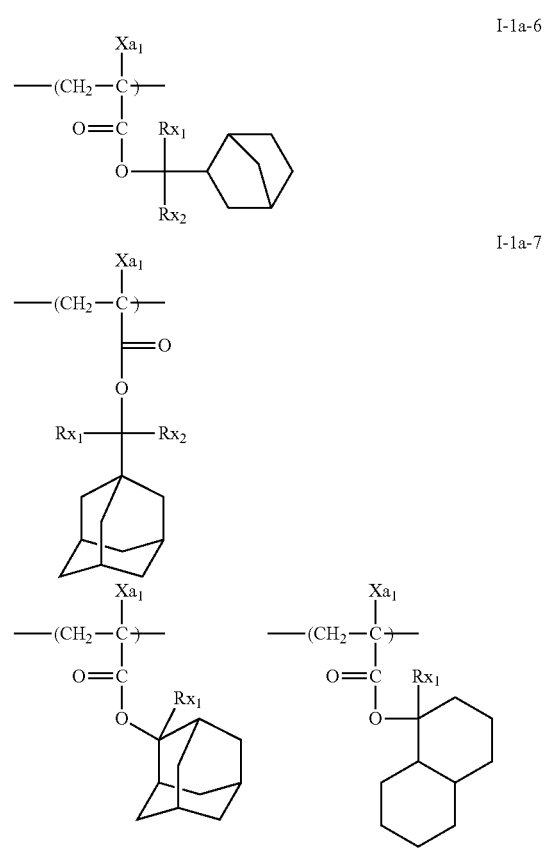

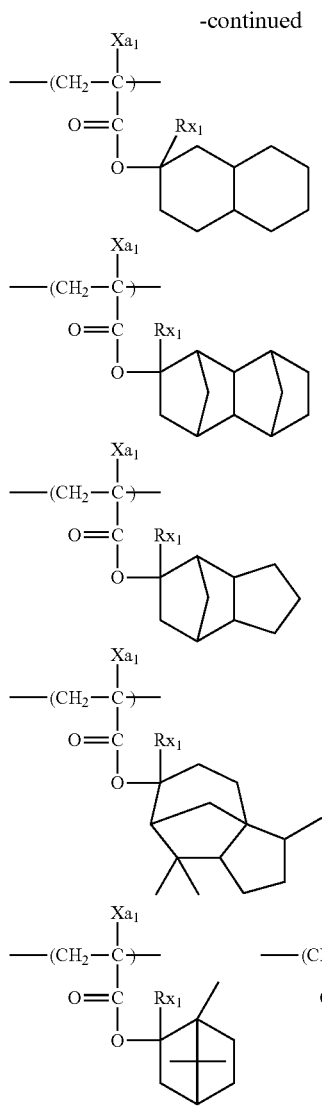

In the foregoing general formula (II), examples of $Xa_2$ include groups the same as those in $Xa_1$ in the general formula (I).

Examples of $A_2$ include groups the same as those in $A_1$ in the general formula (I).

As the acid nonleaving hydrocarbon group represented by ACG, any hydrocarbon group which does not leave from the oxygen atom in the formula by the action of an acid can be used. ACG is preferably a hydrocarbon group composed of only a carbon atom and a hydrogen atom, and more preferably a hydrocarbon group which does not contain a polar substituent. Examples of the acid nonleaving hydrocarbon group represented by ACG include a linear or branched alkyl group or a monocyclic or polycyclic alkyl group which does not leave from the oxygen atom in the formula by the action of an acid. Concretely, a linear or branched alkyl group having from 1 to 10 carbon atoms such as a methyl group, an ethyl group, an n-propyl group, an isopropyl group, an isobutyl group, and a neopentyl group; a monocyclic group having from 3 to 10 carbon atoms such as a cyclopentyl group, a cyclohexyl group, and a cycloheptyl group; and a polycyclic alkyl group having from 7 to 15 carbon atoms such as a norbornyl group, a tetracyclodecanyl group, a tetracyclododecanyl group, an adamantyl group, a diamantyl group, and a tetrahydrodecalin are preferable. The monocyclic or polycyclic alkyl group may further be substituted with a linear or branched alkyl group or a monocyclic or polycyclic alkyl group as a substituent.

When the acid nondecomposable repeating unit represented by the general formula (II) does not have a polycyclic hydrocarbon structure, the acid nondecomposable repeating unit represented by the general formula (II) is preferably an acid nondecomposable repeating unit represented by the following general formula (II-1).

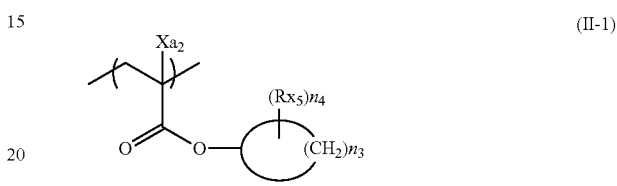

In the general formula (II-1), $Xa_2$ represents a hydrogen atom, an alkyl group, a cyano group, or a halogen atom, $Rx_5$ represents a linear or branched alkyl group or a monocyclic alkyl group, $n_3$ represents 4 or 5, and $n_4$ represents from 0 to 3.

In the general formula (II-1), $Xa_2$ is synonymous with $Xa_2$ in the general formula (II).

Examples of $Rx_5$ include groups the same as those in $Rx_4$ in the general formulae (I-1a) to (I-1b).

Specific examples of the acid nondecomposable repeating unit having a linear or branched hydrocarbon structure represented by ACG in the acid nondecomposable repeating unit represented by the general formula (II) are given below, but it should not be construed that the invention is limited thereto.

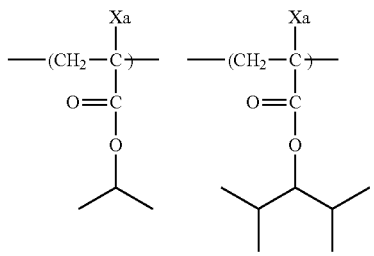

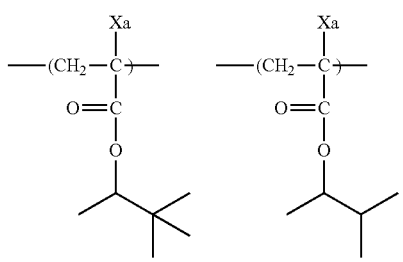

-continued

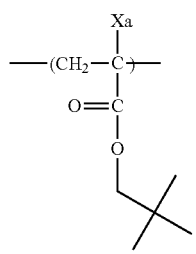

Specific examples of the acid nondecomposable repeating unit having a monocyclic hydrocarbon structure represented by ACG in the repeating unit represented by the general formula (II) are given below, but it should not be construed that the invention is limited thereto.

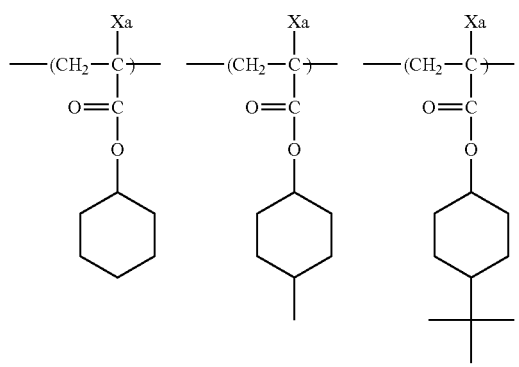

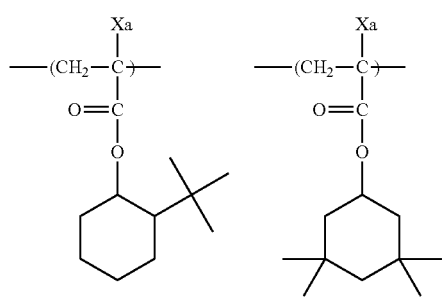

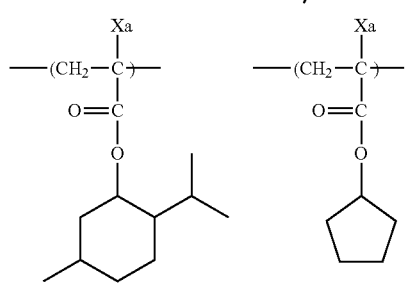

-continued

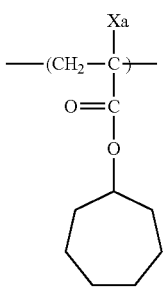

Specific examples of the acid nondecomposable repeating unit having a polycyclic hydrocarbon structure represented by ACG in the acid nondecomposable repeating unit represented by the general formula (II) are given below, but it should not be construed that the invention is limited thereto.

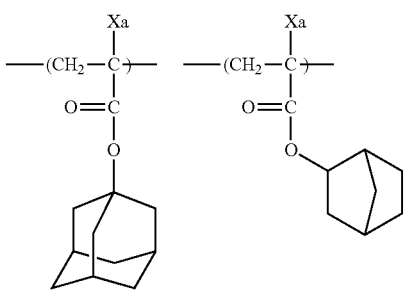

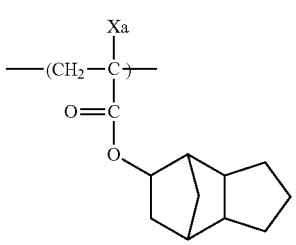

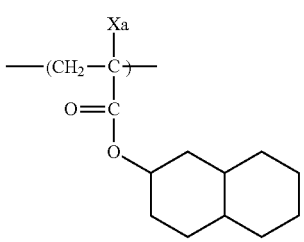

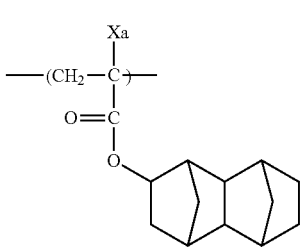

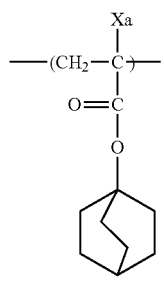

It is preferable that the resin (A) contains a lactone group-containing repeating unit.

As the lactone group, though any group can be used so far as it has a lactone structure, it is preferably a group having from 5- to 7-membered lactone structure. It is preferable that a 5- to 7-membered lactone structure is fused with other ring structure such that a bicyclo structure or a spiro structure is formed. Repeating units containing a group having a lactone structure represented by any one of the following general formulae (LC1-1) to (LC1-16) are more preferable. Furthermore, the group having a lactone structure may be directly bound to the principal chain. As the lactone structure, (LC1-1), (LC1-4), (LC1-5), (LC1-6), (LC1-13) and (LC1-14) are preferable, with (LC1-4) being especially preferable. By using a specified lactone structure, line edge roughness and development defects become good.

LC1-1
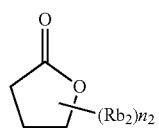

LC1-2
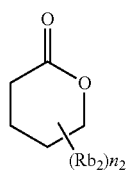

LC1-3
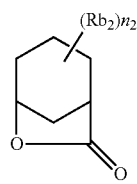

LC1-4
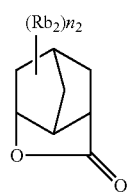

LC1-5
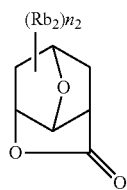

LC1-6
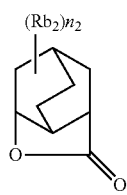

LC1-7
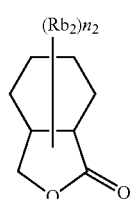

LC1-8
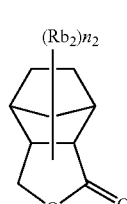

LC1-9
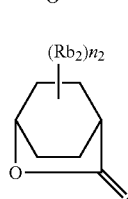

LC1-10
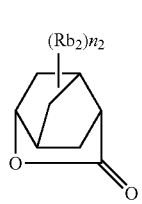

LC1-11
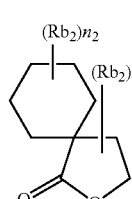

LC1-12
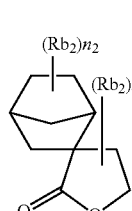

-continued

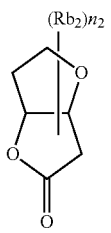
LC1-13

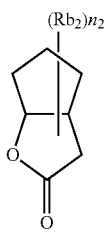
LC1-14

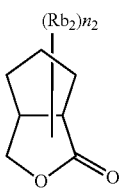
LC1-15

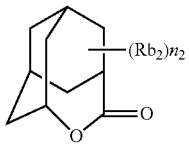
LC1-16

The lactone structure moiety may or may not contain a substituent ($Rb_2$). Preferred examples of the substituent ($Rb_2$) include an alkyl group having from 1 to 8 carbon atoms, a cycloalkyl group having from 4 to 7 carbon atoms, an alkoxy group having from 1 to 8 carbon atoms, an alkoxycarbonyl group having from 1 to 8 carbon atoms, a carboxyl group, a halogen atom, a hydroxyl group, a cyano group, and an acid decomposable group. Of these, an alkyl group having from 1 to 4 carbon atoms, a cyano group, and an acid decomposable group are more preferable. $n_2$ represents an integer of from 0 to 4. When $n_2$ is 2 or more, the plural existing $Rb_2$s may be the same or different; and the plural existing $Rb_2$s may be taken together to form a ring.

Examples of the repeating unit containing a group having a lactone structure represented by any one of the general formulae (LC1-1) to (LC1-16) include a repeating unit represented by the following general formula (AI).

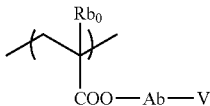
(AI)

In the general formula (AI), $Rb_0$ represents a hydrogen atom, a halogen atom, or an alkyl group having from 1 to 4 carbon atoms. Preferred examples of a substituent which the alkyl group represented by $Rb_0$ may contain include a hydroxyl group and a halogen atom.

Examples of the halogen atom represented by $Rb_0$ include a fluorine atom, a chlorine atom, a bromine atom, and an iodine atom.

$Rb_0$ is preferably a hydrogen atom or a methyl group.

Ab represents a single bond, an alkylene group, a divalent connecting group having a monocyclic or polycyclic alicyclic hydrocarbon structure, an ether group, an ester group, a carbonyl group, a carboxyl group, or a divalent connecting group composed of a combination thereof. Of these, a single bond and a divalent connecting group represented by -$Ab_1$-$CO_2$— are preferable. $Ab_1$ represents a linear or branched alkylene group or a monocyclic or polycyclic cycloalkylene group, and preferably a methylene group, an ethylene group, a cyclohexyl group, an adamantyl group, or a norbornyl group.

V represents a group represented by any one of the general formulae (LC1-1) to (LC1-16).

In the repeating unit having a lactone structure, though an optical isomer is usually present, any optical isomer may be used. Furthermore, one kind of an optical isomer may be used singly, or a mixture of plural optical isomers may be used. When one kind of an optical isomer is mainly used, its optical purity (ee) is preferably 90 or more, and more preferably 95 or more.

Specific examples of the repeating unit containing a group having a lactone structure are given below, but it should not be construed that the invention is limited thereto.

In the foregoing formulae, Rx represents H, CH3, CH2OH, or CF3

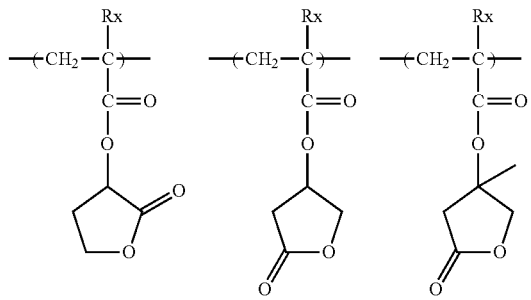

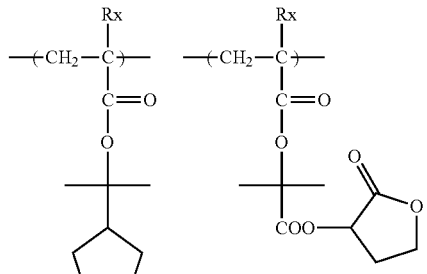

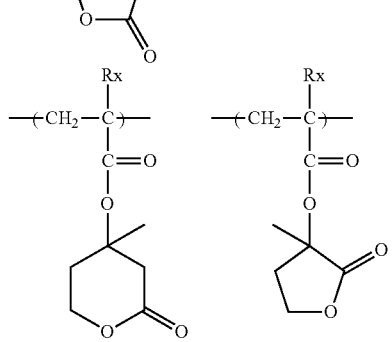

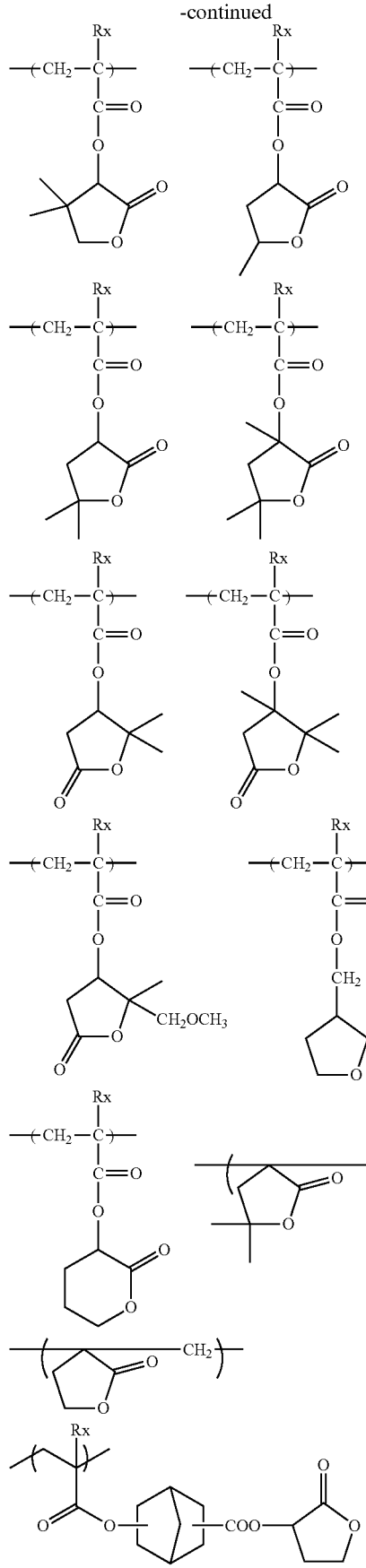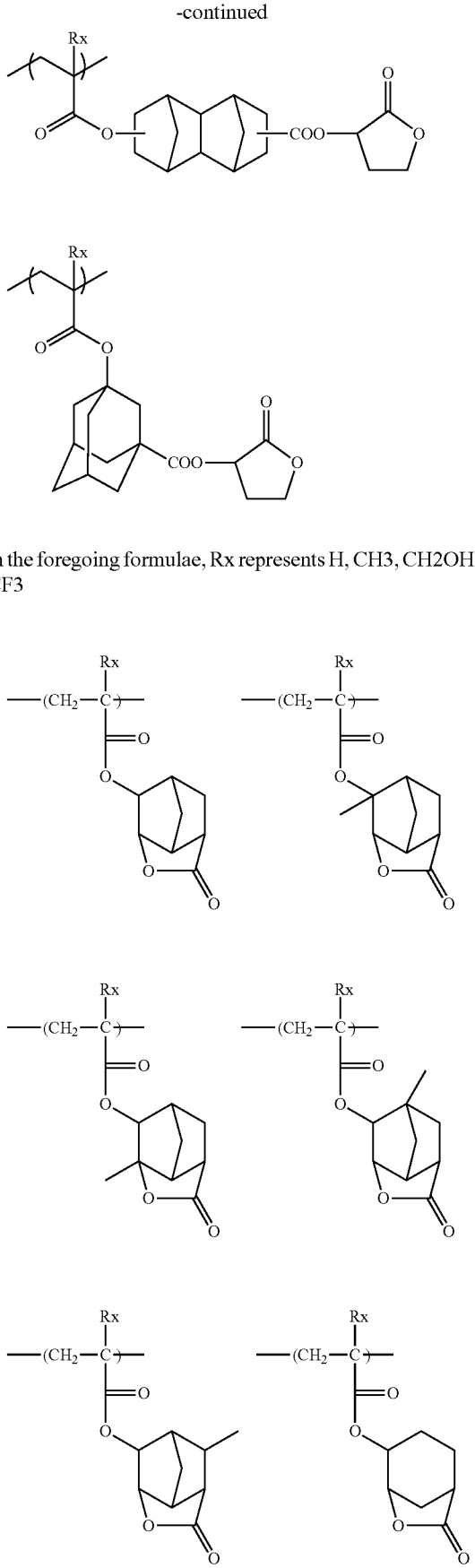
In the foregoing formulae, Rx represents H, CH3, CH2OH, or CF3

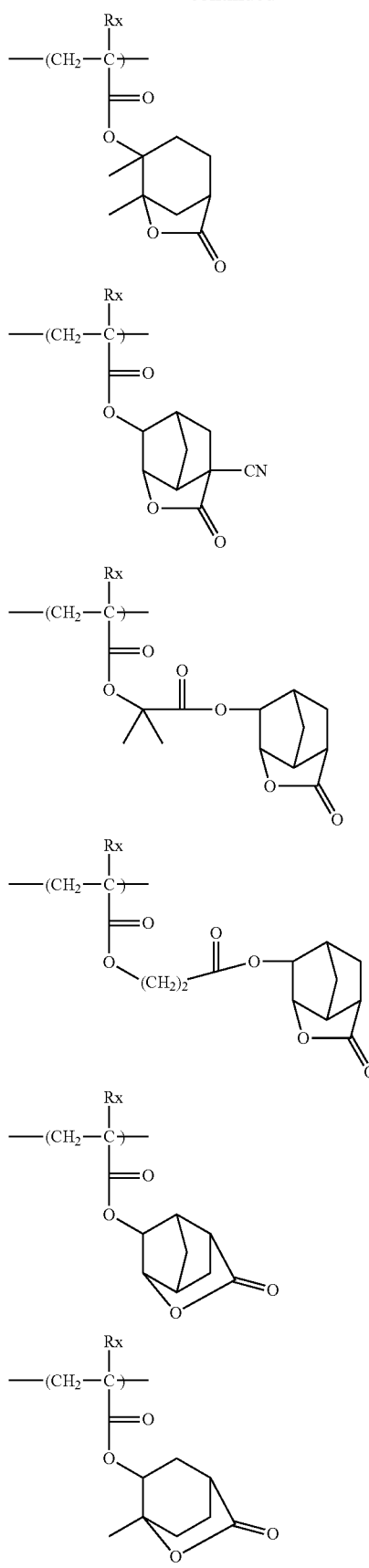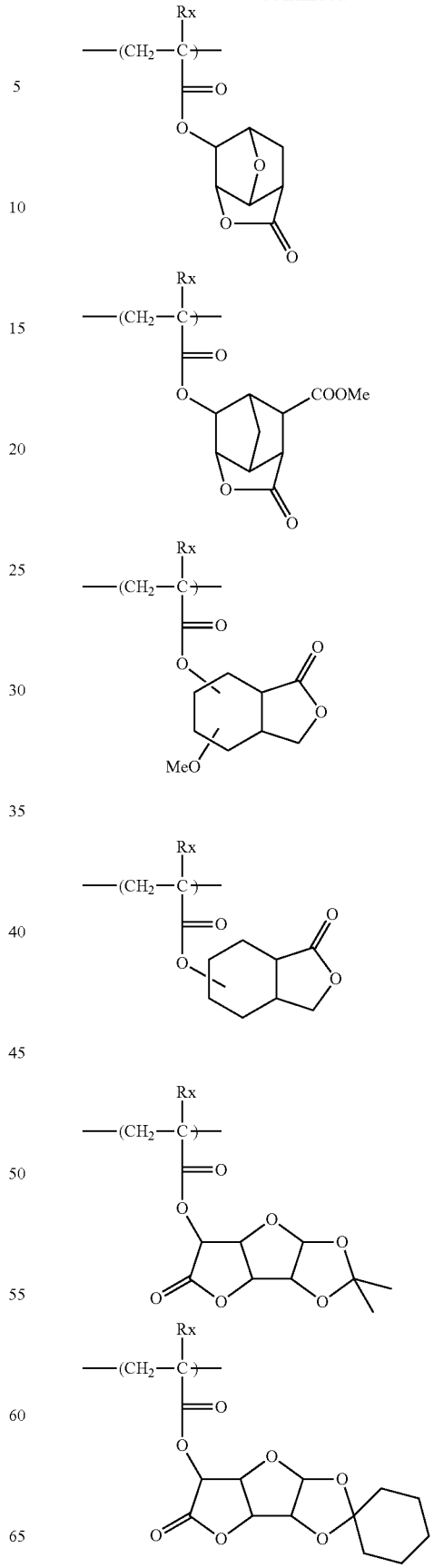

-continued
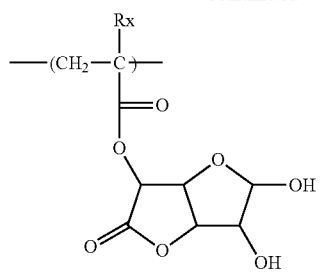
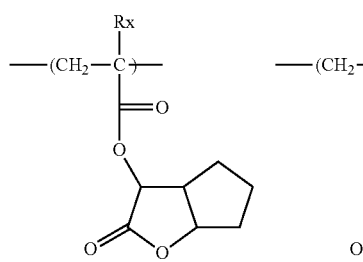
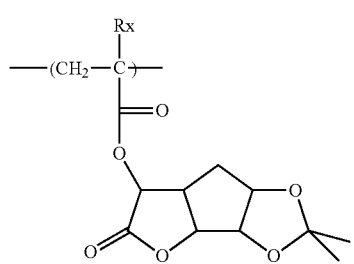
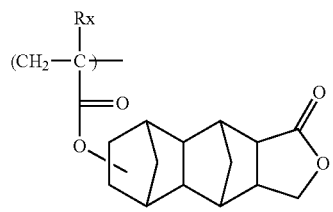
In the foregoing formulae, Rx represents H, CH3, CH2OH, or CF3
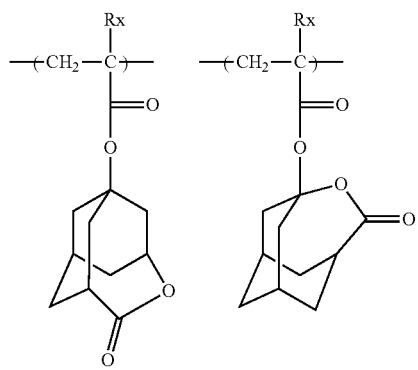
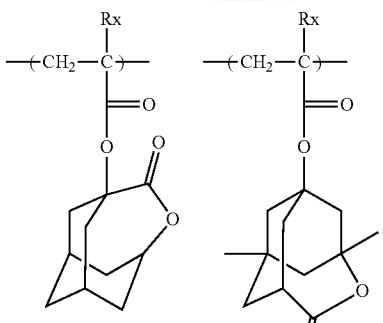
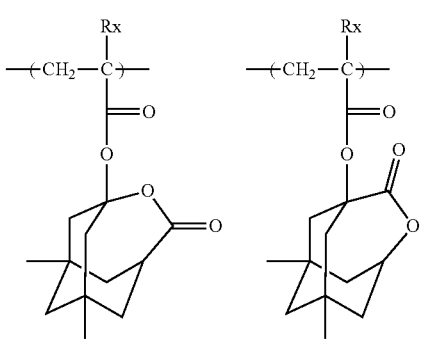
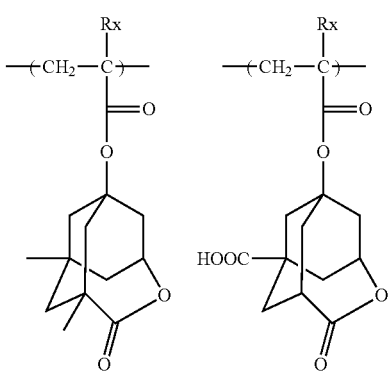
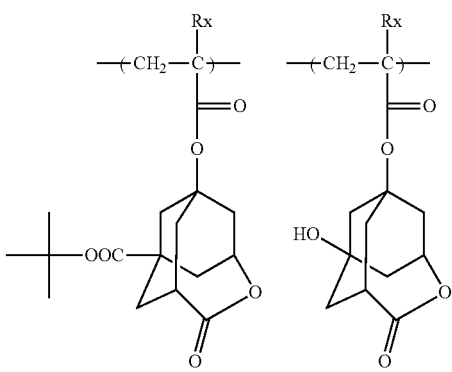

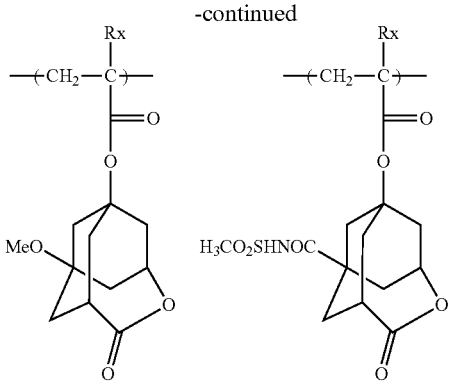

It is preferable that the resin (A) contains a repeating unit containing a hydroxyl group or a cyano group. Thus, adhesion to substrate and compatibility with a developing solution are improved.

The repeating unit containing a hydroxyl group or a cyano group is preferably a repeating unit having a hydroxyl group- or cyano group-substituted alicyclic hydrocarbon structure. Preferred examples of the alicyclic hydrocarbon structure of the hydroxyl group- or cyano group-substituted alicyclic hydrocarbon structure include an adamantyl group, a diamantyl group, and a norbornane group. As the hydroxyl group- or cyano group-substituted alicyclic hydrocarbon structure, partial structures represented by the following general formulae (VIIa) to (VIId) are preferable.

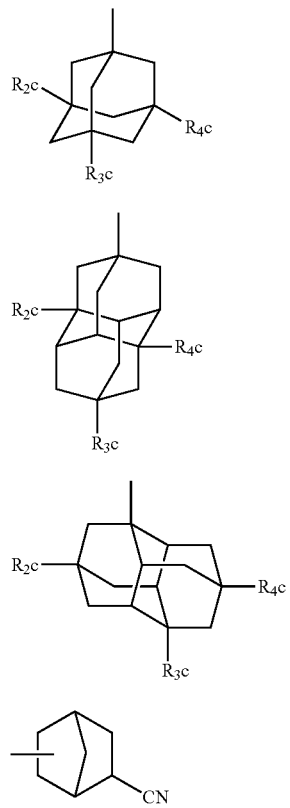

In the general formulae (VIIa) to (VIIc), $R_2c$ to $R_4c$ each independently represents a hydrogen atom, a hydroxyl group, or a cyano group, provided that at least one of $R_2c$ to $R_4c$ represents a hydroxyl group or a cyano group. It is preferable that one or two of $R_2c$ to $R_4c$ are a hydroxyl group, with the remainder being a hydrogen atom. In the general formula (VIIa), it is more preferable that two of $R_2c$ to $R_4c$ are a hydroxyl group, with the remainder being a hydrogen atom.

Examples of the repeating units represented by the general formulae (VIIa) to (VIId) include repeating units represented by the following general formulae (AIIa) to (AIId).

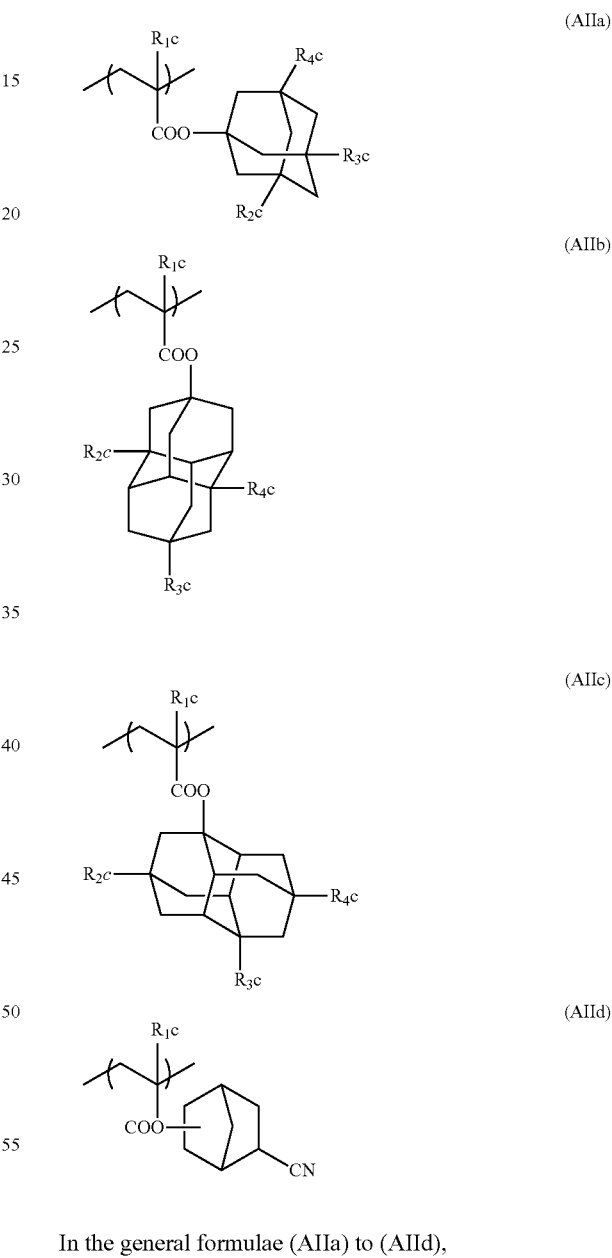

In the general formulae (AIIa) to (AIId), $R_1c$ represents a hydrogen atom, a methyl group, a trifluoromethyl group, or a hydroxymethyl group, and $R_2c$ to $R_4c$ are synonymous with $R_2c$ to $R_4c$ in the general formulae (VIIa) to (VIId), respectively.

Specific examples of the repeating units represented by the general formulae (AIIa) to (AIId) are given below, but it should not be construed that the invention is limited thereto.

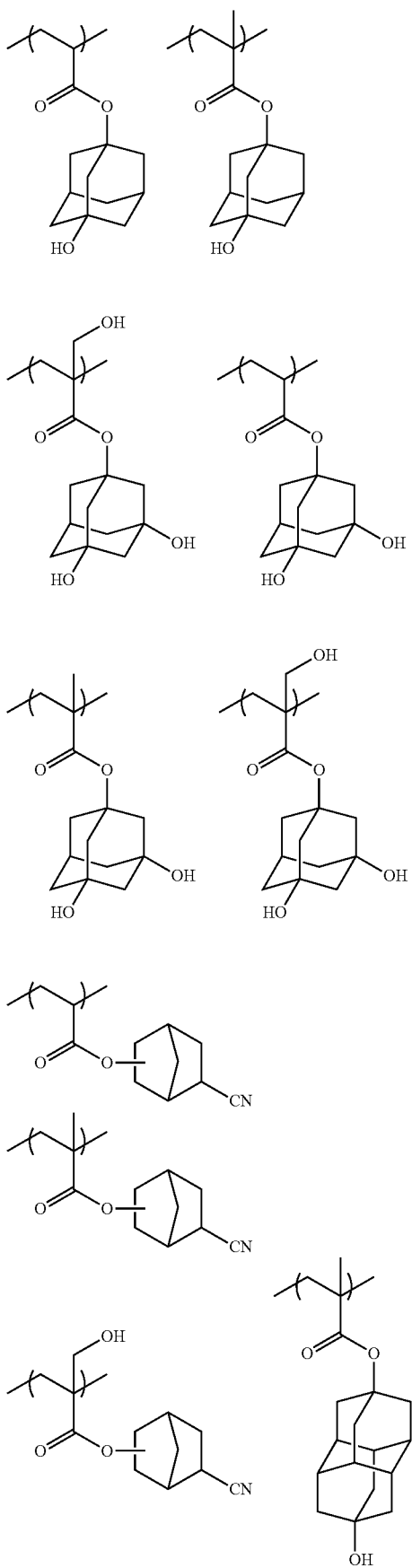
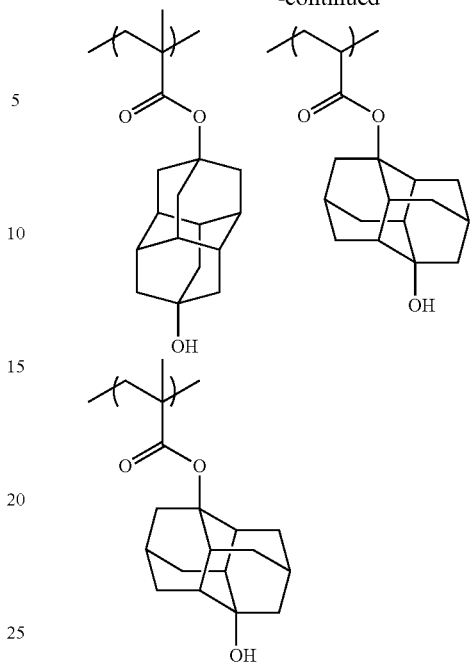

It is preferable that the resin (A) contains an acid group-containing repeating unit which comprises an alkali-soluble group. Examples of the acid group include a carboxyl group, a sulfonamide group, a sulfonylimide group, a bissulfonylimide group, and an aliphatic alcohol group substituted with an electron withdrawing group at the α-position thereof (preferably a group represented by the following general formula (F1)). It is more preferable that the resin (A) contains a carboxyl group-containing repeating unit.

$$\begin{array}{c} R_{51} \\ R_{50}-\!\!\!\!-\!\!\!\!-R_{52} \\ -\!\!\!\!-\!\!\!\!-OH \\ R_{53}-\!\!\!\!-\!\!\!\!-R_{55} \\ R_{54} \end{array} \quad (F1)$$

In the general formula (F1),
$R_{50}$ to $R_{55}$ each independently represents a hydrogen atom, a fluorine atom, or an alkyl group, provided that at least one of $R_{50}$ to $R_{55}$ represents a fluorine atom or an alkyl group in which at least one of hydrogen atoms thereof is substituted with a fluorine atom. It is preferable that all of $R_{50}$ to $R_{55}$ represent a fluorine atom.

When the component (B) contains an acid group-containing repeating unit, resolution properties increase in a contact hole application. As the acid group-containing repeating unit, all of a repeating unit in which an acid group is directly bound to the principal chain of a resin, such as a repeating unit by acrylic acid or methacrylic acid, a repeating unit in which an acid group is bound to the principal chain of a resin via a connecting group, and a repeating unit in which an acid group-containing polymerization initiator or chain transfer agent is used at the time of polymerization and introduced into a terminal end of a polymer chain are preferable. The connecting group may have a monocyclic or polycyclic hydrocarbon structure. Of these, a repeating unit by acrylic acid or methacrylic acid is the most preferable.

The content of the acid group-containing repeating unit is preferably from 1 to 20% by mole, more preferably from 3 to 15% by mole, and further preferably from 5 to 10% by mole based on the whole of repeating units in the polymer.

Specific examples of the acid group-containing repeating unit are given below, but it should not be construed that the invention is limited thereto.

In the foregoing formulae, Rx represents H, CH3, CF3, or CH2OH

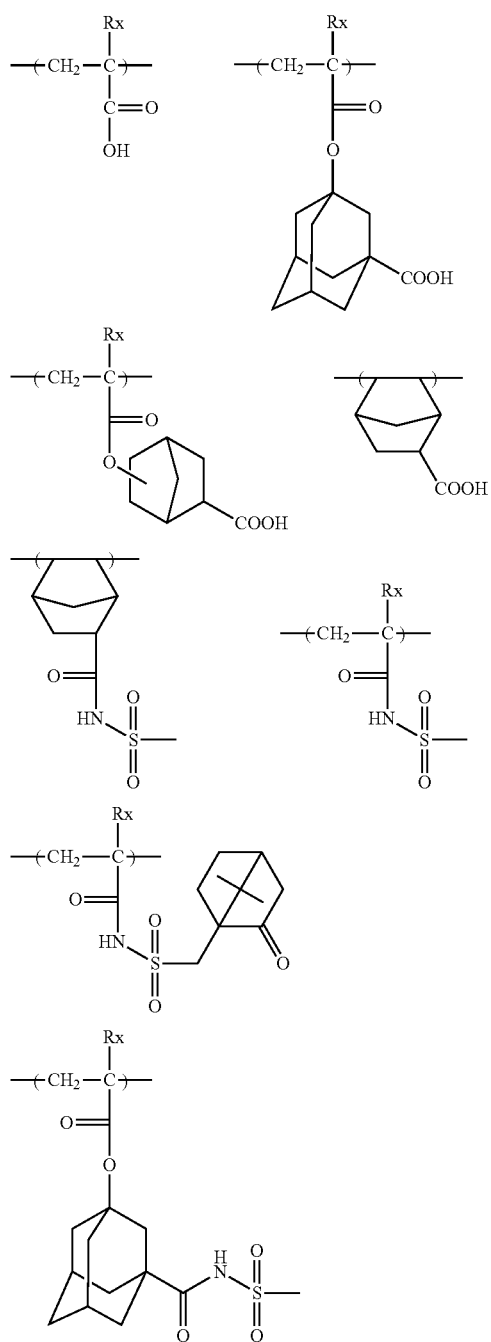

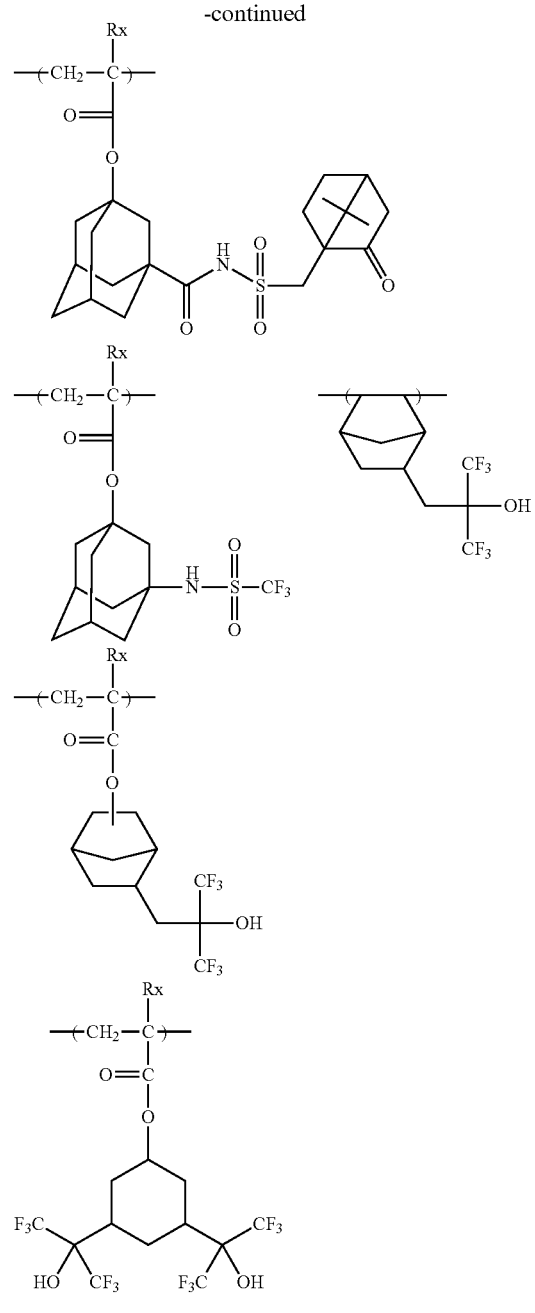

The resin (A) can contain various repeating structural units in addition to the foregoing repeating structural units for the purpose of adjusting resistance to dry etching, aptitude for standard developing solution, adhesion to substrate, resist profile, and characteristics which are in general required for a resist, such as resolving power, heat resistance and sensitivity.

Examples of such a repeating structural unit include repeating structural units corresponding to the following monomers, but it should not be construed that the invention is limited thereto.

Thus, it becomes possible to make fine adjustments of performances required for the component (B), especially (1) dissolution properties in a coating solvent, (2) film formation properties (glass transition point), (3) alkali developability, (4) film thinning (hydrophilicity/hydrophobicity and selection of an alkali-soluble group), (5) adhesion of an unexposed area to a substrate, (6) resistance to dry etching, and so on.

Examples of such a monomer include compounds containing one addition polymerizable unsaturated bond selected from, for example, acrylic esters, methacrylic esters, acrylamides, methacrylamides, allyl compounds, vinyl ethers, and vinyl esters.

Besides, an addition polymerizable unsaturated compound may be copolymerized so far as it is copolymerizable with a monomer corresponding to the foregoing repeating structural unit of every kind.

In the resin (A), a molar ratio of the respective recurring structural units to be contained is properly set up for the purpose of adjusting resistance to dry etching of a photosensitive film, aptitude for standard developing solution, adhesion to substrate and resist profile of a resist, and characteristics of the photosensitive film which are in general required for a resist, such as resolving power, heat resistance and sensitivity.

When the positive photosensitive composition of the invention is one for ArF exposure, it is preferable that the resin does not contain an aromatic group in view of transparency to ArF light.

As the resin (A), it is preferable that all the repeating units are constituted of a (meth)acrylate based repeating unit. In this case, any of a resin in which all repeating units are a methacrylate based repeating unit, a resin in which all repeating units are an acrylate based repeating unit, and a resin in which all repeating units are composed of a methacrylate based repeating unit and an acrylate based repeating unit can be used; and it is preferable that the acrylate based repeating init accounts for not more than 50% by mole of the whole of repeating units. A copolymerization polymer containing from 20 to 50% by mole of an acid decomposable repeating unit represented by the general formula (I), from 1 to 25% by mole of an acid nondecomposable repeating unit represented by the general formula (II), from 20 to 50% by mole of a lactone group-containing repeating unit, from 5 to 30% by mole of a hydroxyl group- or cyano group-containing repeating unit, from 0 to 15% by mole of an acid group-containing repeating unit, and from 0 to 20% by mole of other repeating unit is more preferable.

The resin (A) can be synthesized in the usual way (for example, radical polymerization). Examples of a general synthesis method include a batch polymerization method of dissolving a monomer species and an initiator in a solvent and heating the solution to achieve polymerization; and a dropwise polymerization method of adding dropwise a solution of a monomer species and an initiator in a heated solvent over from 1 to 10 hours, with a dropwise addition being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethylformamide and dimethylacetamide; and solvents capable of dissolving the composition of the invention as described later, such as propylene glycol monomethyl ether acetate, propylene glycol monomethyl ether, and cyclohexanone. It is more preferable that the polymerization is carried out by using a solvent the same as the solvent used in the positive photosensitive composition of the invention. Thus, it is possible to suppress the generation of particles at the time of storage.

It is preferable that the polymerization reaction is carried out under an atmosphere of an inert gas such as nitrogen and argon. The polymerization is initiated by using, as the polymerization initiator, a commercially available radical initiator (for example, azo based initiators and peroxides). As the radical initiator, an azo based initiator is preferable; and an azo based initiator containing an ester group, a cyano group, or a carboxyl group is preferable. Preferred examples of the initiator include azobisisobutyronitrile, azobisdimethylvaleronitrile, and dimethyl 2,2'-azobis(2-methylpropionate). A chain transfer agent such as thiol compounds may be used together with the polymerization initiator. If desired, the initiator is supplemented or dividedly added; after completion of the reaction, the reaction mixture is thrown into a solvent; and the desired polymer is recovered by a method such as powder or solid recovery. A reaction concentration is from 5 to 50% by weight, and preferably from 10 to 30% by weight. A reaction temperature is usually from 10° C. to 150° C., preferably from 30° C. to 120° C., and more preferably from 60 to 100° C.

A weight average molecular weight of the resin (A) is preferably from 1,000 to 200,000, more preferably from 3,000 to 20,000, and most preferably from 5,000 to 15,000 in terms of a reduced value into polystyrene by the GPC method. By controlling the weight average molecular weight at from 1,000 to 200,000, it is possible to prevent the deterioration of heat resistance or resistance to dry etching; and it is also possible to prevent the deterioration of developability or the deterioration of film formation properties caused due to an increase of the viscosity.

Dispersivity (weight-average molecular weight/number-average molecular weight) is usually in the range of from 1 to 5, preferably from 1 to 3, and more preferably from 1 to 2. The smaller the molecular weight distribution, the more excellent the resolution and the resist shape are. Also, the side wall of the resist pattern is smooth, and the roughness properties are excellent.

In the positive photosensitive composition of the invention, amount of the resin (A) is preferably from 60 to 99% by weight, and more preferably from 80 to 98% by weight in the whole of solids of the composition.

Furthermore, in the invention, the resin (A) may be used singly or in combination of plural kinds thereof.

[2] Resins (A1) and (A2):

In view of pattern collapse and development defects, the resin (A) is preferably a resin (A1) in which at least one of the repeating unit represented by the general formula (I) and the repeating unit represented by the general formula (II) does not have a polycyclic hydrocarbon structure, and more preferably a resin in which both ALG in the general formula (I) and ACG in the general formula (II) do not have a polycyclic hydrocarbon structure.

Furthermore, in view of resolving power, isolated DOF, and PEB temperature dependency, the resin (A) is preferably a resin (A2) in which the repeating unit represented by the general formula (I) is at least one kind of a repeating unit selected from a repeating unit represented by the following general formula (1) and a repeating unit represented by the following general formula (2); and the repeating unit represented by the general formula (II) is a repeating unit represented by the following general formula (3).

Incidentally, with respect to the resin (A2), it is preferable that at least one of at least one kind of a repeating unit selected from the repeating unit represented by the general formula (1) and the repeating unit represented by the following general formula (2) and the repeating unit represented by the following general formula (3) does not have a polycyclic hydrocarbon structure; and it is more preferable that the both do not have a polycyclic hydrocarbon structure.

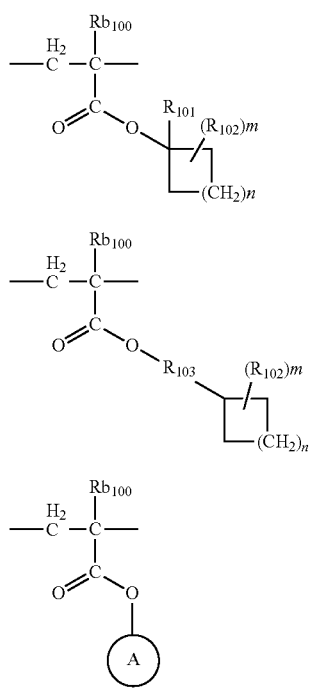

General Formula (1)

General Formula (2)

General Formula (3)

In the general formulae (1) to (3), $R_{100}$ represents a hydrogen atom or an alkyl group, $R_{101}$ represents an alkyl group, $R_{102}$ represents an alkyl group, provided that when plural $R_{102}$s are present, the plural $R_{102}$s may be the same or different or may be taken together to form a ring, $R_{103}$ represents a connecting group containing a tertiary carbon atom, with the tertiary carbon atom being bound to the cyclic structure in the formula, A represents a nonleaving group having a cyclic structure which is constituted of a carbon atom and a hydrogen atom, n represents an integer of from 0 to 5, and m represents an integer of from 0 to (n+2).

In the general formulae (1) to (3), the alkyl group represented by $R_{100}$ is preferably a linear or branched alkyl group having from 1 to 5 carbon atoms. Examples thereof include a methyl group, an ethyl group, an n-propyl group, an isopropyl group, an n-butyl group, an isobutyl group, a sec-butyl group, a pentyl group, an isopentyl group, a neopentyl group, and a t-pentyl group. The alkyl group represented by $R_{100}$ may be substituted with a fluorine atom, an —O—$Rb_2$ group, or the like. In the formula, $Rb_2$ represents a hydrogen atom, an alkyl group, an acyl group, or a lactone group. $R_{100}$ is preferably a hydrogen atom, a methyl group, a trifluoromethyl group, or a —$CH_2$—O—$Rb_2$ group.

The alkyl group represented by $R_{101}$ is preferably a linear or branched alkyl group having from 1 to 8 carbon atoms. Examples thereof include a methyl group, an ethyl group, an n-propyl group, an isopropyl group, a linear or branched butyl group, a linear or branched pentyl group, a linear or branched hexyl group, a linear or branched heptyl group, and a linear or branched octyl group. The alkyl group represented by $R_{101}$ may be substituted with a fluorine atom or the like.

The alkyl group represented by $R_{102}$ is preferably a linear or branched alkyl group having from 1 to 12 carbon atoms. Examples thereof include a methyl group, an ethyl group, an n-propyl group, an isopropyl group, a linear or branched butyl group, a linear or branched pentyl group, a linear or branched hexyl group, a linear or branched heptyl group, a linear or branched octyl group, a linear or branched nonyl group, a linear or branched decyl group, a linear or branched undecyl group, and a linear or branched dodecyl group. The alkyl group represented by $R_{102}$ may be substituted with a fluorine atom or the like.

Examples of the connecting group represented by $R_{103}$ include an —La—C*(Ra)(Rb)— group. In the formula, La represents a single bond or an alkylene group; C* represents a tertiary carbon atom; and Ra and Rb each independently represents an alkyl group, a cycloalkyl group, or an aryl group. With respect to the connecting group represented by $R_{103}$, it is preferable that La represents a single bond and that Ra and Rb each represents an alkyl group; and it is more preferable that La represents a single bond and that Ra and Rb each represents a methyl group.

A represents a nonleaving group which is constituted of a carbon atom and a hydrogen atom, has a cyclic structure and does not leave from an oxygen atom by the action of an acid. The nonleaving group represented by A preferably has from 6 to 50 carbon atoms, and more preferably from 6 to 25 carbon atoms. Examples of the nonleaving group represented by A include a cycloalkyl group and an aryl group singly; and a group obtained by binding these groups, which is bound to an oxygen atom by a primary carbon atom or a secondary carbon atom. The cycloalkyl group may be of a monocyclic type or a polycyclic type. Examples of the monocyclic type include a cyclopropyl group, a cyclobutyl group, a cyclopentyl group, a cyclohexyl group, and a cyclooctyl group. Examples of the polycyclic type include an adamantyl group, a norbornyl group, an isoboronyl group, a camphanyl group, a dicyclopentyl group, an α-pineyl group, a tricyclodecanyl group, a tetracyclododecyl group, an androstanyl, and a diamantyl group. The aryl group is preferably an aryl group having from 6 to 14 carbon atoms. Examples thereof include a phenyl group, a naphthyl group, an anthryl group, a phenanthryl group, a biphenyl residue (a group formed when one hydrogen atom is lost from biphenyl), and a p-terphenyl group (a group formed when one hydrogen atom is lost from p-terphenyl). The nonleaving group represented by A may be substituted with an alkyl group or the like.

As the cyclic structure in the general formula (1), the following structures are preferable.

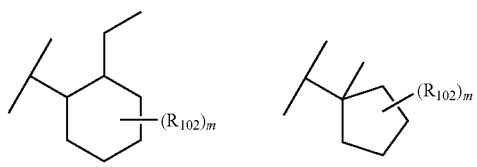

In the foregoing structures, $R_{102}$ is preferably a methyl group, an ethyl group, or a propyl group; and m represents an integer of from 0 to 2.

Specific examples of the cyclic structure in the general formula (1) are given below, but it should not be construed that the invention is limited thereto.

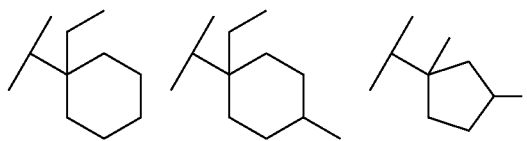

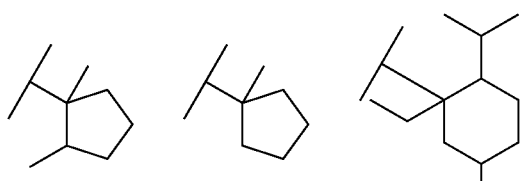

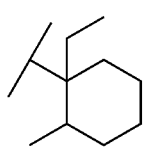

As the —R$_{103}$— cyclic structure in the general formula (2), the following structures are preferable.

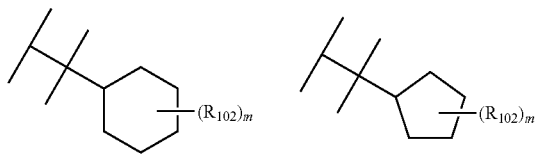

In the foregoing structures, R$_{102}$ is preferably a methyl group, an ethyl group, or a propyl group; and m represents an integer of from 0 to 2.

Specific examples of the —R$_{103}$— cyclic structure in the general formula (2) are given below, but it should not be construed that the invention is limited thereto.

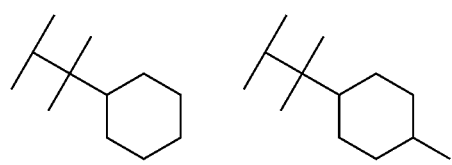

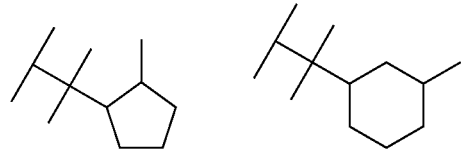

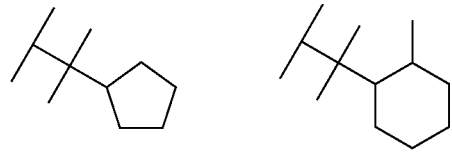

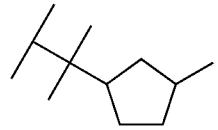

Specific examples of the nonleaving group represented by A in the general formula (3) are given below, but is should not be construed that the invention is limited thereto.

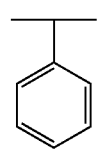
(a-1)

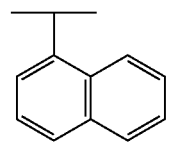
(a-2)

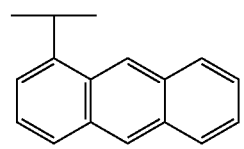
(a-3)

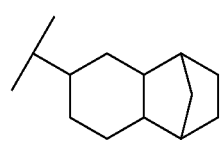
(a-4)

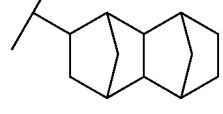
(a-5)

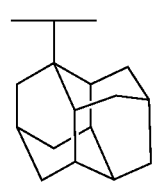
(a-6)

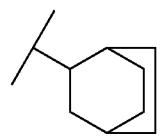
(a-7)

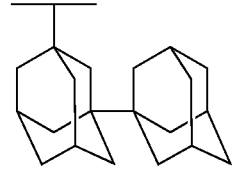
(a-8)

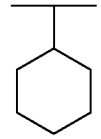
(a-9)

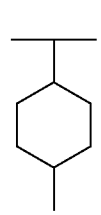
(a-10)

-continued

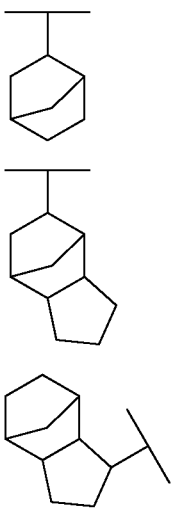

(a-11)

(a-12)

(a-13)

The repeating unit represented by the general formula (1) and the repeating unit represented by the general formula (2) each contains an acid decomposable group and is decomposed by the action of an acid to generate a carboxyl group, whereby its solubility in an alkaline developing solution increases.

The repeating unit represented by the general formula (3) is not decomposed by the action of an acid.

The resin (A2) can include the repeating unit represented by the general formula (I) and (II), and another repeating unit which can be included therein. In addition, it is more preferable that the resin (A2) contains a repeating unit as mentioned below.

It is preferable that the resin (A2) contains a repeating unit represented by the following general formula (4).

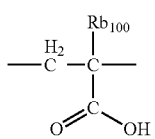

General Formula (4)

In the general formula (4), $R_{100}$ represents a hydrogen atom or an alkyl group.

In the general formula (4), $R_{100}$ is synonymous with $R_{100}$ in the general formula (1).

The resin (A2) contains a group which is decomposed by the action of an acid to generate an alkali-soluble group (also referred to as "acid decomposable group") in the principal chain or the side chain or both the principal chain and the side chain of the resin.

Examples of the alkali-soluble group include a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsuofonyl)imide group, a tris(alkylcarbonyl)methylene group, and a tris(alkylsulfonyl)methylene group.

Preferred examples of the alkali-soluble group include a carboxylic acid group, a fluorinated alcohol group (preferably hexafluoroisopropanol), and a sulfonic acid group.

The acid decomposable group is preferably a group obtainable from substitution of the hydrogen atom of such an alkali-soluble group with group which leaves by an acid.

Preferred examples of the acid decomposable group include a cumyl ester group, an enol ester group, an acetal ester group, and a tertiary alkyl ester group, with a tertiary alkyl ester group being more preferable.

It is preferable that the resin (A2) further contains at least one member selected from the group of a repeating unit having an alicyclic hydrocarbon-containing partial structure represented by any one of the following general formulae (pI) to (pV) and a repeating unit represented by the following general formula (II-AB).

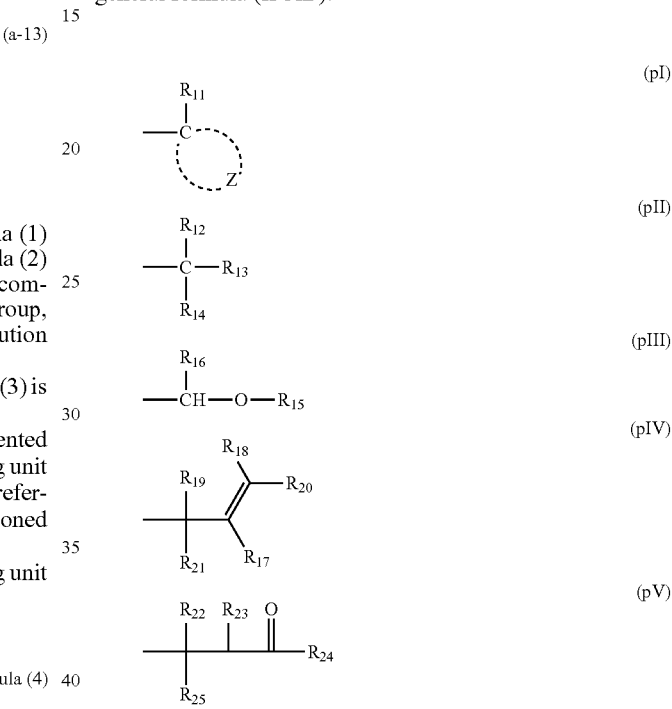

In the general formulae (pI) to (pV), $R_{11}$ represents a methyl group, an ethyl group, an n-propyl group, an isopropyl group, an n-butyl group, an isobutyl group, or a sec-butyl group; and Z represents an atomic group necessary for forming a polycyclic cycloalkyl group together with the carbon atom.

$R_{12}$ to $R_{16}$ each independently represents a linear or branched alkyl group having from 1 to 4 carbon atoms or a polycyclic cycloalkyl group, provided that at least one of $R_{12}$ to $R_{14}$ or any one of $R_{15}$ and $R_{16}$ represents a polycyclic cycloalkyl group.

$R_{17}$ to $R_{21}$ each independently represents a hydrogen atom, a linear or branched alkyl group having from 1 to 4 carbon atoms, or a polycyclic cycloalkyl group, provided that at least one of $R_{17}$ to $R_{21}$ represents a polycyclic cycloalkyl group and that any one of $R_{19}$ and $R_{21}$ represents a linear or branched alkyl group having from 1 to 4 carbon atoms or a polycyclic cycloalkyl group.

$R_{22}$ to $R_{25}$ each independently represents a hydrogen atom, a linear or branched alkyl group having from 1 to 4 carbon atoms, or a polycyclic cycloalkyl group, provided that at least one of $R_{22}$ to $R_{25}$ represents a polycyclic cycloalkyl group and that $R_{23}$ and $R_{24}$ may be taken together to form a ring.

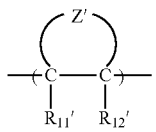
(II-AB)

In the general formula (II-AB), $R_{11}'$ and $R_{12}'$ each independently represents a hydrogen atom, a cyano group, a halogen atom, or an alkyl group, and Z' represents an atomic group for forming an alicyclic structure together with the bound two carbon atoms (C—C).

Furthermore, it is more preferable that the foregoing general formula (II-AB) is the following general formula (II-AB1) or (II-AB2).

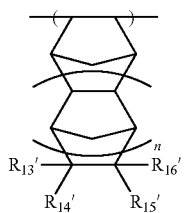
(II-AB1)

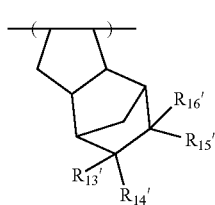
(II-AB2)

In the general formulae (II-AB1) and (II-AB2), $R_{13}'$ to $R_{16}'$ each independently represents a hydrogen atom, a halogen atom, a cyano group, —COOH, —COOR$_5$, a group which is decomposed by the action of an acid, —C(=O)—X-A'—R$_{17}'$, an alkyl group, or a cycloalkyl group, provided that at least two of $R_{13}'$ to $R_{16}'$ may be taken together to form a ring.

Here, $R_5$ represents an alkyl group, a cycloalkyl group, or a group having a lactone structure.

X represents an oxygen atom, a sulfur atom, —NH—, —NHSO$_2$—, or —NHSO$_2$NH—.

A' represents a single bond or a divalent connecting group.

$R_{17}'$ represents —COOH, —COOR$_5$, —CN, a hydroxyl group, an alkoxy group, —CO—NH—R$_6$, —CO—NH—SO$_2$—R$_6$, or a group having a lactone structure.

$R_6$ represents an alkyl group or a cycloalkyl group.

n represents 0 or 1.

In the general formulae (pI) to (pV), examples of the linear or branched alkyl group having from 1 to 4 carbon atoms represented by $R_{12}$ to $R_{25}$ include a methyl group, an ethyl group, an n-propyl group, an isopropyl group, an n-butyl group, an isobutyl group, and a sec-butyl group.

Specific examples of the polycyclic cycloalkyl group represented by $R_{11}$ to $R_{25}$ or the polycyclic cycloalkyl group formed by Z and the carbon atom include groups having a bicyclo, tricyclo or tetracyclo structure having 7 or more carbon atoms. The number of carbon atoms thereof is preferably from 7 to 30, and especially preferably from 7 to 25. Such a polycyclic cycloalkyl group may contain a substituent.

Preferred examples of the polycyclic cycloalkyl group include an adamantyl group, a noradamantyl group, a decalin residue, a tricyclodecanyl group, a tetracyclododecanyl group, a norbornyl group, and a cedrol group. Of these, an adamantyl group, a norbornyl group, a tetracyclododecanyl group, and a tricyclodecanyl group.

Such an alkyl group or polycyclic cycloalkyl group may further contain a substituent. Examples of such a substituent include an alkyl group (an alkyl group having from 1 to 4 carbon atoms), a halogen atom, a hydroxyl group, an alkoxy group (an alkoxy group having from 1 to 4 carbon atoms), a carboxyl group, and an alkoxycarbonyl group (an alkoxycarbonyl group having from 2 to 6 carbon atoms). Examples of a substituent which the foregoing alkyl group, alkoxy group or alkoxycarbonyl group or the like may further contain include a hydroxyl group, a halogen atom, and an alkoxy group.

Each of the structures represented by the general formulae (pI) to (pV) in the foregoing resin can be used for protecting an alkali-soluble group, thereby constituting the acid decomposable group.

As the repeating unit containing an alkali-soluble group protected by each of the structures represented by the general formulae (pI) to (pV), a repeating unit represented by the following general formula (pA) is preferable.

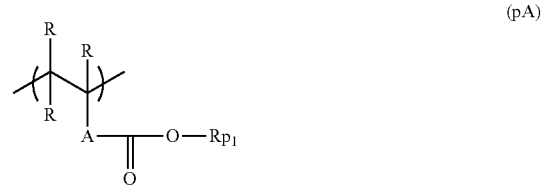
(pA)

In the general formula (pA),

R represents a hydrogen atom, a halogen atom, or a linear or branched alkyl group having from 1 to 4 carbon atoms, and plural Rs may be the same or different.

A represents a single group selected from a single bond, an alkylene group, an ether group, a thioether group, a carbonyl group, an ester group, an amide group, a sulfonamide group, a urethane group, and a urea group, or a combination of two or more thereof, and preferably a single bond.

Rp$_1$ represented a group represented by any one of the foregoing general formulae (pI) to (pV).

The repeating unit represented by the general formula (pA) is most preferably a repeating unit by a 2-alkyl-2-adamantyl (meth)acrylate or a dialkyl(1-adamantyl)methyl (meth)acrylate.

Specific examples of the repeating unit represented by the general formula (pA) are given below.

In the foregoing formulae, Rx represents H, CH3, CF3, or CH2OH; and

Rxa and Rxb each represents an alkyl group having from 1 to 4 carbon atoms.

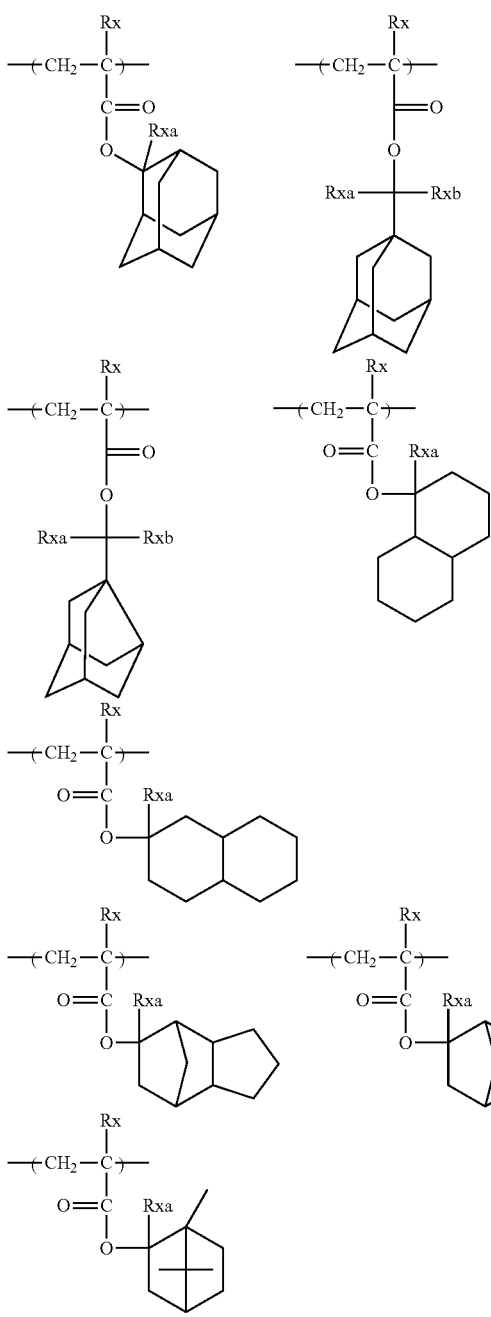

In the foregoing formulae, Rx represents H, $CH_3$, $CF_3$, or $CH_2OH$; and Rxa and Rxb each represents an alkyl group having from 1 to 4 carbon atoms.

In the foregoing general formula (II-AB), examples of the halogen atom represented by $R_{11}'$ and $R_{12}'$ include a chlorine atom, a bromine atom, a fluorine atom, and an iodine atom.

Examples of the alkyl group represented by $R_{11}'$ and $R_{12}'$ include a linear or branched alkyl group having from 1 to 10 carbon atoms.

The atomic group for forming an alicyclic structure represented by the foregoing Z' is an atomic group for forming a repeating unit of an optionally substituted alicyclic hydrocarbon, and preferably an atomic group for forming a bridged alicyclic structure capable of forming a repeating unit of a bridged alicyclic hydrocarbon.

Examples of a skeleton of the alicyclic hydrocarbon to be formed include skeletons the same as in the polycyclic cycloalkyl group represented by $R_{12}$ to $R_{25}$ in the general formulae (pI) to (pV).

The skeleton of the foregoing alicyclic hydrocarbon may contain a substituent. Examples of such a substituent include $R_{13}'$ to $R_{16}'$ in the foregoing general formula (II-AB1) or (II-AB2).

In the resin (A2), the group which is decomposed by the action of an acid can contain at least one kind of a repeating unit of a repeating unit having a partial structure containing the alicyclic hydrocarbon represented by any one of the foregoing general formulae (pI) to (pV), a repeating unit represented by the general formula (II-AB) and a repeating unit of copolymerization components as described later.

In the foregoing general formula (II-AB1) or (II-AB2), the various substituents represented by $R_{13}'$ to $R_{16}'$ can be a substituent of the atomic group for forming an alicyclic structure or the atomic group Z' for forming a bridged alicyclic structure in the foregoing general formula (II-AB).

Specific examples of the repeating unit represented by the foregoing general formula (II-AB1) or (II-AB2) are given below, but it should not be construed that the invention is limited thereto.

[II-1]

[II-2]

[II-3]

[II-4]

[II-5]

[II-6]

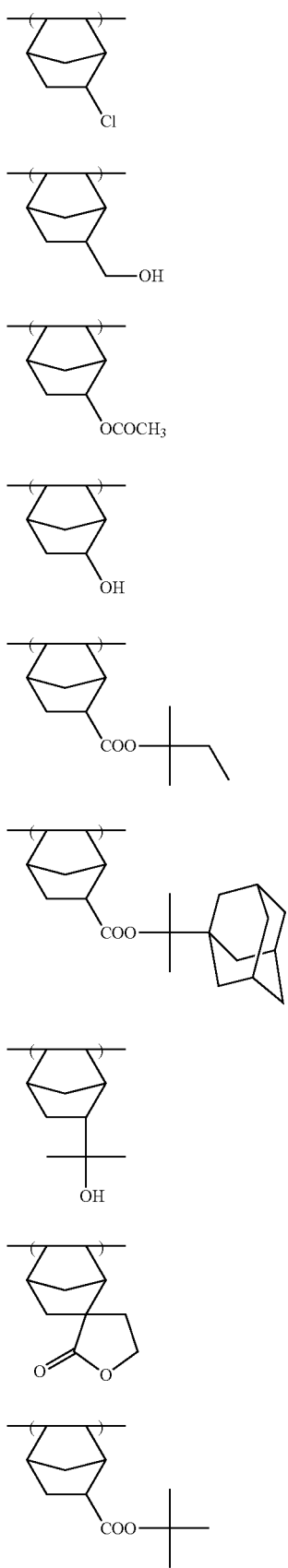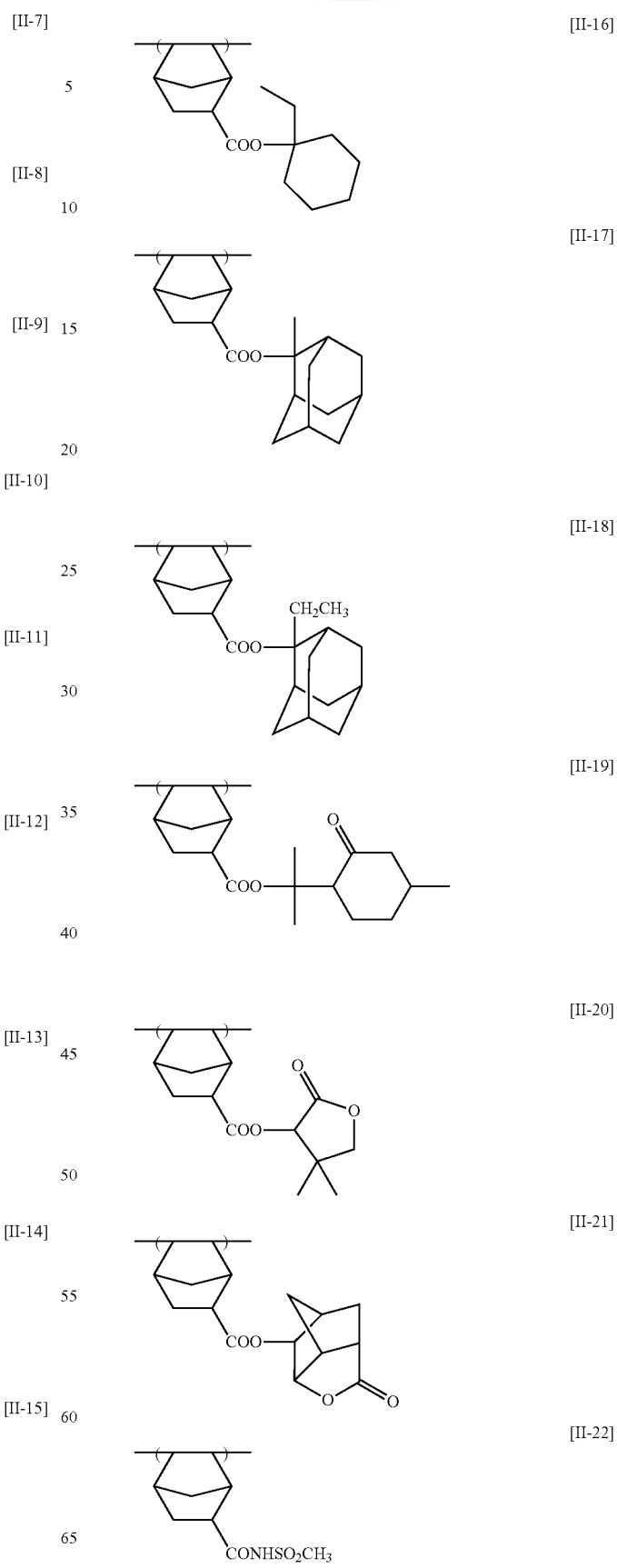

[II-23]
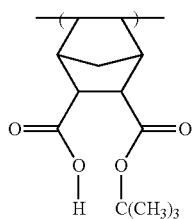

[II-24]
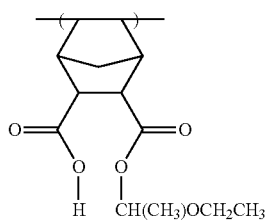

[II-25]
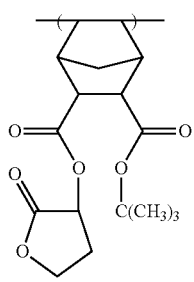

[II-26]
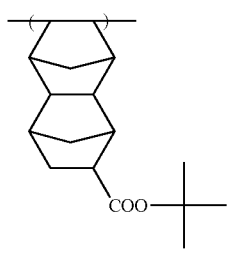

[II-27]
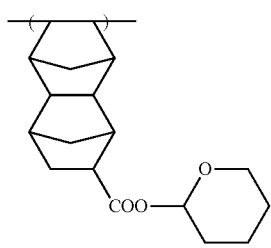

[II-28]
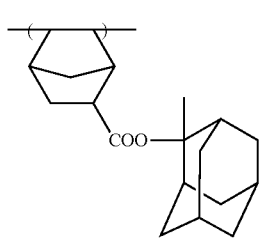

[II-29]
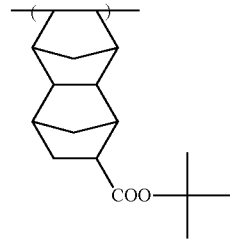

[II-30]
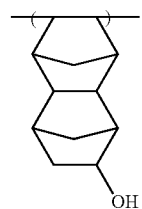

[II-31]
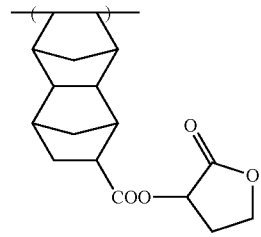

[II-32]
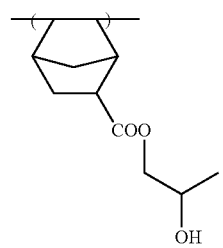

It is preferable that the resin (A2) contains a lactone ring-containing group. Though any group can be used as the lactone ring-containing group so far as it contains a latone ring, it is preferably a group having from 5- to 7-membered lactone structure. It is preferable that a 5- to 7-membered lactone structure is fused with other ring such that a bicyclo structure or a spiro structure is formed. A group having a lactone structure represented by any one of the following general formulae (LC1-1) to (LC1-16) is more preferable. Furthermore, the group having a lactone structure may be directly bound to the principal chain. As the lactone structure, (LC1-1), (LC1-4), (LC1-5), (LC1-6), (LC1-13) and (LC1-14) are preferable. By using the lactone structure, line edge roughness and development defects become good.

LC1-1
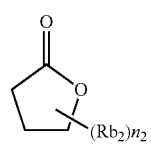

-continued

LC1-2 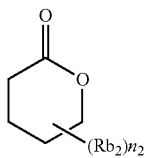

LC1-3 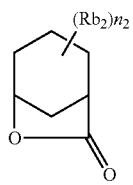

LC1-4 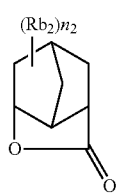

LC1-5 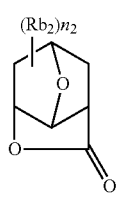

LC1-6 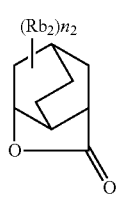

LC1-7 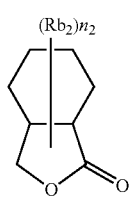

LC1-8 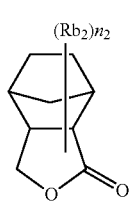

LC1-9 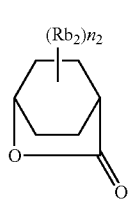

LC1-10 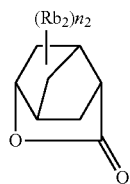

LC1-11 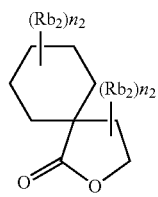

LC1-12 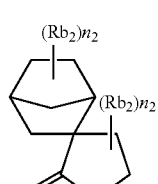

LC1-13 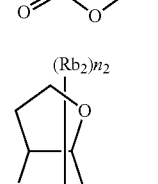

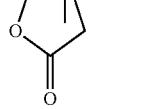

LC1-14 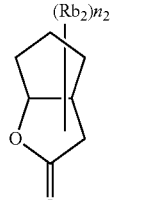

LC1-15 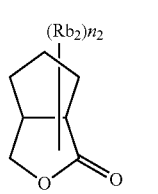

LC1-16 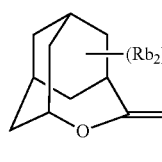

The lactone structure moiety may or may not contain a substituent ($Rb_2$). Preferred examples of the substituent ($Rb_2$) include an alkyl group having from 1 to 8 carbon atoms, a cycloalkyl group having from 4 to 7 carbon atoms, an alkoxy group having from 1 to 8 carbon atoms, an alkoxycarbonyl group having from 1 to 8 carbon atoms, a carboxyl group, a halogen atom, a hydroxyl group, a cyano group, and an acid decomposable group. $n_2$ represents an integer of from 0 to 4.

When $n_2$ is 2 or more, the plural existing $Rb_2$s may be the same or different; and the plural existing $Rb_2$s may be taken together to form a ring.

Examples of the repeating unit containing a group having a lactone structure represented by any one of the general formulae (LC1-1) to (LC1-13) include a repeating unit in which at least one of $R_{13}'$ to $R_{16}'$ in the foregoing general formula (II-AB1) or (II-AB2) contains a group represented by any one of the general formulae (LC1-1) to (LC1-16) (for example, $R_5$ in —$COOR_5$ represents a group represented by any one of the general formulae (LC1-1) to (LC1-16)) and a repeating unit represented by the following general formula (AI).

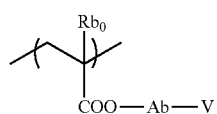

(AI)

In the general formula (AI), $Rb_0$ represents a hydrogen atom, a halogen atom, or an alkyl group having from 1 to 4 carbon atoms. Preferred examples of a substituent which the alkyl group represented by $Rb_0$ may contain include a hydroxyl group and a halogen atom. Examples of the halogen atom represented by $Rb_0$ include a fluorine atom, a chlorine atom, a bromine atom, and an iodine atom. $Rb_0$ is preferably a hydrogen atom or a methyl group.

Ab represents an alkylene group, a divalent connecting group having a monocyclic or polycyclic alicyclic hydrocarbon structure, a single bond, an ether group, an ester group, a carbonyl group, a carboxyl group, or a divalent connecting group composed of a combination thereof. Of these, a single bond and a divalent connecting group represented by -$Ab_1$-$CO_2$— are preferable. $Ab_1$ represents a linear or branched alkylene group or a monocyclic or polycyclic cycloalkylene group, and preferably a methylene group, an ethylene group, a cyclohexyl group, an adamantyl group, or a norbornyl group.

V represents a group represented by any one of the general formulae (LC1-1) to (LC1-16).

In the repeating unit having a lactone structure, though an optical isomer is usually present, any optical isomer may be used. Furthermore, one kind of an optical isomer may be used singly, or a mixture of plural optical isomers may be used. When one kind of an optical isomer is mainly used, its optical purity (ee) is preferably 90 or more, and more preferably 95 or more.

Specific examples of the repeating unit containing a group having a lactone structure are given below, but it should not be construed that the invention is limited thereto.

In the foregoing formulae, Rx represents H, CH3, CH$_2$OH, or CF3.

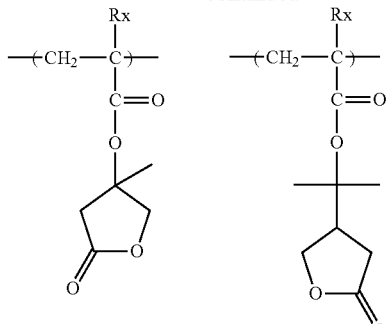

-continued

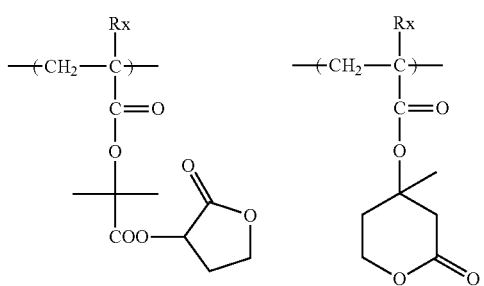

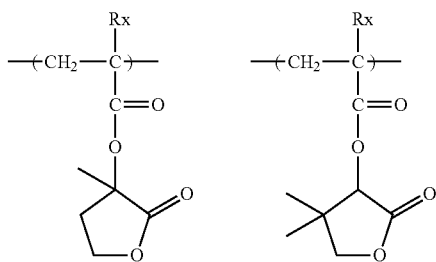

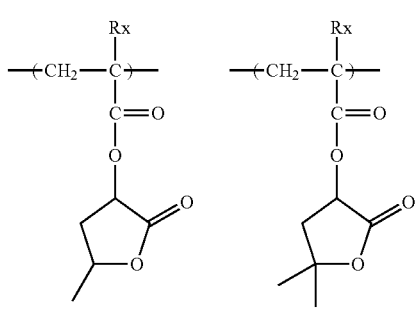

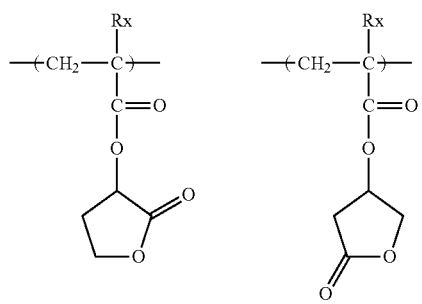

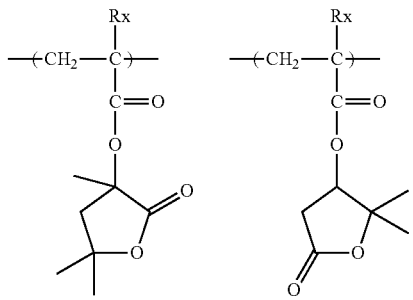

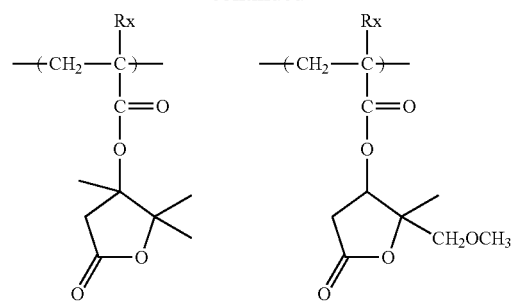
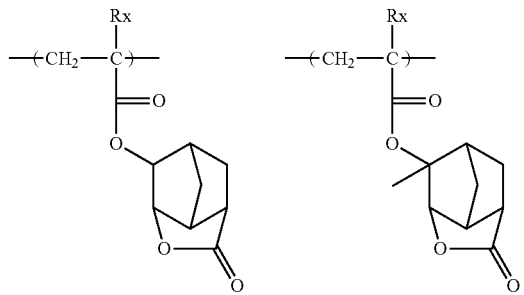
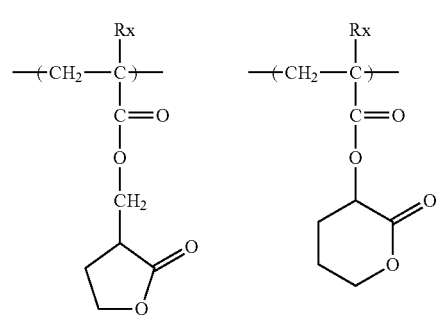
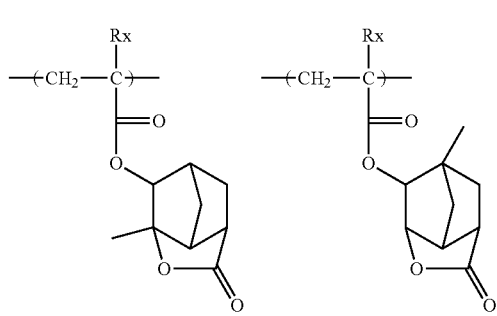
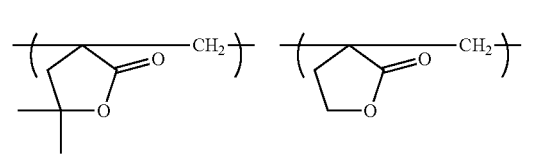
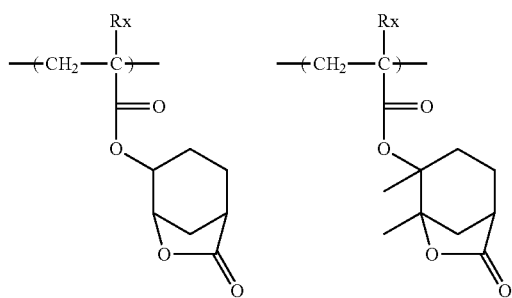
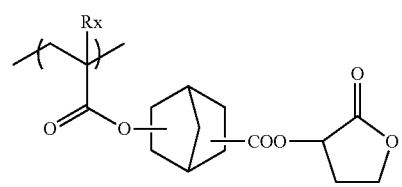
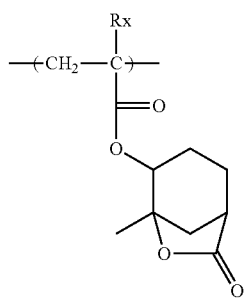
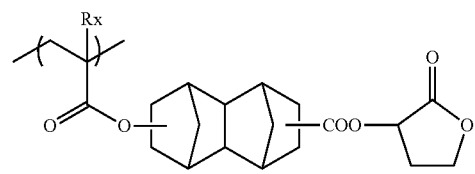
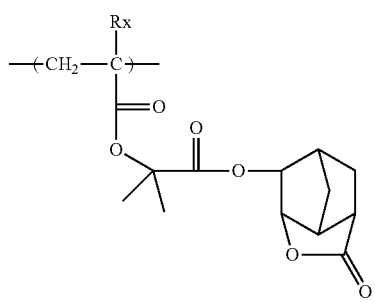
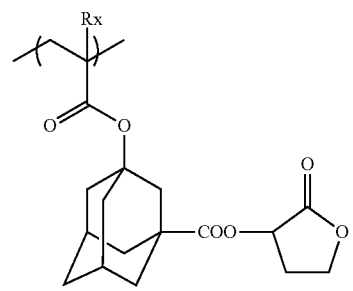
In the foregoing formulae, Rx represents H, CH3, CH2OH, or CF3.

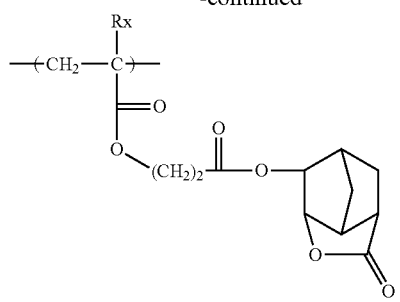
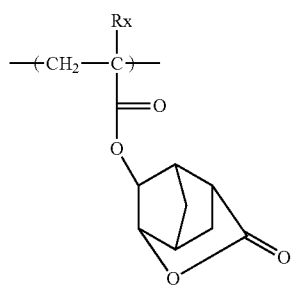
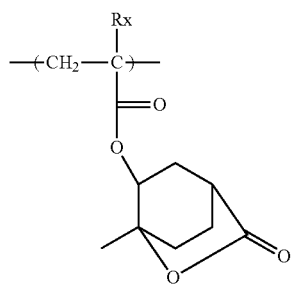
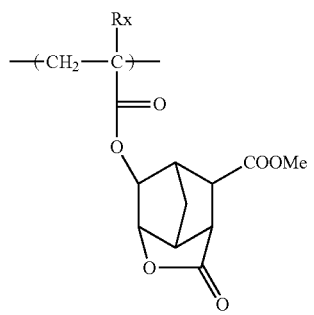
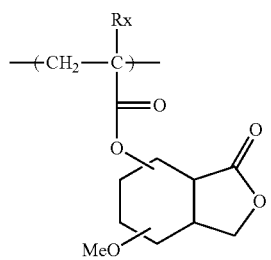
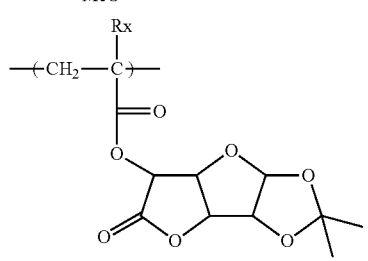
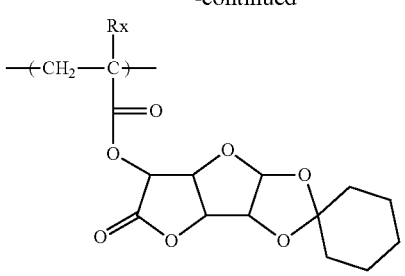
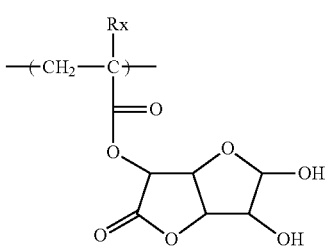
In the foregoing formulae, Rx represents H, CH3, CH2OH, or CF3.
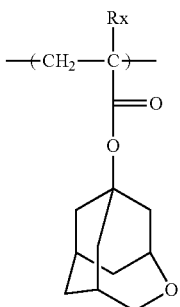
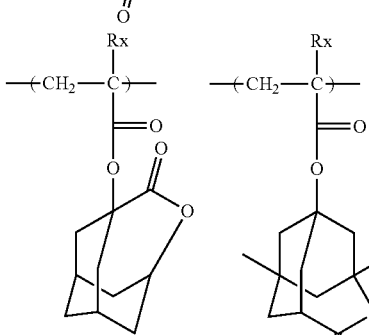
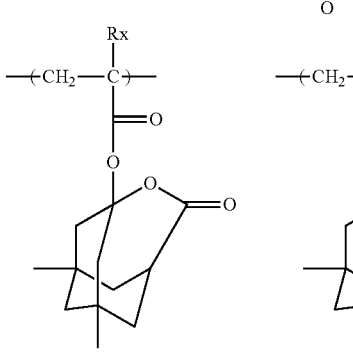

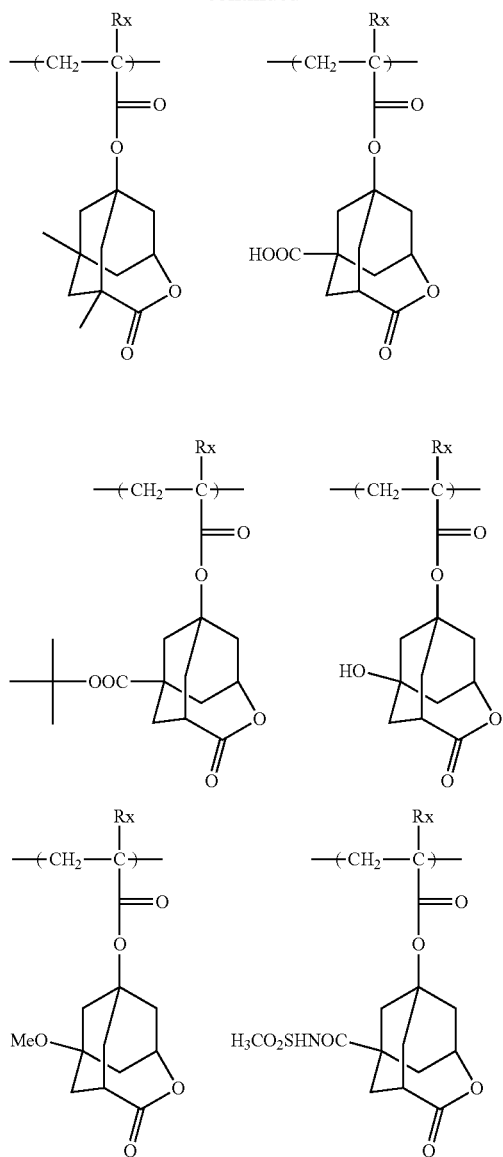

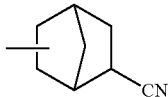

It is preferable that the resin (A2) contains a repeating unit having an alicyclic hydrocarbon structure substituted with a polar group. Thus, adhesion to substrate and compatibility with a developing solution are improved. As the polar group, a hydroxyl group or a cyano group is preferable.

Preferred examples of the alicyclic hydrocarbon structure substituted with a polar group include structures represented by the following general formulae (VIIa) and (VIIb).

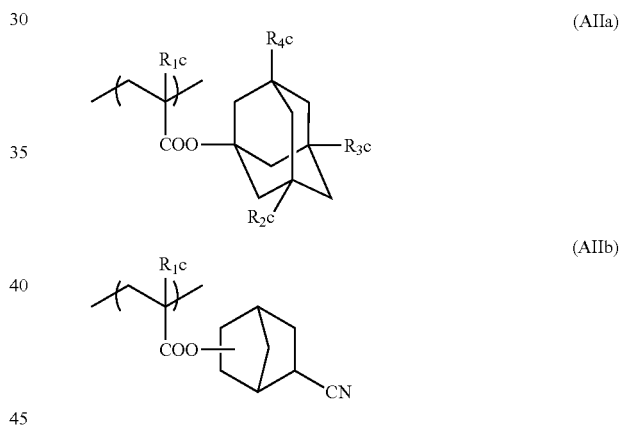

In the general formula (VIIa),
$R_2c$ to $R_4c$ each independently represents a hydrogen atom, a hydroxyl group, or a cyano group, provided that at least one of $R_2c$ to $R_4c$ represents a hydroxyl group or a cyano group. It is preferable that one or two of $R_2c$ to $R_4c$ are a hydroxyl group, with the remainder being a hydrogen atom; and it is more preferable that two of $R_2c$ to $R_4c$ are a hydroxyl group, with the remainder being a hydrogen atom.

The group represented by the general formula (VIIa) is preferably a dihydroxy body or a monohydroxy body, and more preferably a dihydroxy body.

Examples of the repeating unit containing a group represented by the general formula (VIIa) or (VIIb) include a repeating unit in which at least one of $R_{13}'$ to $R_{16}'$ in the foregoing general formula (II-AB1) or (II-AB2) contains a group represented by the general formula (VIIa) or (VIIb) (for example, $R_5$ in —$COOR_5$ represents a group represented by the general formula (VIIa) or (VIIb)) and a repeating unit represented by the following general formula (AIIa) or (AIIb).

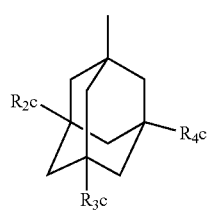

In the general formulae (AIIa) and (AIIb),
$R_1c$ represents a hydrogen atom, a methyl group, a trifluoromethyl group, or a hydroxymethyl group, and
$R_2c$ to $R_4c$ are synonymous with $R_2c$ to $R_4c$ in the general formula (VIIa), respectively.

Specific examples of the repeating unit represented by the general formula (AIIa) or (AIIb) are given below, but it should not be construed that the invention is limited thereto.

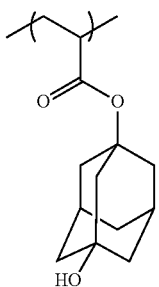 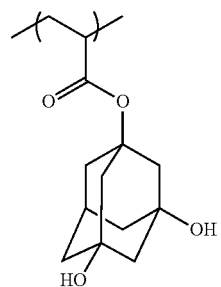

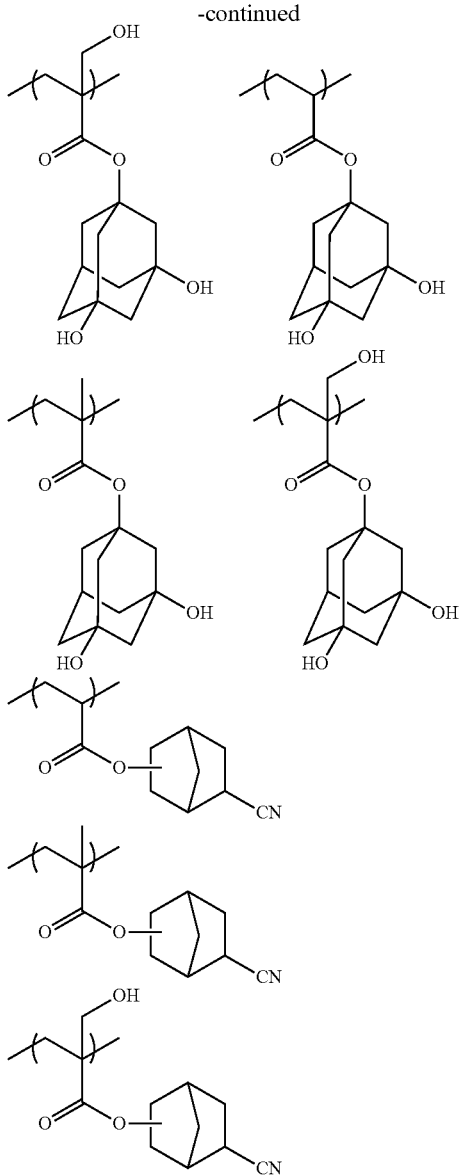

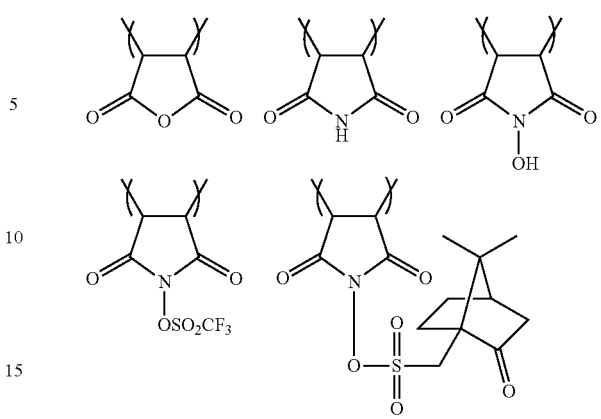

The resin (A2) preferably contains an alkali-soluble group-containing repeating unit, and more preferably a carboxyl group-containing repeating unit. When the resin (A2) contains an alkali-soluble group-containing repeating unit, resolution properties increase in a contact hole application. As the carboxyl group-containing repeating unit, all of a repeating unit in which a carboxyl group is directly bound to the principal chain of a resin, such as a repeating unit by acrylic acid or methacrylic acid, and a repeating unit in which a carboxyl group is bound to the principal chain of a resin via a connecting group are preferable. The connecting group may have a monocyclic or polycyclic hydrocarbon structure. Of these, a repeating unit by acrylic acid or methacrylic acid is the most preferable.

The resin (A) of the invention may further contain a repeating unit containing from one to three groups represented by the following general formula (F1). Thus, a line edge roughness performance is improved.

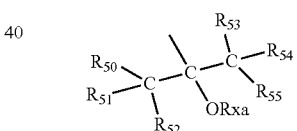
(F1)

In the general formula (F1), $R_{50}$ to $R_{55}$ each independently represents a hydrogen atom, a fluorine atom, or an alkyl group, provided that at least one of $R_{50}$ to $R_{55}$ represents a fluorine atom or an alkyl group in which at least one of hydrogen atoms thereof is substituted with a fluorine atom.

Rxa represents a hydrogen atom or an organic group (preferably an acid decomposable protective group, an alkyl group, a cycloalkyl group, an acyl group, or an alkoxycarbonyl group).

The alkyl group represented by $R_{50}$ to $R_{55}$ may be substituted with a halogen atom such as a fluorine atom, a cyano group, or the like and is preferably an alkyl group having from 1 to 3 carbon atoms, such as a methyl group and a trifluoromethyl group. It is preferable that all of $R_{50}$ to $R_{55}$ are a fluorine atom.

Preferred examples of the organic group represented by Rxa include an acid decomposable protective group, an optionally substituted alkyl group, an optionally substituted cycloalkyl group, an optionally substituted acyl group, an optionally substituted alkylcarbonyl group, an optionally substituted alkoxycarbonyl group, an optionally substituted The resin (A) of the invention may contain a repeating unit represented by the following general formula (VIII).

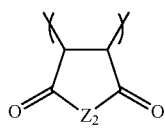
(VIII)

In the general formula (VIII), $Z_2$ represents —O— or —N($R_{41}$)—. $R_{41}$ represents a hydrogen atom, a hydroxyl group, an alkyl group, or —OSO$_2$—$R_{42}$. $R_{42}$ represents an alkyl group, a cycloalkyl group, or a camphor residue. The alkyl group represented by $R_{41}$ and $R_{42}$ may be substituted with a halogen atom (preferably a fluorine atom) or the like.

Specific examples of the repeating unit represented by the general formula (VIII) are given below, but it should not be construed that the invention is limited thereto.

alkoxycarbonylmethyl group, an optionally substituted alkoxymethyl group, and an optionally substituted 1-alkoxyethyl group.

The repeating unit containing a group represented by the general formula (F1) is preferably a repeating unit represented by the following general formula (F2).

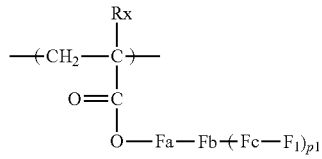

In the general formula (F2),

Rx represents a hydrogen atom, a halogen atom, or an alkyl group having from 1 to 4 carbon atoms. Preferred examples of a substituent which the alkyl group represented by Rx may contain include a hydroxyl group and a halogen atom.

Fa represents a single bond or a linear or branched alkylene group, and preferably a single bond.

Fb represents a monocyclic or polycyclic hydrocarbon group.

Fc represents a single bond or a linear or branched alkylene group (preferably a single bond or a methylene group).

$F_1$ represents a group represented by the general formula (F1).

$p_1$ represents from 1 to 3.

As the cyclic hydrocarbon group represented by Fb, a cyclopentyl group, a cyclohexyl group, and a norbornyl group are preferable.

Specific examples of the repeating unit having a structure represented by the general formula (F1) are given below.

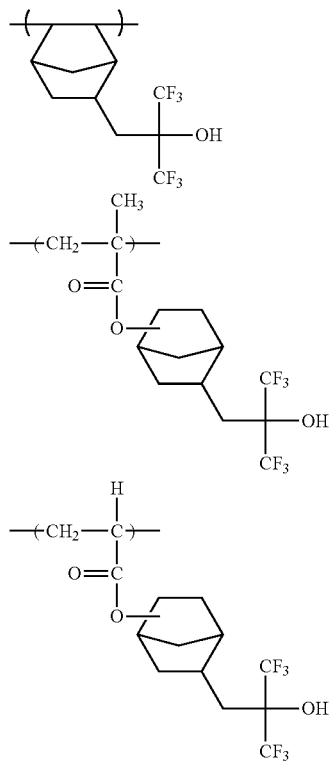

The resin (A2) can contain various repeating structural units in addition to the foregoing repeating structural units for the purpose of adjusting resistance to dry etching, aptitude for standard developing solution, adhesion to substrate, resist profile, and characteristics which are in general required for a resist, such as resolving power, heat resistance and sensitivity.

Examples of such a repeating structural unit include repeating structural units corresponding to the following monomers, but it should not be construed that the invention is limited thereto.

Thus, it becomes possible to make fine adjustments of performances required for the resin (A2), especially (1) dissolution properties in a coating solvent, (2) film formation properties (glass transition point), (3) alkali developability, (4) film thinning (hydrophilicity/hydrophobicity and selection of an alkali-soluble group), (5) adhesion of an unexposed area to a substrate, (6) resistance to dry etching, and so on.

Examples of such a monomer include compounds containing one addition polymerizable unsaturated bond selected from, for example, acrylic esters, methacrylic esters, acrylamides, methacrylamides, allyl compounds, vinyl ethers, and vinyl esters.

Besides, an addition polymerizable unsaturated compound may be copolymerized so far as it is copolymerizable with a monomer corresponding to the foregoing repeating structural unit of every kind.

In the resin (A2), a molar ratio of the respective recurring structural units to be contained is properly set up for the purpose of adjusting resistance to dry etching, aptitude for standard developing solution, adhesion to substrate and resist profile of a resist, and characteristics which are in general required for a resist, such as resolving power, heat resistance and sensitivity.

Preferred embodiments of the resin (A2) of the invention are as follows.

(1) A resin containing a repeating unit having a partial structure containing an alicyclic hydrocarbon represented by any one of the foregoing general formulae (pI) to (pV) (side chain type), and preferably a resin containing a (meth)acrylate repeating unit having a structure represented by any one of the general formulae (pI) to (pV).

(2) A resin containing a repeating unit represented by the general formula (II-AB) (principal chain type). However, in (2), the following is further enumerated.

(3) A resin containing a repeating unit represented by the general formula (II-AB), a repeating unit by a maleic anhydride derivative and a repeating unit by a (meth)acrylate (hybrid type).

In the resin (A2), the content of the repeating unit selected from the group consisting of the repeating unit represented by the general formula (1) and the repeating unit represented by the general formula (2) is preferably from 5 to 90% by mole, more preferably from 5 to 70% by mole, and further preferably from 10 to 60% by mole in the whole of repeating units.

In the resin (A2), the content of the repeating unit represented by the general formula (3) is preferably from 1 to 50% by mole, more preferably from 2 to 40% by mole, and further preferably from 5 to 30% by mole in the whole of repeating units.

In the resin (A2), the content of the repeating unit represented by the general formula (4) is preferably from 1 to 20% by mole, more preferably from 2 to 15% by mole, and further preferably from 3 to 15% by mole in the whole of repeating units.

In the resin (A2), the content of the repeating unit containing an acid decomposable group is preferably from 10 to 60% by mole, more preferably from 20 to 50% by mole, and further preferably from 25 to 40% by mole in the whole of repeating units.

In the resin (A2), the content of the repeating unit having a partial structure containing an alicyclic hydrocarbon represented by any one of the general formulae (pI) to (pV) is preferably from 25 to 70% by mole, more preferably from 35 to 65% by mole, and further preferably from 40 to 60% by mole in the whole of repeating units.

In the resin (A2), the content of the repeating unit represented by the general formula (II-AB) is preferably from 10 to 60% by mole, more preferably from 15 to 55% by mole, and further preferably from 20 to 50% by mole in the whole of repeating units.

Furthermore, the content of the repeating structural unit based on the monomers of the foregoing copolymerization components in the resin can also be properly set up depending upon a desired performance of the resist. In general, it is preferably not more than 99% by mole, more preferably not more than 90% by mole, and further preferably not more than 80% by mole based on the total molar number of the sum of the repeating structural unit having a partial structure containing an alicyclic hydrocarbon represented by any one of the foregoing general formulae (pI) to (pV) and the repeating unit represented by the foregoing general formula (II-AB).

When the composition of the invention is one for ArF exposure, it is preferable that the resin does not contain an aromatic group in view of transparency to ArF light.

As the resin (A2), it is preferable that all the repeating units are constituted of a (meth)acrylate based repeating unit. In this case, any of a resin in which all repeating units are a methacrylate based repeating unit, a resin in which all repeating units are an acrylate based repeating unit, and a resin in which all repeating units are composed of a mixture of a methacrylate based repeating unit and an acrylate based repeating unit can be used; and it is preferable that the acrylate based repeating init accounts for not more than 50% by mole of the whole of repeating units. A copolymerization polymer containing from 10 to 60% by mole of the content of the repeating unit selected from the group consisting of the repeating unit represented by the general formula (1) and the repeating unit represented by the general formula (2), from 5 to 30% by mole of a repeating unit represented by the general formula (3), from 3 to 15% by mole of a repeating unit represented by the general formula (4), from 25 to 50% by mole of a repeating unit having a partial structure containing an alicyclic hydrocarbon represented by any one of the general formulae (pI) to (pV), from 25 to 50% by mole of a repeating unit having the foregoing lactone structure, and from 5 to 30% by mole of a repeating unit having the foregoing alicyclic hydrocarbon structure substituted with a polar group; and a copolymerization polymer further containing from 5 to 20% by mole of a repeating unit having a structure represented by the general formula (F1) are more preferable.

The resin (A2) can be synthesized in the usual way (for example, radical polymerization). Examples of a general synthesis method include a batch polymerization method of dissolving a monomer species and an initiator in a solvent and heating the solution to achieve polymerization; and a dropwise polymerization method of adding dropwise a solution of a monomer species and an initiator in a heated solvent over from 1 to 10 hours, with a dropwise addition being preferable. Examples of the reaction solvent include ethers such as tetrahydrofuran, 1,4-dioxane, and diisopropyl ether; ketones such as methyl ethyl ketone and methyl isobutyl ketone; ester solvents such as ethyl acetate; amide solvents such as dimethylformamide and dimethylacetamide; and solvents capable of dissolving the composition of the invention as described later, such as propylene glycol monomethyl ether acetate, propylene glycol monomethyl ether, and cyclohexanone. It is more preferable that the polymerization is carried out by using a solvent the same as the solvent used in the composition of the invention. Thus, it is possible to suppress the generation of particles at the time of storage.

It is preferable that the polymerization reaction is carried out under an atmosphere of an inert gas such as nitrogen and argon. The polymerization is initiated by using, as the polymerization initiator, a commercially available radical initiator (for example, azo based initiators and peroxides). As the radical initiator, an azo based initiator is preferable; and an azo based initiator containing an ester group, a cyano group, or a carboxyl group is preferable. Preferred examples of the initiator include azobisisobutyronitrile, azobisdimethylvaleronitrile, and dimethyl 2,2'-azobis(2-methylpropionate). If desired, the initiator is supplemented or dividedly added; after completion of the reaction, the reaction mixture is thrown into a solvent; and the desired polymer is recovered by a method such as powder or solid recovery. A reaction concentration is from 5 to 50% by weight, and preferably from 10 to 30% by weight. A reaction temperature is usually from 10° C. to 150° C., preferably from 30° C. to 120° C., and more preferably from 50 to 100° C.

A weight average molecular weight of the resin (A2) is preferably from 3,000 to 30,000, more preferably from 4,500 to 15,000, and especially preferably from 4,000 to 10,000 in terms of a reduced value into polystyrene by the GPC method. Such a molecular weight range is preferable in view of improving the sensitivity and preventing scam. Furthermore, the weight average molecular weight is preferably 3,000 or more in view of heat resistance and resistance to dry etching.

A degree of dispersion (Mw/Mn) of the resin (A2) is preferably from 1.3 to 4.0, and more preferably from 1.5 to 3.0.

A blending amount of the resin (A2) is preferably from 40 to 99.99% by weight, and more preferably from 50 to 99.97% by weight in the whole of solids in the composition.

[3] Compound (B) Capable of Generating an Acid Upon Irradiation with Active Rays or Radiations:

The positive composition of the invention contains a compound capable of generating an acid upon irradiation with active rays or radiations (also referred to as "acid generator").

As such an acid generator, photoinitiators of photo cation polymerization, photoinitiators of photo radical polymerization, photodecoloring agents of dyes, photo-discoloring agents, known compounds capable of generating an acid upon irradiation with active rays or radiations, which are used in micro resists or the like, and mixtures thereof can be properly selected and used.

Examples of the acid generator include diazonium salts, phosphonium salts, sulfonium salts, iodonium salts, imide sulfonates, oxime sulfonates, diazodisulfone, disulfone, and o-nitrobenzyl sulfonate.

Compounds having such a group or compound capable of generating an acid upon irradiation with active rays or radiations introduced into the principal chain or side chain of a polymer, for example, compounds described in U.S. Pat. No. 3,849,137, German Patent No. 3914407, JP-A-63-26653, JP-A-55-164824, JP-A-62-69263, JP-A-63-146038, JP-A-63-163452, JP-A-62-153853, and JP-A-63-146029 can also be used.

In addition, compounds capable of generating an acid by light, as described in U.S. Pat. No. 3,779,778 and European Patent No. 126,712 can be used.

Of the compounds capable of generating an acid upon irradiation with active rays or radiations, compounds represented by the following general formulae (ZI), (ZII) and (ZIII) can be enumerated as a preferred compound.

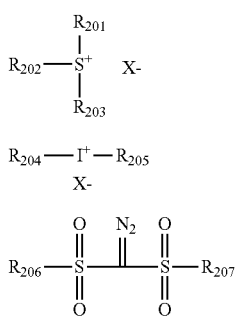

ZI

ZII

ZIII

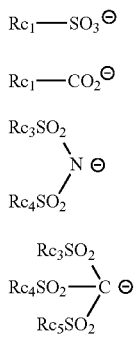

In the general formula (ZI), $R_{201}$, $R_{202}$ and $R_{203}$ each independently represents an organic group.

$X^-$ represents a non-nucleophilic anion, and preferably a sulfonic acid anion, a carboxylic acid anion, a bis(alkylsulfonyl)amide anion, a tris(alkylsulfonyl)methide anion, $BF_4^-$, $PF_6^-$, or $SbF_6^-$, with an organic anion containing a carbon atom being preferable.

Preferred examples of the organic anion include organic anions represented by the following general formulae (AN1) to (AN4).

$$Rc_1\text{—}SO_3^{\ominus} \quad \text{AN1}$$

$$Rc_1\text{—}CO_2^{\ominus} \quad \text{AN2}$$

$$\begin{array}{c} Rc_3SO_2 \\ \phantom{Rc_3SO_2}\diagdown \\ \phantom{Rc_3SO_2}N^{\ominus} \\ \phantom{Rc_3SO_2}\diagup \\ Rc_4SO_2 \end{array} \quad \text{AN3}$$

$$\begin{array}{c} Rc_3SO_2 \\ \phantom{Rc_3SO_2}\diagdown \\ Rc_4SO_2\text{—}C^{\ominus} \\ \phantom{Rc_3SO_2}\diagup \\ Rc_5SO_2 \end{array} \quad \text{AN4}$$

In the general formulae (AN1) to (AN2), $Rc_1$ represents an organic group.

Examples of the organic group represented by $Rc_1$ include an organic group having from 1 to 30 carbon atoms. Preferred examples thereof include an optionally substituted alkyl group or aryl group and a group in which a plurality of these groups are connected to each other via a connecting group such as a single bond, —O—, —CO$_2$—, —S—, —SO$_3$—, and —SO$_2$N(Rd$_1$)—. Rd$_1$ represents a hydrogen atom or an alkyl group and may form a ring structure together with the bound alkyl group or aryl group.

As the organic group represented by $Rc_1$, an alkyl group which is substituted with a fluorine atom or a fluoroalkyl group at the 1-position thereof and a phenyl group which is substituted with a fluorine atom or a fluoroalkyl group are more preferable. By containing a fluorine atom or a fluoroalkyl group, the acidity of an acid generated upon irradiation with light increases, and the sensitivity is improved. When $Rc_1$ has 5 or more carbon atoms, in at least one of the carbon atoms, it is preferable that all of the hydrogen atoms are not substituted with a fluorine atom but a hydrogen atom is present; and it is more preferable that the number of hydrogen atoms is large. When a perfluoroalkyl group having 5 or more carbon atoms is not present, toxicity against the ecology is reduced.

An especially preferred embodiment of $Rc_1$ is a group represented by the following general formula.

$$Rc_7\text{-Ax-}Rc_6\text{-}$$

In the foregoing general formula, $Rc_6$ represents a perfluoroalkylene group preferably having not more than 4 carbon atoms, more preferably from 2 to 4 carbon atoms, and further preferably from 2 to 3 carbon atoms or a phenylene group substituted with from 1 to 4 fluorine atoms and/or from 1 to 3 fluoroalkyl groups.

Ax represents a connecting group (preferably, a single bond, —O—, —CO$_2$—, —S—, —SO$_3$—, or —SO$_2$N(Rd$_1$)—). Rd$_1$ represents a hydrogen atom or an alkyl group and may be taken together with $Rc_7$ to form a ring structure.

$Rc_7$ represents a hydrogen atom, a fluorine atom, a linear or branched alkyl group, a monocyclic or polycyclic alkyl group, or an aryl group. The alkyl group, the cyclic alkyl group and the aryl group may be each substituted. It is preferable that the substituent does not contain a fluorine atom.

In the general formulae (AN3) to (AN4), $Rc_3$, $Rc_4$ and $Rc_5$ each independently represents an organic group.

Preferred examples of the organic group represented by $Rc_3$, $Rc_4$ and $Rc_5$ include organic groups the same as those enumerated for the organic group represented by $Rc_1$ as a preferred example.

$Rc_3$ and $Rc_4$ may be taken together to form a ring. Examples of the group formed when $Rc_3$ and $Rc_4$ are taken together include an alkylene group and an arylene group. Of these, a perfluoroalkylene group having from 2 to 4 carbon atoms is preferable. When $Rc_3$ and $Rc_4$ are taken together to form a ring, the acidity of an acid generated upon irradiation with light increases and the sensitivity is improved, and therefore, such is preferable.

In the general formula (ZI), the number of carbon atoms of the organic group represented by $R_{201}$, $R_{202}$ and $R_{203}$ is generally from 1 to 30, and preferably from 1 to 20.

Furthermore, two of $R_{201}$ to $R_{203}$ may be taken together to form a ring structure; and the ring may contain an oxygen atom, a sulfur atom, an ester bond, an amide bond, or a carbonyl group. Examples of the group formed when two of $R_{201}$ to $R_{203}$ are taken together include an alkylene group (for example, a butylene group and a pentylene group).

Specific examples of the organic group represented by $R_{201}$, $R_{202}$ and $R_{203}$ include groups corresponding to compounds (ZI-1), (ZI-2) and (ZI-3) as described later.

Incidentally, the compound may be a compound having plural structures represented by the general formula (ZI). For example, the compound may be a compound having a structure in which at least one of $R_{201}$ to $R_{203}$ of a compound represented by the general formula (ZI) is bound to at least one of $R_{201}$ to $R_{203}$ of another compound represented by the general formula (ZI).

Further preferred examples of the (ZI) component include compounds (ZI-1), (ZI-2) and (ZI-3) as described below.

A compound (ZI-1) is an aryl sulfonium compound in which at least one of $R_{201}$ to $R_{203}$ of the foregoing general formula (ZI) is an aryl group, namely a compound containing an aryl sulfonium as a cation.

In the aryl sulfonium compound, all of $R_{201}$ to $R_{203}$ may be an aryl group; and a part of $R_{201}$ to $R_{203}$ may be an aryl group, with the remainder being an alkyl group or a cycloalkyl group.

Examples of the aryl sulfonium compound include triayl sulfonium compounds, diarylalkyl sulfonium compounds, aryldialkyl sulfonium compounds, diarylcycloalkyl sulfonium compounds, and aryldicycloalkyl sulfonium compounds.

As the aryl group of the aryl sulfonium compound, an aryl group (for example, a phenyl group and a naphthyl group) and a heteroaryl group (for example, an indole residue and a pyrrole residue) are preferable; and a phenyl group and an indole residue are more preferable. In the case where the aryl sulfonium compound contains two or more aryl groups, the two or more aryl groups may be the same or different.

The alkyl group which the aryl sulfonium compound contains as the need arises is preferably a linear or branched alkyl group having from 1 to 15 carbon atoms, for example, a methyl group, an ethyl group, a propyl group, an n-butyl group, a sec-butyl group, and a t-butyl group.

The cycloalkyl group which the aryl sulfonium compound contains as the need arises is preferably a cycloalkyl group having from 3 to 15 carbon atoms, for example, a cyclopropyl group, a cyclobutyl group, and a cyclohexyl group.

The aryl group, the alkyl group and the cycloalkyl group represented by $R_{201}$ to $R_{203}$ may each have a substituent such as an alkyl group (for example, an alkyl group having from 1 to 15 carbon atoms), a cycloalkyl group (for example, a cycloalkyl group having from 3 to 15 carbon atoms), an aryl group (for example, an aryl group having from 6 to 14 carbon atoms), an alkoxy group (for example, an alkoxy group having from 1 to 15 carbon atoms), a halogen atom, a hydroxyl group, and a phenylthio group. Of these substituents, a linear or branched alkyl group having from 1 to 12 carbon atoms, a cycloalkyl group having from 3 to 12 carbon atoms, and a linear or branched alkoxy group having from 1 to 12 carbon atoms are preferable; and an alkyl group having from 1 to 4 carbon atoms and an alkoxy group having from 1 to 4 carbon atoms are especially preferable. The substituent may be substituted on any one of three $R_{201}$ to $R_{203}$ or may be substituted on all of three $R_{201}$ to $R_{203}$. Furthermore, when each of $R_{201}$ to $R_{203}$ is an aryl group, it is preferable that the substituent is substituted at the p-position of the aryl group.

Next, a compound (ZI-2) is described.

A compound (ZI-2) is a compound in which $R_{201}$ to $R_{203}$ in the general formula (ZI) each independently represents an aromatic ring-free organic group. The "aromatic ring" as referred to herein also includes a hetero atom-containing aromatic ring.

The aromatic ring-free organic group represented by $R_{201}$ to $R_{203}$ generally has from 1 to 30 carbon atoms, and preferably from 1 to 20 carbon atoms.

$R_{201}$ to $R_{203}$ are each independently preferably an alkyl group, a cycloalkyl group, an allyl group, or a vinyl group; more preferably a linear, branched or cyclic 2-oxoalkyl group or an alkoxycarbonylmethyl group; and especially preferably a linear or branched 2-oxoalkyl group.

The alkyl group represented by $R_{201}$ to $R_{203}$ is preferably a linear or branched alkyl group having from 1 to 10 carbon atoms (for example, a methyl group, an ethyl group, a propyl group, a butyl group, and a pentyl group). The alkyl group represented by $R_{201}$ to $R_{203}$ is more preferably a linear or branched 2-oxoalkyl group or an alkoxymethyl group.

The cycloalkyl group represented by $R_{201}$ to $R_{203}$ is preferably a cycloalkyl group having from 3 to 10 carbon atoms (for example, a cyclopentyl group, a cyclohexyl group, and a norbornyl group). The cycloalkyl group represented by $R_{201}$ to $R_{203}$ is more preferably a cyclic 2-oxoalkyl group.

The linear, branched or cyclic 2-oxoalkyl group represented by $R_{201}$ to $R_{203}$ is preferably a group in which >C=O is present at the 2-position of the foregoing alkyl group or cycloalkyl group.

The alkoxy group in the alkoxycarbonylmethyl group represented by $R_{201}$ to $R_{203}$ is preferably an alkoxy group having from 1 to 5 carbon atoms (for example, a methoxy group, an ethoxy group, a propoxy group, a butoxy group, and a pentoxy group).

Each of $R_{201}$ to $R_{203}$ may be further substituted with a halogen atom, an alkoxy group (for example, an alkoxy group having from 1 to 5 carbon atoms), a hydroxyl group, a cyano group, or a nitro group.

A compound (ZI-3) is a compound represented by the following general formula (ZI-3) and is a compound having a phenacyl sulfonium salt structure.

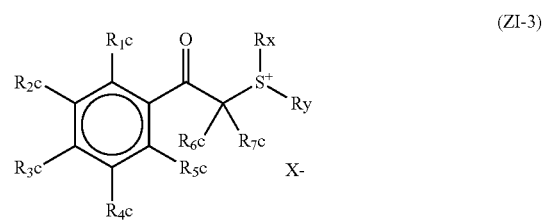

(ZI-3)

In the general formula (ZI-3), $R_1c$ to $R_5c$ each independently represents a hydrogen atom, an alkyl group, a cycloalkyl group, an alkoxy group, or a halogen atom.

$R_6c$ and $R_7c$ each independently represents a hydrogen atom, an alkyl group, or a cycloalkyl group.

Rx and Ry each independently represents an alkyl group, a cycloalkyl group, an allyl group, or a vinyl group.

Two or more of $R_1c$ to $R_5c$ or Rx and Ry may be taken together to form a ring structure. This ring structure may contain an oxygen atom, a sulfur atom, an ester bond, or an amide bond. Examples of the group formed when two or more of $R_1c$ to $R_5c$ or Rx and Ry are taken together include a butylene group and a pentylene group.

$X^-$ represents a non-nucleophilic anion, and examples thereof include a non-nucleophilic anion the same as in $X^-$ in the general formula (I).

Examples of the alkyl group represented by $R_1c$ to $R_7c$ include a linear or branched alkyl group having from 1 to 20 carbon atoms, and preferably a linear or branched alkyl group having from 1 to 12 carbon atoms (for example, a methyl group, an ethyl group, a linear or branched propyl group, a linear or branched butyl group, and a linear or branched pentyl group).

The cycloalkyl group represented by $R_1c$ to $R_7c$ is preferably a cycloalkyl group having from 3 to 8 carbon atoms (for example, a cyclopentyl group and a cyclohexyl group).

The alkoxy group represented by $R_1c$ to $R_5c$ may be linear, branched or cyclic. Examples thereof include an alkoxy group having from 1 to 10 carbon atoms, preferably a linear or branched alkoxy group having from 1 to 5 carbon atoms (for example, a methoxy group, an ethoxy group, a linear or branched propoxy group, a linear or branched butoxy group, and a linear or branched pentoxy group) and a cyclic alkoxy group having from 3 to 8 carbon atoms (for example, a cyclopentyloxy group and a cyclohexyloxy group).

It is preferable that any one of $R_1c$ to $R_5c$ is a linear or branched alkyl group, a cycloalkyl group, or a linear, branched or cyclic alkoxy group; and it is more preferable that the total number of carbon atoms of $R_1c$ to $R_5c$ is from 2 to 15. Thus, the dissolution properties in a solvent are improved, and the generation of particles at the time of storage is suppressed.

Examples of the alkyl group represented by Rx and Ry include alkyl groups the same as in the alkyl group represented by $R_1c$ to $R_7c$. The alkyl group represented by Rx and Ry is more preferably a linear or branched 2-oxoalkyl group or an alkoxymethyl group.

Examples of the cycloalkyl group represented by Rx and Ry include cycloalkyl groups the same as in the cycloalkyl group represented by $R_1c$ to $R_7c$. The cycloalkyl group represented by Rx and Ry is more preferably a cyclic 2-oxoalkyl group.

The linear, branched or cyclic 2-oxoalkyl group is preferably a group in which >C=O is present at the 2-position of the alkyl group or cycloalkyl group represented by $R_1c$ to $R_7c$.

Examples of the alkoxy group in the alkoxycarbonylmethyl group include alkoxy groups the same as in the alkoxy group represented by $R_1c$ to $R_5c$.

Rx and Ry are each preferably an alkyl group having 4 or more carbon atoms, more preferably an alkyl group having 6 or more carbon atoms, and further preferably an alkyl group having 8 or more carbon atoms.

In the foregoing general formulae (ZII) and (ZIII), $R_{204}$ to $R_{207}$ each independently represents an aryl group, an alkyl group, or a cycloalkyl group.

The aryl group represented by $R_{204}$ to $R_{207}$ is preferably a phenyl group or a naphthyl group, and more preferably a phenyl group.

The alkyl group represented by $R_{204}$ to $R_{207}$ is preferably a linear or branched alkyl group having from 1 to 10 carbon atoms (for example, a methyl group, an ethyl group, a propyl group, a butyl group, and a pentyl group).

The cycloalkyl group represented by $R_{204}$ to $R_{207}$ is preferably a cycloalkyl group having from 3 to 10 carbon atoms (for example, a cyclopentyl group, a cyclohexyl group, and a norbornyl group).

$R_{204}$ to $R_{207}$ may each contain a substituent. Examples of the substituent which $R_{204}$ to $R_{207}$ may each contain include an alkyl group (for example, an alkyl group having from 1 to 15 carbon atoms), a cycloalkyl group (for example, a cycloalkyl group having from 3 to 15 carbon atoms), an aryl group (for example, an aryl group having from 6 to 15 carbon atoms), an alkoxy group (for example, an alkoxy group having from 1 to 15 carbon atoms), a halogen atom, a hydroxyl group, and a phenylthio group.

$X^-$ represents a non-nucleophilic anion, and examples thereof include a non-nucleophilic anion the same as in $X^-$ in the general formula (I).

Of the compounds capable of generating an acid upon irradiation with active rays or radiations, compounds represented by the following general formulae (ZIV), (ZV) and (ZVI) can be further enumerated as a preferred compound.

$$Ar_3-SO_2-SO_2-Ar_4 \qquad \text{ZIV}$$

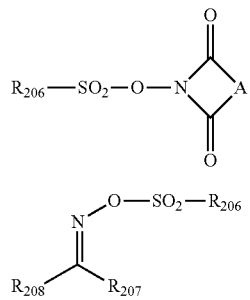

ZV

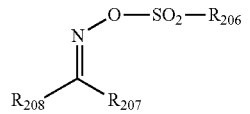

ZVI

In the general formulae (ZIV) to (ZVI), $Ar_3$ and $Ar_4$ each independently represents an aryl group.

$R_{206}$ represents an alkyl group, a cycloalkyl group, or an aryl group.

$R_{207}$ and $R_{208}$ each independently represents an alkyl group, a cycloalkyl group, an aryl group, or an electron withdrawing group. $R_{207}$ is preferably an aryl group; and $R_{208}$ is preferably an electron withdrawing group, and more preferably a cyano group or a fluoroalkyl group.

A represents an alkylene group, an alkenylene group, or an arylene group.

Of the compounds capable of generating an acid upon irradiation with active rays or radiations, compounds represented by the general formulae (ZI) to (ZIII) are more preferable; a compound represented by the general formula (ZI) is further preferable; and compounds represented by the general formulae (ZI-1) to (ZI-3) are especially preferable.

In addition, compounds represented by the following general formulae (AC1) to (AC3) which are able to generate an acid upon irradiation with active rays or radiations are preferable.

$$Rc_1-SO_3H \qquad \text{AC1}$$

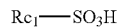

AC2

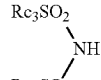

AC3

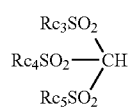

In the general formulae (AC1) to (AC3), $Rc_1$ and $Rc_3$ to $Rc_5$ are synonymous with $Rc_1$ and $Rc_3$ to $Rc_5$ in the general formulae (AN1) to (AN4), respectively.

That is, an especially preferred embodiment of the acid generator is a compound in which in the structure of the general formula (ZI), $X^-$ is an anion selected from the foregoing general formulae (AN1), (AN3) and (AN4).

Especially preferred examples of the compound capable of generating an acid upon irradiation with active rays or radiations are given below.

(z1)

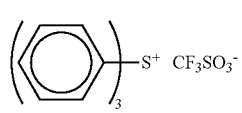

(z2)

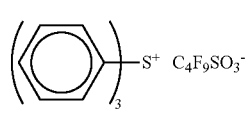

-continued
(z3) 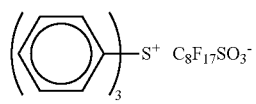
(z4) 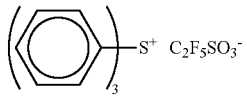
(z5) 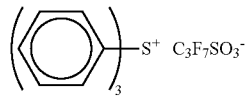
(z6) 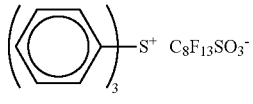
(z7) 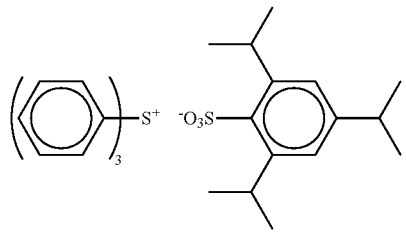
(z8) 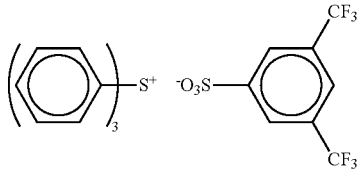
(z9) 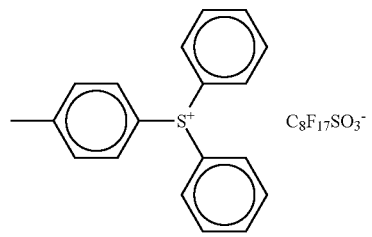
(z10) 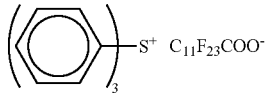
(z11) 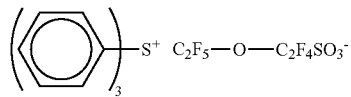
(z12) 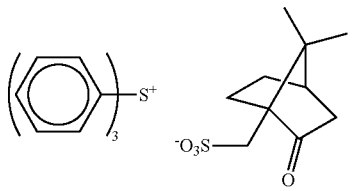
(z13) 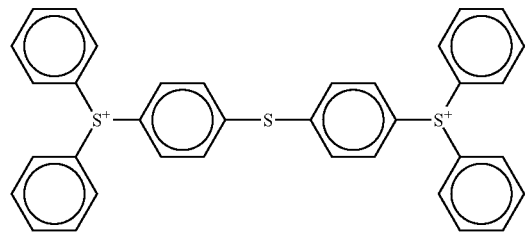
(z14) 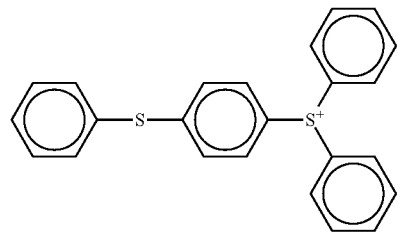
(z15) 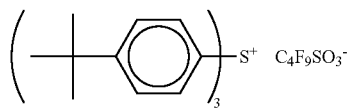
(z16) 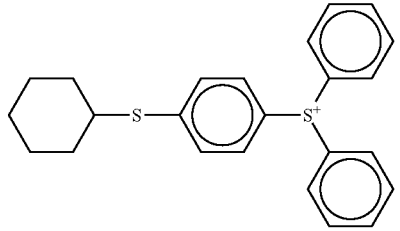

-continued
(z17) 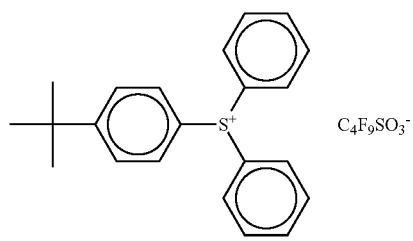
(z18) 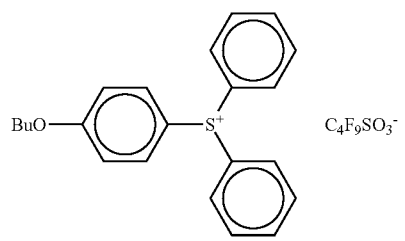
(z19) 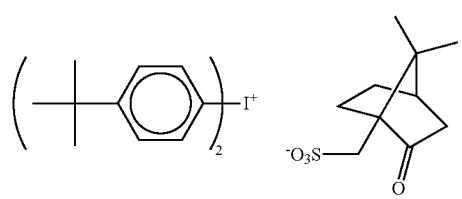
(z20) 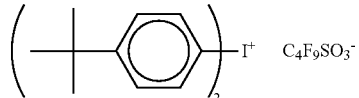
(z21) 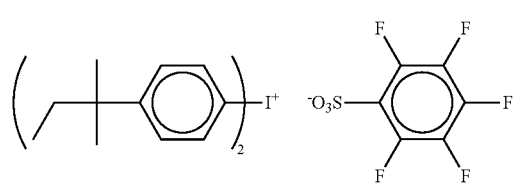
(z22) 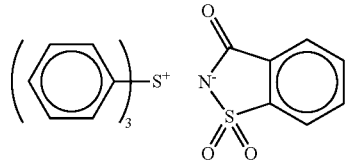
(z23) 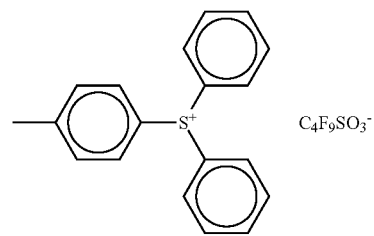
(z24) 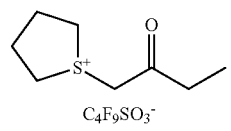
(z25) 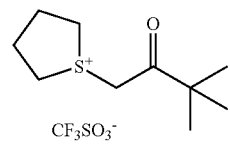
(z26) 
(z27) 
(z28) 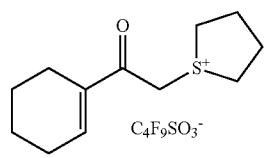
(z29) 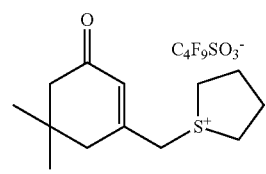
(z30) 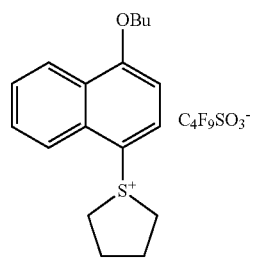
(z31) 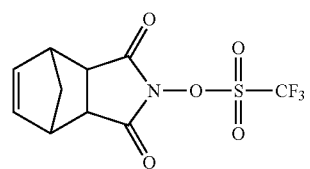
(z32) 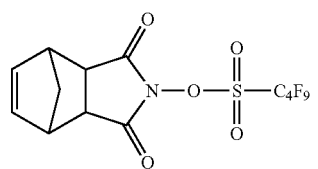

-continued
(z33) 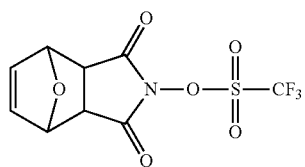
(z34) 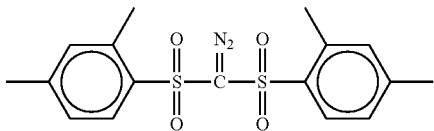
(z35) 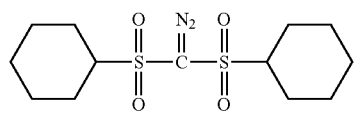
(z36) 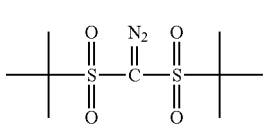
(z37) 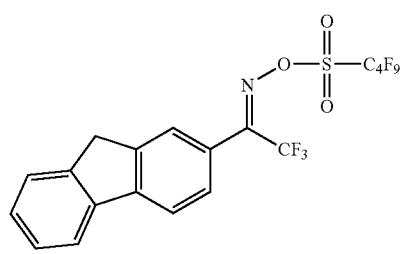
(z38) 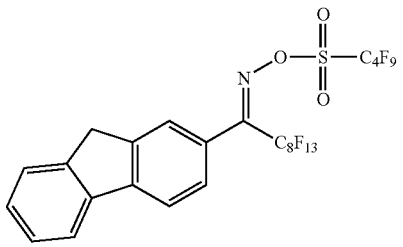
(z39) 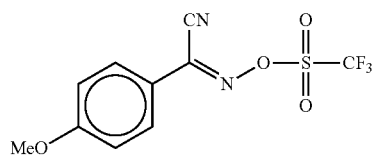
(z40) 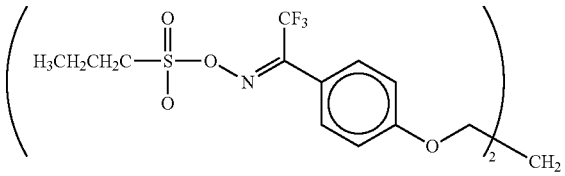
(z41) 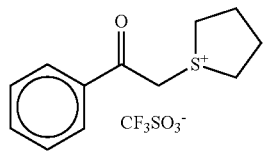
(z42) 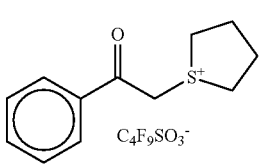
(z43) 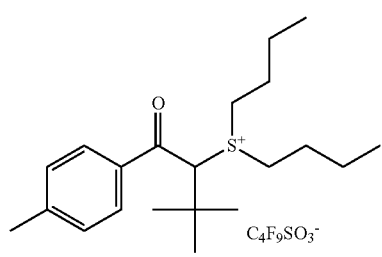
(z44) 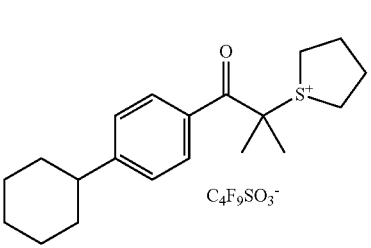
(z45) 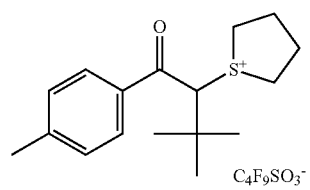
(z46) 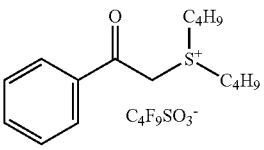
(z47) 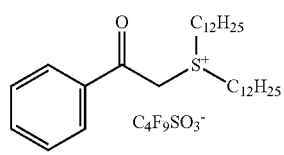
(z48) 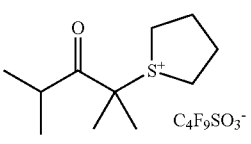

-continued
(z49)
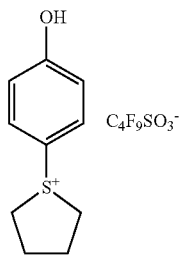
(z50)
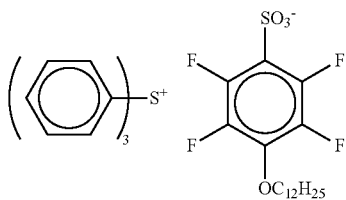
(z51)
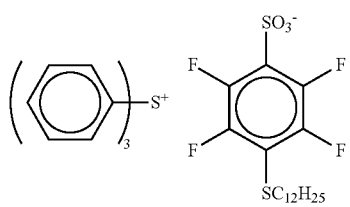
(z52)
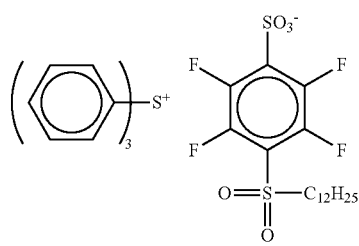
(z53)
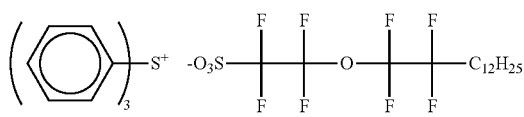
(z54)
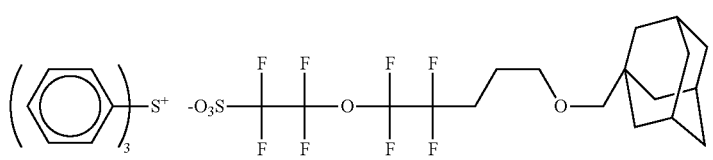
(z55)
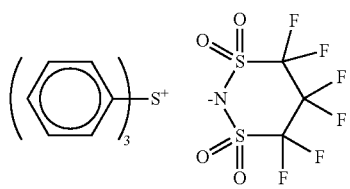
(z56)
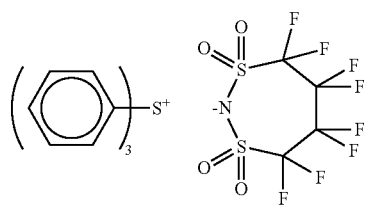
(z57)
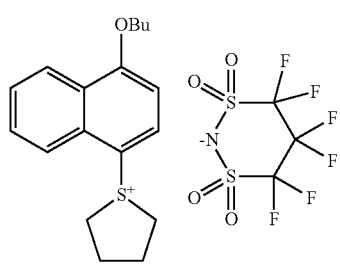
(z58)
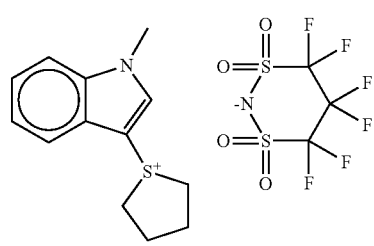
(z59)
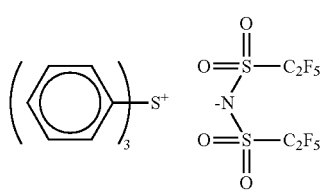
(z60)
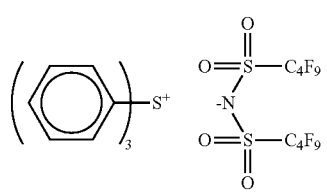

-continued
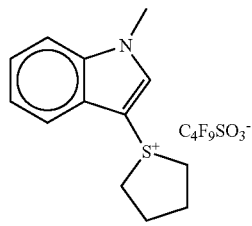
(z61)
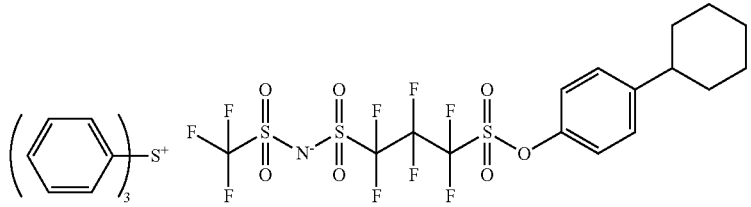
(z62)
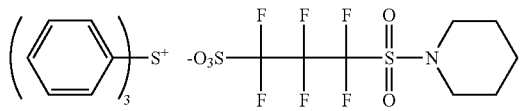
(z63)
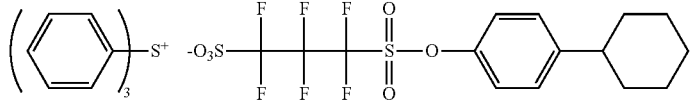
(z64)
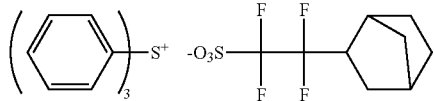
(z65)
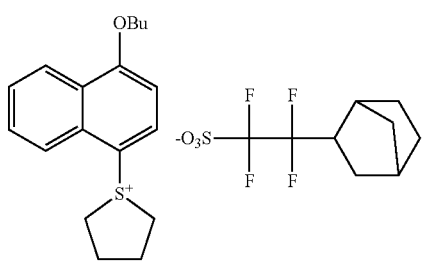
(z66)
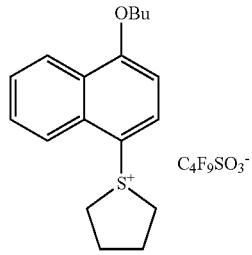
(z67)
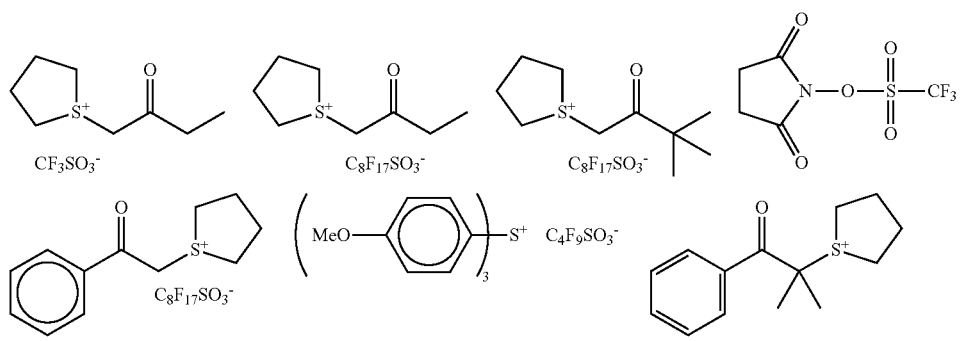

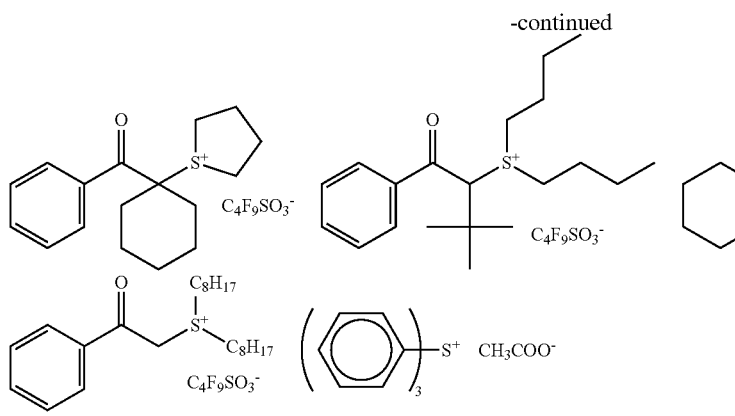

The acid generator can be used singly or in combination of two or more kinds thereof. In using a combination of two or more kinds of acid generators, it is preferred to combine compounds capable of generating two kinds of organic acids which are different from each other in the total number of atoms exclusive of a hydrogen atom by two or more.

The content of the acid generator in the composition is preferably from 0.1 to 20% by weight, more preferably from 0.5 to 10% by weight, and further preferably from 1 to 7% by weight on the basis of the whole of solids of the positive photosensitive composition.

The respective components which the positive photosensitive composition (composition A) containing the resin (A) according to the invention properly contains are hereunder described. Meanwhile, in the positive photosensitive composition (composition A 1) including the resin (A 1) preferred as the resin (A), the representative components is the same as those enumerated in the composition A.

[4] Resin (B2) not Containing a Group which is Decomposed by the Action of an Acid:

The positive composition of the invention may contain a resin (B2) not containing a group which is decomposed by the action of an acid.

The terms "not containing a group which is decomposed by the action of an acid" as referred to herein mean that the positive photosensitive composition of the invention does not contain a group which does not have or is extremely small in decomposability by the action of an acid in a usually employed image forming process and substantially contributes to the image formation due to acid decomposition. Examples of such a resin include a resin containing an alkali-soluble group and a resin containing a group which is decomposed by the action of an alkali and whose dissolution properties in an alkaline developing solution are improved.

As the subject resin, a resin containing at least one kind of a repeating unit selected from a repeating unit derived from (meth)acrylic acid derivatives and a repeating unit derived from alicyclic olefin derivatives is preferable.

As the alkali-soluble group which is contained in the subject resin, a carboxyl group, a phenolic hydroxyl group, an aliphatic hydroxyl group substituted with an electron withdrawing group at the 1- or 2-position thereof, an amino group substituted with an electron withdrawing group (for example, a sulfonamide group, a sulfonimide group, and a bissulfonylimide group), and a methylene group or a methine group each substituted with an electron withdrawing group (for example, a methylene group or a methine group each substituted with at least two groups selected from a ketone group and an ester group) are preferable.

The group to be contained in the resin (B2), which is decomposed by the action of an alkali and whose solubility in an alkaline developing solution increases, is preferably a lactone group or an acid anhydride group, and more preferably a lactone group.

The resin (B2) may contain other repeating unit than those described above. As other repeating unit, a suitable functional group can be introduced while taking into account resistance to dry etching, hydrophilicity/hydrophobicity, mutual action properties, and so on.

Examples of other repeating unit include a repeating unit containing a polar function group (for example, a hydroxyl group, a cyano group, a carbonyl group, and an ester group), a repeating unit having a monocyclic or polycyclic hydrocarbon structure, and a repeating unit containing a silicon atom, a halogen atom or a fluoroalkyl group or a repeating unit containing a plural number of these functional groups.

Specific examples of the preferred resin (B2) are given below, but it should not be construed that the invention is limited thereto.

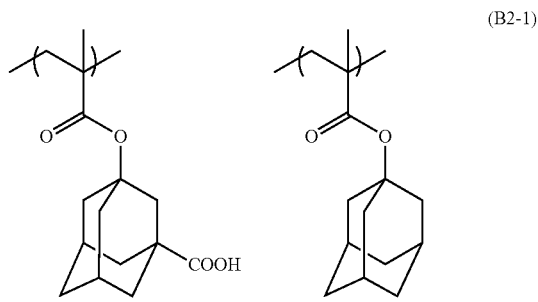

(B2-1)

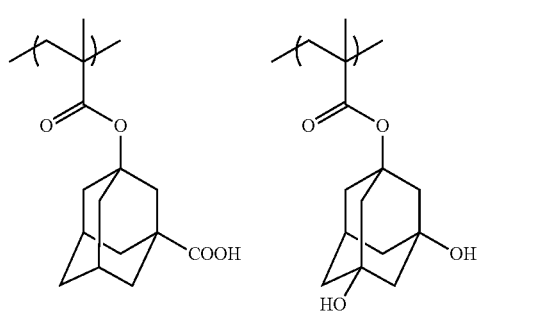

(B2-2)

(B2-3)

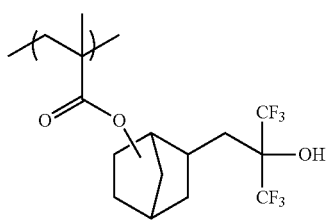

(B2-4)

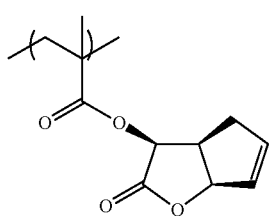

(B2-5)

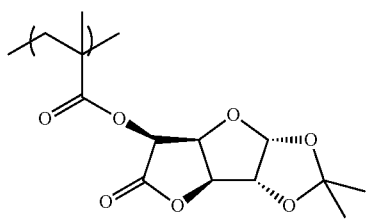

(B2-6)

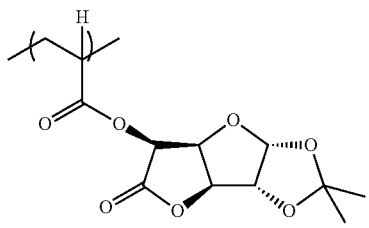

(B2-7)

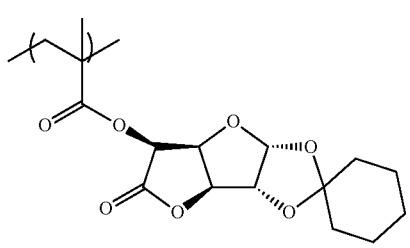

(B2-8)

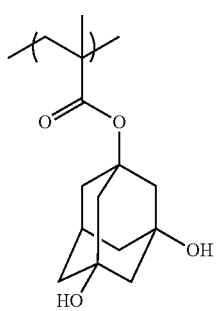

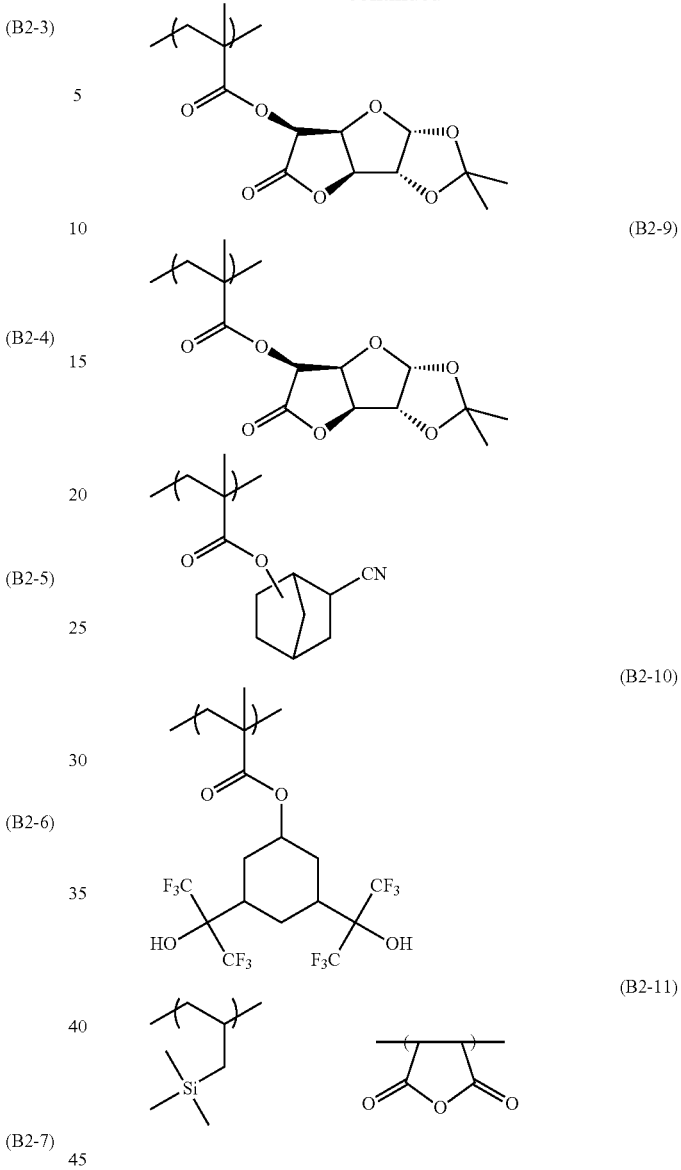

The amount of addition of the resin (B2) is generally from 0 to 50% by weight, preferably from 0 to 30% by weight, and more preferably from 0 to 20% by weight based on the resin (A).

[5] Dissolution Controlling Compound (C) Containing at Least One of an Alkali-soluble Group, a Hydrophilic Group and an Acid Decomposable Group and Having a Molecular Weight of Not More than 3,000:

In the positive photosensitive composition of the invention, a dissolution controlling compound containing at least one of an alkali-soluble group, a hydrophilic group and an acid decomposable group (a group which is decomposed by the action of an acid to release an alkali-soluble group or a hydrophilic group) and having a molecular weight of not more than 3,000 (hereinafter referred to as "component (C)" or "dissolution controlling compound") may be added.

As the dissolution controlling compound, a compound containing an alkali-soluble group (for example, a carboxyl group, a sulfonylimide group, and a hydroxyl group substituted with a fluoroalkyl group at the α-position thereof), a compound containing a hydroxyl group or a hydrophilic group (for example, a lactone group, a cyano group, an amide group, a pyrrolidone group, and a sulfonamide group), and a compound containing an acid decomposable group are preferable. As the acid decomposable group, a group in which a carboxyl group or a hydroxyl group is protected by an acid decomposable protective group is preferable. As the dissolution controlling compound, for the purpose of not lowering the transmissibility at not more than 220 nm, it is preferred to use an aromatic ring-free compound or to use an aromatic ring-containing compound in an amount of addition of not more than 20% by weight based on the solids of the composition.

Preferred examples of the dissolution controlling compound include carboxylic acid compounds having an alicyclic hydrocarbon structure such as adamantane (di)-carboxylic acid, norbornane carboxylic acid, and cholic acid or compounds obtainable by protection of the carboxylic acid thereof by an acid decomposable protective group; and polyols such as sugars or compounds obtainable by protection of the hydroxyl group thereof by an acid decomposable protective group.

A molecular weight of the dissolution controlling compound in the invention is not more than 3,000, preferably from 300 to 3,000, and more preferably from 500 to 2,500.

The amount of addition of the dissolution controlling compound is preferably from 3 to 40% by weight, and more preferably from 5 to 20% by weight based on the solids of the positive photosensitive composition.

Specific examples of the dissolution controlling compound are given below, but it should not be construed that the invention is limited thereto.

TE-1
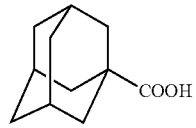

TE-2
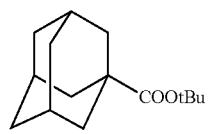

TE-3
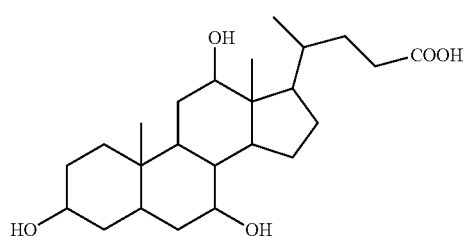

TE-4
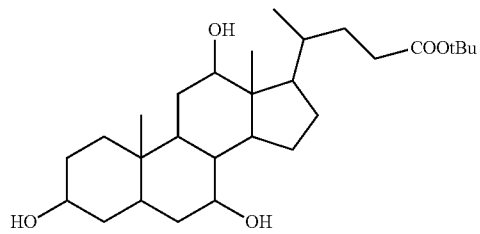

-continued

TE-5
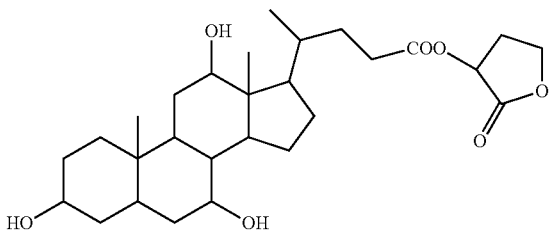

TE-6
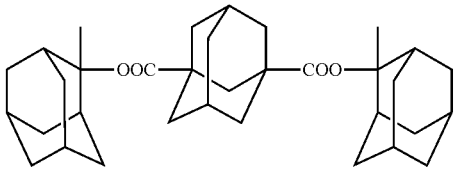

TE-7
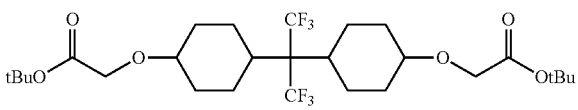

TE-8
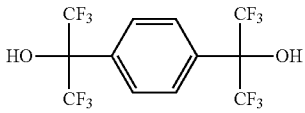

TE-9
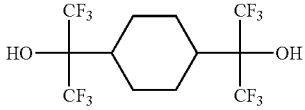

TE-10
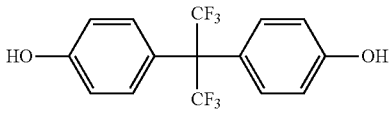

TE-11
HO—(CH$_2$)$_{12}$—OH

TE-12
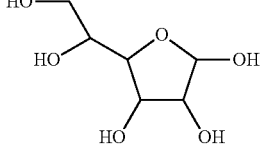

TE-13
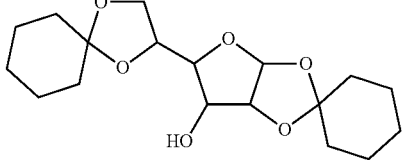

TE-14
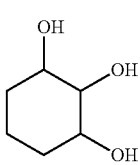

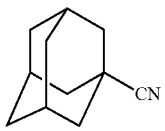

TE-15

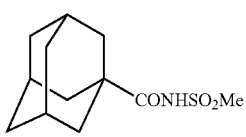

TE-16

[6] Basic Compound (D):

For the purpose of reducing changes in performance with a lapse of time of from exposure to heating or controlling diffusibility of an acid generated by exposure into a layer, it is preferable that a basic compound is contained in the positive photosensitive composition of the invention.

Examples of the basic compound which can be used include a nitrogen-containing basic compound and an onium salt compound.

With respect to the nitrogen-containing basic compound structure, compounds having a partial structure represented by any one of the following general formulae (A) to (E) can be preferably enumerated.

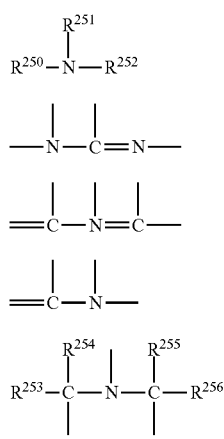

In the general formula (A), $R^{250}$, $R^{251}$ and $R^{252}$ each independently represents a hydrogen atom, an alkyl group having from 1 to 20 carbon atoms, a cycloalkyl group having from 3 to 20 carbon atoms, or an aryl group having from 6 to 20 carbon atoms; and $R^{250}$ and $R^{251}$ may be taken together to form a ring. Such a group may contain a substituent. As the substituted alkyl group or cycloalkyl group, an aminoalkyl group having from 1 to 20 carbon atoms, an aminocycloalkyl group having from 3 to 20 carbon atoms, a hydroxyalkyl group having from 1 to 20 carbon atoms, and a hydroxycycloalkyl group having from 3 to 20 carbon atoms are preferable.

Furthermore, these groups may contain an oxygen atom, a sulfur atom, or a nitrogen atom in the alkyl chain thereof.

In general formula (E), $R^{253}$, $R^{254}$, $R^{255}$ and $R^{256}$ each independently represents an alkyl group having from 1 to 6 carbon atoms or a cycloalkyl group having from 3 to 6 carbon atoms.

Preferred examples of the compound include guanidine, aminopyrrolidine, pyrazole, pyrazoline, piperazine, aminomorpholine, aminoalkyl morpholines, and piperidine; and these compounds may contain a substituent. More preferred examples of such a compound include compounds having an imidazole structure, a diazabicyclo structure, an onium hydroxide structure, an onium carboxylate structure, a trialkylamine structure, an aniline structure, or a pyridine structure; alkylamine derivatives containing a hydroxyl group and/or an ether bond; and aniline derivatives containing a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-di-azabicyclo[4,3,0]non-5-ene, and 1,8-diazabicyclo[5,4,0]undec-7-ene. Examples of the compound having an onium hydroxide structure include triarylsulfonium hydroxides, phenacylsulfonium hydroxides, and sulfonium hydroxides containing a 2-oxoalkyl group; and specific examples thereof include triphenylsulfonium hydroxide, tris(t-butylphenyl)sulfonium hydroxide, bis(t-butylphenyl)iodonium hydroxide, phenacylthiophenium hydroxide, and 2-oxopropylthiophenium hydroxide. Examples of the compound having an onium carboxylate structure include compounds in which an anion moiety of a compound having an onium hydroxide structure is replaced by a carboxylate, for example, acetate, adamantane-1-carboxylate, and a perfluoroalkyl carboxylate. Examples of the compound having a trialkylamine structure include tri(n-butyl)amine and tri(n-octyl)amine. Examples of the aniline compound include 2,6-diiopropylaniline and N,N-dimethylaniline. Examples of the alkylamine derivative containing a hydroxyl group and/or an ether bond include ethanolamine, diethanolamine, triethanolamine, and tris(methoxyethoxyethyl)amine. Examples of the aniline derivative containing a hydroxyl group and/or an ether bond include N,N-bis(hydroxyethyl)aniline.

Such a basic compound is used singly or in admixture of two or more kinds thereof. The amount of the basic compound to be used is usually from 0.001 to 10% by weight, and preferably from 0.01 to 5% by weight based on the solids of the positive photosensitive composition. For the purpose of obtaining a sufficient addition effect, the amount of the basic compound to be used is preferably 0.001% by weight or more; and the amount of the basic compound to be used is preferably not more than 10% by weight in view of sensitivity and developability of a non-exposed area.

[7] Fluorine and/or Silicon Based Surfactant (E):

It is preferable that the positive photosensitive composition of the invention further contains any one or two or more kinds of fluorine and/or silicon based surfactants (for example, fluorine based surfactants, silicon based surfactants, and surfactants containing both a fluorine atom and a silicon atom).

When the positive photosensitive composition of the invention contains a fluorine and/or silicon based surfactant, it is possible to provide a resist pattern which has good sensitivity and resolution and improved adhesion and is less in development defects at the time of using an exposure light source of not more than 250 nm, and especially not more than 220 nm.

Examples of such a fluorine and/or silicon based surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. The following commercially available surfactants can also be used as they are.

Examples the commercially available surfactant which can be used include fluorine based surfactants or silicon based surfactants such as EFTOP EF301 and EFTOP EF303 (manufactured by Shin Akita Kasei Co., Ltd.), FLUORAD FC430 and FLUORAD FC431 (manufactured by Sumitomo 3M Limited), MEGAFAC F171, MEGAFAC F173, MEGAFAC F176, MEGAFAC F189 and MEGAFAC R08 (manufactured by Dainippon Ink and Chemicals, Incorporated), SURFLON S-382, SURFLON SC101, SURFLON SC102, SURFLON SC103, SURFLON SC104, SURFLON SC105 and SURFLON SC106 (manufactured by Asahi Glass Co., Ltd.), and TROYSOL S-366 (manufactured by Troy Chemical Corporation). A polysiloxane polymer KP-341 (manufactured by Shin-Etsu Chemical Co., Ltd.) can also be used as the silicon based surfactant.

Furthermore, in addition to the foregoing known surfactants, surfactants containing a fluoro aliphatic group derived from a fluoro aliphatic compound which is produced by a telomerization method (also referred to as "telomer method") or an oligomerization method (also referred to as "oligomer method") can be used. The fluoro aliphatic compound can be synthesized by a method described in JP-A-2002-90991.

As the polymer containing a fluoro aliphatic group, copolymers of a fluoro aliphatic group-containing monomer and a (poly(oxyalkylene)) acrylate and/or a (poly-(oxyalkylene)) methacrylate are preferable; and these monomers may be irregularly distributed or block copolymerized. Furthermore, examples of the poly(oxyalkylene) group include a poly(oxyethylene) group, a poly(oxypropylene) group, and a poly(oxybutylene) group. A unit containing alkylenes having a different chain length from each other within the same chain length such as poly(oxyethylene/oxypropylene/oxy-ethylene block connected body) and poly(oxyethylene/oxypropylene block connected body) may also be used. In addition, the copolymer of a fluoro aliphatic group-containing monomer and a (poly(oxyalkylene)) acrylate (or methacrylate) may be not only a binary copolymer but also a ternary or multi-component copolymer obtainable by simultaneous copolymerization of two or more kinds of different fluoro aliphatic group-containing monomers or two or more kinds of different (poly(oxyalkylene)) acrylates (or methacrylates).

Examples of commercially available surfactants include MEGAFAC F178, MEGAFAC F-470, MEGAFAC F-473, MEGAFAC F-475, MEGAFAC F-476 and MEGAFAC F-472 (manufactured by Dainippon Ink and Chemicals, Incorporated). Further examples of the surfactant include a copolymer of a $C_6F_{13}$ group-containing acrylate (or a methacrylate) and a (poly(oxyalkylene)) acrylate (or methacrylate); a copolymer of a $C_6F_{13}$ group-containing acrylate (or a methacrylate), (poly(oxyethylene)) acrylate (or methacrylate) and (poly(oxypropylene)) acrylate (or methacrylate); a $C_8F_{17}$ group-containing acrylate (or a methacrylate) and a (poly(oxyalkylene)) acrylate (or methacrylate); and a copolymer of a $C_8F_{17}$ group-containing acrylate (or a methacrylate), (poly(oxyethylene)) acrylate (or methacrylate) and (poly(oxypropylene)) acrylate (or methacrylate).

The amount of the fluorine and/or silicon based surfactant to be used is preferably from 0.0001 to 2% by weight, and more preferably from 0.001 to 1% by weight based on the whole amount (excluding the solvent) of the positive photosensitive composition.

[8] Solvent (F):

In the positive photosensitive composition of the invention, the respective components are dissolved in a prescribed solvent and used.

Examples of the solvent which can be used include organic solvents such as ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran.

In the invention, though the solvent may be used singly or in admixture, it is preferred to use a mixed solvent containing two or more kinds of solvents having a different functional group from each other. Thus, the dissolution properties of a raw material increase, whereby not only the generation of particles with a lapse of time can be suppressed, but also a good pattern profile can be obtained. Preferred examples of the functional group which the solvent contains include an ester group, a lactone group, a hydroxyl group, a ketone group, and a carbonate group. As the mixed solvent of solvents having a different functional group from each other, the following mixed solvents (S1) to (S5) are preferable.

(S1) A mixed solvent obtained by mixing a hydroxyl group-containing solvent and a hydroxyl group-free solvent (S2) A mixed solvent obtained by mixing a solvent having an ester structure and a solvent having a ketone structure (S3) A mixed solvent obtained by mixing a solvent having an ester structure and a solvent having a lactone structure (S4) A mixed solvent obtained by mixing a solvent having an ester structure, a solvent having a lactone structure and a hydroxyl group-containing solvent (S5) A mixed solvent obtained by mixing a solvent having an ester structure, a solvent having a carbonate structure and a hydroxyl group-containing solvent Thus, the generation of particles at the time of storing the composition can be reduced, and the generation of a defect at the time of coating can be suppressed.

Examples of the hydroxyl group-containing solvent include ethylene glycol, ethylene glycol monomethyl ether, ethylene glycol monoethyl ether, propylene glycol, propylene glycol monomethyl ether, propylene glycol monoethyl ether, and ethyl lactate. Of these, propylene glycol monomethyl ether and ethyl lactate are especially preferable.

Examples of the hydroxyl group-free solvent include propylene glycol monomethyl ether acetate, ethyl ethoxy propionate, 2-heptanone, γ-butyrolactone, cyclohexanone, butyl acetate, N-methylpyrrolidone, N,N-dimethylacetamide, and dimethyl sulfoxide. Of these, propylene glycol monomethyl ether acetate, ethyl ethoxy propionate, 2-heptanone, γ-butyrolactone, cyclohexanone, and butyl acetate are especially preferable; and propylene glycol monomethyl ether acetate, ethyl ethoxy propionate, 2-heptanone, and cyclohexanone are the most preferable.

Examples of the solvent having a ketone structure include cyclohexanone and 2-heptanone, with cyclohexanone being preferable.

Examples of the solvent having an ester structure include propylene glycol monomethyl ether acetate, ethyl ethoxy propionate, and butyl acetate, with propylene glycol monomethyl ether acetate being preferable.

Examples of the solvent having a lactone structure include γ-butyrolactone.

Examples of the solvent having a carbonate structure include propylene carbonate and ethylene carbonate, with propylene carbonate being preferable.

A mixing ratio (by weight) of the hydroxyl group-containing solvent to the hydroxyl group-free solvent is from 1/99 to 99/1, preferably from 10/90 to 90/10, and more preferably from 20/80 to 60/40. A mixed solvent containing 50% by weight or more of the hydroxyl group-free solvent is especially preferable in view of coating uniformity.

A mixing ratio (by weight) of the solvent having an ester structure to the solvent having a ketone structure is from 1/99 to 99/1, preferably from 10/90 to 90/10, and more preferably from 40/60 to 80/20. A mixed solvent containing 50% by weight or more of the solvent having an ester structure is especially preferable in view of coating uniformity.

A mixing ratio (by weight) of the solvent having an ester structure to the solvent having a latone structure is from 70/30 to 99/1, preferably from 80/20 to 99/1, and more preferably from 90/10 to 99/1. A mixed solvent containing 70% by weight or more of the solvent having an ester structure is especially preferable in view of coating uniformity.

In mixing the solvent having an ester structure, the solvent having a latone structure and the hydroxyl group-containing solvent, it is preferable that the solvent having an ester structure is contained in an amount of from 30 to 80% by weight; that the solvent having a lactone structure is contained in an amount of from 1 to 20% by weight; and that the hydroxyl group-containing solvent is contained in an amount of from 10 to 60% by weight.

In mixing the solvent having an ester structure, the solvent having a carbonate structure and the hydroxyl group-containing solvent, it is preferable that the solvent having an ester structure is contained in an amount of from 30 to 80% by weight; that the solvent having a carbonate structure is contained in an amount of from 1 to 20% by weight; and that the hydroxyl group-containing solvent is contained in an amount of from 10 to 60% by weight.

A preferred embodiment of such a solvent is a solvent containing an alkylene glycol monoalkyl ether carboxylate (preferably propylene glycol monomethyl ether acetate), and more preferably a mixed solvent of an alkylene glycol monoalkyl ether carboxylate and other solvent. In this case, other solvent is at least one kind of a solvent selected from solvents containing at least one functional group selected from a hydroxyl group, a ketone group, a lactone group, an ester group, an ether group, and a carbonate group. The mixed solvent is especially preferably a mixed solvent of at least one member selected from ethyl lactate, γ-butyrolactone, propylene glycol monomethyl ether, butyl acetate and cyclohexanone and propylene glycol monomethyl ether acetate.

By selecting an optimum solvent, the development defect performance can be improved.

[9] Other Additives:

In the positive photosensitive composition of the invention, a dye, a plasticizer, a surfactant other than the foregoing component (E), a photosensitizer, and a compound capable of promoting dissolution properties in a developing solution can be further contained as the need arises.

The compound capable of promoting dissolution properties in a developing solution which can be used in the invention is a low molecular weight compound containing two or more phenolic OH groups or one or more carboxyl groups and having a molecular weight of not more than 1,000. In the case of containing a carboxyl group, an alicyclic or aliphatic compound is preferable.

The amount of addition of such a compound capable of promoting dissolution properties is preferably 2 to 50% by weight, and more preferably from 5 to 30% by weight based on the component (B). It is preferable that the amount of addition of the compound capable of promoting dissolution properties is not more than 50% by weight in view of suppressing development residue and preventing pattern deformation at the time of development.

Such a phenol compound having a molecular weight of not more than 1,000 can be easily synthesized by those skilled in the art while referring to descriptions of, for example, JP-A-4-122938, JP-A-2-28531, U.S. Pat. No. 4,916,210, and European Patent No. 219,294.

Specific examples of the carboxyl group-containing alicyclic or aliphatic compound include carboxylic acid derivatives having a steroid structure such as cholic acid, deoxycholic acid, and lithocholic acid, adamantane carboxylic acid derivatives, adamantane dicarboxylic acid, cyclohexanecarboxylic acid, and cyclohexanedicarboxylic acid. However, it should not be construed that the invention is limited thereto.

In the invention, other surfactant than the foregoing fluorine and/or silicon based surfactant (E) can also be added. Specific examples of such a surfactant include nonionic surfactants such as polyoxyethylene alkyl ethers, polyoxyethylene alkylaryl ethers, polyoxyethylene/polyoxypropylene block copolymers, sorbitan aliphatic esters, and polyoxyethylene sorbitan aliphatic esters.

Such a surfactant may be used singly or may be added in combination of some kinds thereof.

[10] Positive Photosensitive Composition A2 Containing a Resin (A2):

In the positive photosensitive composition A2 containing the resin (A2), though the respective components can be used as enumerated in the foregoing composition A, adding the following components is preferable.

With regard to the component A2, it is preferable that the foregoing basic compound (C) is contained.

(D) Dissolution inhibiting compound having a molecular weight not more than 3,000, which is decomposed by the action of an acid, whereby its solubility in an alkaline developing solution increases (hereinafter also referred to as "dissolution inhibitor"):

It is preferable that the composition A2 contains a dissolution inhibiting compound having a molecular weight not more than 3,000, which is decomposed by the action of an acid, whereby its solubility in an alkaline developing solution increases (hereinafter also referred to as "dissolution inhibitor").

For the purpose of not lowering the transmissibility at not more than 220 nm, the dissolution inhibitor is preferably an acid decomposable group-containing alicyclic or aliphatic compound such as acid decomposable group-containing cholic acid derivatives described in *Proceeding of SPIE*, 2724, 355 (1996). As the acid decomposable group and the alicyclic structure, ones the same as described above in the resin (A2) can be enumerated.

A molecular weight of the dissolution inhibitor in the invention is not more than 3,000, preferably from 300 to 3,000, and more preferably from 500 to 2,500.

The amount of addition of the dissolution inhibitor is preferably from 1 to 30% by weight, and more preferably from 2 to 20% by weight based on the whole of solids of the composition A2.

Specific examples of the dissolution inhibitor are given below, but it should not be construed that the invention is limited thereto.

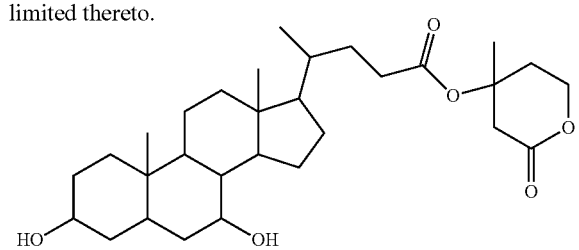

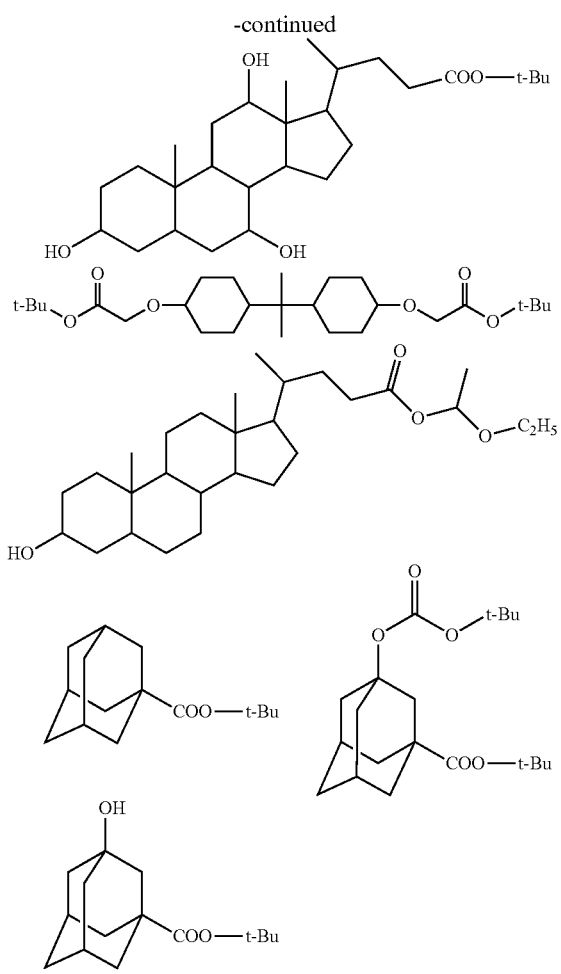

(E) Surfactant:

It is preferable that the composition A2 further contains a surfactant (E). It is more preferable that the composition A2 contains any one or two or more kinds of fluorine based and/or silicon based surfactants (for example, fluorine based surfactants, silicon based surfactants, and surfactants containing both a fluorine atom and a silicon atom).

When the composition A2 contains the foregoing surfactant (E), it is possible to provide a resist pattern which has good sensitivity and resolution and improved adhesion and is less in development defects at the time of using an exposure light source of not more than 250 nm, and especially not more than 220 nm.

Examples of such a fluorine based and/or silicon based surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. The following commercially available surfactants can also be used as they are.

Examples the commercially available surfactant which can be used include fluorine based surfactants or silicon based surfactants such as EFTOP EF301 and EFTOP EF303 (manufactured by Shin Akita Kasei Co., Ltd.), FLUORAD FC430, FLUORAD FC431 and FLUORAD 4430 (manufactured by Sumitomo 3M Limited), MEGAFAC F171, MEGAFAC F173, MEGAFAC F176, MEGAFAC F189, MEGAFAC F113, MEGAFAC F110, MEGAFAC F177, MEGAFAC F120 and MEGAFAC R08 (manufactured by Dainippon Ink and Chemicals, Incorporated), SURFLON S-382, SURFLON SC101, SURFLON SC102, SURFLON SC103, SURFLON SC104, SURFLON SC105 and SURFLON SC106 (manufactured by Asahi Glass Co., Ltd.), TROYSOL S-366 (manufactured by Troy Chemical Corporation), GF-300 and GF-150 (manufactured by Toagosei Co., Ltd.), SURFLON S-393 (manufactured by Seimi Chemical Co., Ltd.), EFTOP EF121, EFTOP EF122A, EFTOP EF122B, EFTOP RF122C, EFTOP EF125M, EFTOP EF135M, EFTOP EF351, EFTOP EF 352, EFTOP EF801, EFTOP EF802 and EFTOP EF601 (manufactured by Jemco Inc.), PF636, PF656, PF632 and PF6520 (manufactured by OMNIVA), and FTX-204D, FTX-208G, FTX-218G, FTX-230G, FTX-204D, FTX-208D, FTX-212D, FTX-218 and FTX-222D (manufactured by Neos Co., Ltd.). A polysiloxane polymer KP-341 (manufactured by Shin-Etsu Chemical Co., Ltd.) can also be used as the silicon based surfactant.

Furthermore, in addition to the foregoing known surfactants, surfactants containing a fluoro aliphatic group derived from a fluoro aliphatic compound which is produced by a telomerization method (also referred to as "telomer method") or an oligomerization method (also referred to as "oligomer method") can be used. The fluoro aliphatic compound can be synthesized by a method described in JP-A-2002-90991.

As the polymer containing a fluoro aliphatic group, copolymers of a fluoro aliphatic group-containing monomer and a (poly(oxyalkylene)) acrylate and/or a (poly-(oxyalkylene)) methacrylate are preferable; and these monomers may be irregularly distributed or block copolymerized. Furthermore, examples of the poly(oxyalkylene) group include a poly(oxyethylene) group, a poly(oxypropylene) group, and a poly-(oxybutylene) group. A unit containing alkylenes having a different chain length from each other within the same chain length such as poly(oxyethylene/oxypropylene/oxy-ethylene block connected body) and poly(oxyethylene/oxypropylene block connected body) may also be used. In addition, the copolymer of a fluoro aliphatic group-containing monomer and a (poly(oxyalkylene)) acrylate (or methacrylate) may be not only a binary copolymer but also a ternary or multi-component copolymer obtainable by simultaneous copolymerization of two or more kinds of different fluoro aliphatic group-containing monomers or two or more kinds of different (poly(oxyalkylene)) acrylates (or methacrylates).

Examples of commercially available surfactants include MEGAFAC F178, MEGAFAC F-470, MEGAFAC F-473, MEGAFAC F-475, MEGAFAC F-476 and MEGAFAC F-472 (manufactured by Dainippon Ink and Chemicals, Incorporated). Further examples of the surfactant include a copolymer of a $C_6F_{13}$ group-containing acrylate (or a methacrylate) and a (poly(oxyalkylene)) acrylate (or methacrylate); and a copolymer of a $C_3F_7$ group-containing acrylate (or a methacrylate), (poly(oxyethylene)) acrylate (or methacrylate) and (poly(oxypropylene)) acrylate (or methacrylate).

Furthermore, other surfactant than the fluorine based and/or silicon based surfactant can also be used in the invention. Specific examples thereof include nonionic surfactants such as polyoxyethylene alkyl ethers (for example, polyoxyethylene lauryl ether, polyoxyethylene stearyl ether, polyoxyethylene cetyl ether, and polyoxyethylene oleyl ether), polyoxyethylene alkylaryl ethers (for example, poly-oxyethylene octylphenyl ether and polyoxyethylene nonylphenyl ether) polyoxy-ethylene/polyoxypropylene block copolymers, sorbitan fatty acid esters (for example, sorbitan monolaurate, sorbitan monopalmitate, sorbitan monostearate, sorbitan monooleate, sorbitan trioleate, and sorbitan tristearate), and polyoxyethylene sorbitan fatty acid esters (for example, polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate).

Such a surfactant may be used singly or may be used in combination of some kinds thereof.

The amount of the surfactant (E) to be used is preferably from 0.01 to 10% by weight, and more preferably from 0.1 to 5% by weight based on the whole amount (excluding the solvent) of the composition A2.

(F) Organic Solvent:

Examples of a solvent which can be used in dissolving the foregoing respective components therein to prepare the composition A2 include an alkylene glycol monoalkyl ether carboxylate, an alkylene glycol monoalkyl ether, a lactic acid alkyl ether, an alkyl alkoxypropionate, a cyclic lactone having from 4 to 10 carbon atoms, a monoketone compound which may contain a ring having from 4 to 10 carbon atoms, an alkylene carbonate, an alkyl alkoxyacetate, and an alkyl pyruvate.

Preferred examples of the alkylene glycol monoalkyl ether carboxylate include propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, and ethylene glycol monoethyl ether acetate.

Preferred examples of the alkylene glycol monoalkyl ether include propylene glycol monomethyl ether, propylene glycol monoethyl ether, propylene glycol monopropyl ether, propylene glycol monobutyl ether, ethylene glycol monomethyl ether, and ethylene glycol monoethyl ether.

Preferred examples of the lactic acid alkyl ester include methyl lactate, ethyl lactate, propyl lactate, and butyl lactate.

Preferred examples of the alkyl alkoxypropionate include ethyl 3-ethoxypropionate, methyl 3-methoxypropionate, methyl 3-ethoxypropionate, and ethyl 3-methoxypropionate.

Preferred examples of the cyclic lactone having from 4 to 10 carbon atoms include β-propiolactone, β-butyrolactone, γ-butyrolactone, α-methyl-γ-butyrolactone, β-methyl-γ-butyrolactone, γ-valerolactone, γ-caprolactone, γ-octanoic lactone, and α-hydroxy-γ-butyrolatone.

Preferred examples of the ketone compound which may contain a ring having from 4 to 10 carbon atoms include 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexecen-2-one, 3-penten-2-one, cyclopentanone, 2-methylcyclopentanone, 3-methylcyclopentanone, 2,2-dimethyl-cyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cyclo-heptanone, 2-methylcycloheptanone, and 3-methylcycloheptanone.

Preferred examples of the alkylene carbonate include propylene carbonate, vinylene carbonate, ethylene carbonate, and butylene carbonate.

Preferred examples of the alkyl alkoxyacetate include 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate.

Preferred examples of the alkyl pyruvate include methyl pyruvate, ethyl pyruvate, and propyl pyruvate.

Examples of the solvent which can be preferably used include solvents having a boiling point of 130° C. or higher at the ordinary temperature under an atmospheric pressure. Specific examples thereof include cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate.

In the invention, the foregoing solvent may be used singly or in combination of two or more kinds thereof.

In the invention, a mixed solvent of a solvent containing a hydroxyl group in a structure thereof and a hydroxyl group-free solvent may be used as the organic solvent.

Examples of the hydroxyl group-containing solvent include ethylene glycol, ethylene glycol monomethyl ether, ethylene glycol monoethyl ether, propylene glycol, propylene glycol monomethyl ether, propylene glycol monoethyl ether, and ethyl lactate. Of these, propylene glycol monomethyl ether and ethyl lactate are especially preferable.

Examples of the hydroxyl group-free solvent include propylene glycol monomethyl ether acetate, ethyl ethoxy propionate, 2-heptanone, γ-butyrolactone, cyclohexanone, butyl acetate, N-methylpyrrolidone, N,N-dimethylacetamide, and dimethyl sulfoxide. Of these, propylene glycol monomethyl ether acetate, ethyl ethoxy propionate, 2-heptanone, γ-butyrolactone, cyclohexanone, and butyl acetate are especially preferable; and propylene glycol monomethyl ether acetate, ethyl ethoxy propionate, and 2-heptanone are the most preferable.

A mixing ratio (by weight) of the hydroxyl group-containing solvent to the hydroxyl group-free solvent is from 1/99 to 99/1, preferably from 10/90 to 90/10, and more preferably from 20/80 to 60/40. A mixed solvent containing 50% by weight or more of the hydroxyl group-free solvent is especially preferable in view of coating uniformity.

(G) Alkali-soluble Resin:

The composition A2 can contain a resin (G) which does not contain an acid decomposable group and which is insoluble in water and soluble in an alkaline developing solution, whereby the sensitivity is improved.

In the invention, a novolak resin having a molecular weight of from about 1,000 to 20,000 and a polyhydroxystyrene derivative having a molecular weight of from about 3,000 to 50,000 can be used as such an alkali-soluble resin. Since such a resin has large absorption against light of not more than 250 nm, it is preferable that the resin is used upon being partially hydrogenated or used in an amount of not more than 30% by weight of the whole amount of the resin.

A resin containing a carboxyl group as the alkali-soluble group can also be used. For the purpose of improving the resistance to dry etching, it is preferable that the carboxyl group-containing resin contains a monocyclic or polycyclic alicyclic hydrocarbon group. Specific examples thereof include copolymers of a methacrylic ester having an alicyclic hydrocarbon structure which does not exhibit acid de-composability and (meth)acrylic acid and resins of a (meth) acrylic ester of an alicyclic hydrocarbon group containing a carboxyl group at the terminal thereof.

(H) Carboxylic Acid Onium Salt:

The composition A2 may contain a carboxylic acid onium salt (H). Examples of the carboxylic acid onium salt include a carboxylic acid sulfonium slat, a carboxylic acid iodonium salt, and a carboxylic acid ammonium salt. As the carboxylic acid onium salt (H), an iodonium salt and a sulfonium salt are especially preferable. In addition, it is preferable that the carboxylate residue of the carboxylic acid onium salt (H) of the invention does not contain an aromatic group or a carbon-carbon double bond. An especially preferred anion moiety is an anion of a linear, branched, monocyclic or polycyclic alkyl carbonate having from 1 to 30 carbon atoms. In addition, an anion of such a carboxylic acid in which a part or all of the alkyl groups thereof are substituted with a fluorine atom is more preferable. Thus, the transparency against light of not more than 220 nm is ensured, the sensitivity and the resolving power are improved, and the roughness and fineness dependency and the exposure margin are improved.

Examples of the fluorine-substituted carboxylic acid anion include anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, and 2,2-bistrifluoro-methylpropionic acid.

Such a carboxylic acid onium salt (H) can be synthesized by reacting sulfonium hydroxide, iodonium hydroxide or ammonium hydroxide and a carboxylic acid with silver oxide in a suitable solvent.

The content of the carboxylic acid onium salt (H) in the composition A2 is suitably from 0.1 to 20% by weight, preferably from 0.5 to 10% by weight, and more preferably from 1 to 7% by weight based on the whole of solids of the composition A2.

(Other Additives)

In the composition A2, a dye, a light absorber, a plasticizer, a photosensitizer, and a compound capable of promoting dissolution properties in a developing solution can be further contained as the need arises.

The compound capable of promoting dissolution properties in a developing solution which can be used in the invention is a low molecular weight compound containing two or more phenolic OH groups or one or more carboxyl groups and having a molecular weight of not more than 1,000. In the case of containing a carboxyl group, an alicyclic or aliphatic compound is preferable. A compound capable of generating a hydroxyl group or a carboxyl group upon reaction with an acid is also preferable.

The amount of addition of such a solvent capable of promoting dissolution properties is preferably 2 to 50% by weight, and more preferably from 5 to 30% by weight based on the resin of the resin (A2). It is preferable that the amount of addition of such a solvent capable of promoting dissolution properties is not more than 50% by weight in view of suppressing development residue and preventing pattern deformation at the time of development.

Such a phenol compound having a molecular weight of not more than 1,000 can be easily synthesized by those skilled in the art while referring to descriptions of, for example, JP-A-4-122938, JP-A-2-28531, U.S. Pat. No. 4,916,210, and European Patent No. 219,294.

Specific examples of the carboxyl group-containing alicyclic or aliphatic compound include carboxylic acid derivatives having a steroid structure such as cholic acid, deoxycholic acid, and lithocholic acid, adamantane carboxylic acid derivatives, adamantane dicarboxylic acid, cyclohexanecarboxylic acid, and cyclohexanedicarboxylic acid. However, it should not be construed that the invention is limited thereto.

As the plasticizer, in addition to commercially available plasticizers, a compound having a molecular weight of not more than 1,000, which is compatible with the polymer to be used and which has an effect for dropping a softening point of the layer, may be used without particular restrictions. The molecular weight of such a compound is preferably not more than 750, and more preferably not more than 500 from the viewpoint of compatibility. A compound having a boiling point under an atmospheric pressure of 300° C. or higher and having a melting point of not higher than 20° C. is preferable. Specific examples thereof include diisobutyl phthalate, tricresyl phosphate, triethylene glycol diphenyl ether, diethylene glycol dibenzoate, and triethylene glycol diacetate.

As the light absorber, a compound which has absorption in an exposure wavelength and which does not generate an acid upon exposure can be used without particular restrictions. When the wavelength of a light source is 193 nm, an aromatic ring-containing compound is preferable. Specific examples thereof include benzene derivatives, naphthalene derivatives, anthracene derivatives, furan derivatives, thiophene derivatives, and indole derivatives.

(Physical Properties of Resist Composition)

From the viewpoint of improving the resolving power, the composition A2 is preferably used in a thickness of from 30 to 250 nm, and more preferably from 30 to 200 nm. It is possible to make the composition A2 have such a thickness by setting up a solids concentration in the positive photosensitive composition at an appropriate range, thereby improving coating properties and film formation properties.

A concentration of the whole of solids in the composition A2 is generally from 1 to 10% by weight, more preferably from 1 to 8% by weight, and further preferably from 1.0 to 7.0% by weight.

[11] Pattern Forming Method:

The positive photosensitive composition of the invention is used by dissolving the respective components in a prescribed solvent, and preferably the foregoing mixed solvent, filtering the solution by a filter and then coating the filtrate on a prescribed support in the following manner. As the filter which is used for the filtration, a filter made of polytetrafluoroethylene, polyethylene or nylon and having a size of not more than 0.1 microns, more preferably not more than 0.05 microns, and further preferably not more than 0.03 microns is preferable.

For example, the positive photosensitive composition is coated on a substrate which is used for the manufacture of a precision integrated circuit element (for example, a silicon/silicon dioxide coated substrate) by a suitable coating method using a spinner, a coater, etc. and dried to form a photosensitive layer.

The photosensitive layer is irradiated with active rays or radiations through a prescribed mask and preferably after baking (heating), is developed and rinsed. Thus, a good pattern can be obtained.

Examples of the active rays or radiations include infrared rays, visible light, ultraviolet rays, far ultraviolet rays, X-rays, and electron beams. Of these, far ultraviolet rays having a wavelength of not more than 250 nm are preferable, and ultraviolet rays having a wavelength of not more than 220 nm are more preferable. Specific examples thereof include a KrF excimer laser (248 nm), an ArF excimer laser (193 nm), an $F_2$ excimer laser (157 nm), X-rays, and electron beams. Of these, an ArF excimer laser, an $F_2$ excimer laser, EUV (13 nm), and electron beams are preferable.

In the development step, the alkaline developing solution is used in the following manner. Examples of the alkaline developing solution which can be used include alkaline aqueous solutions such as inorganic alkalis (for example, sodium hydroxide, potassium hydroxide, sodium carbonate, sodium silicate, sodium metasilicate, and ammonia water), primary amines (for example, ethylamine and n-propylamine), secondary amines (for example, diethylamine and di-n-butylamine), tertiary amines (for example, triethylamine and methyldiethylamine), alcoholamines (for example, dimethylethanolamine and triethanolamine), quaternary ammonium salts (for example, tetramethylammonium hydroxide and tetraethylammonium hydroxide), and cyclic amines (for example, pyrrole and piperidine).

In addition, suitable amounts of an alcohol and a surfactant can also be added and used in the foregoing alkaline developing solution.

A concentration of the alkali of the alkaline developing solution is usually from 0.1 to 20% by weight.

A pH of the alkaline developing solution is usually from 10.0 to 15.0.

As a rinsing solution, pure water can be used, and a suitable amount of a surfactant can be added and used therein.

Furthermore, the developing solution or rinsing solution attached on a pattern after the development treatment or rinsing treatment can be subjected to a removal treatment by a supercritical fluid.

At the time of irradiation with active rays or radiations, exposure (immersion exposure) may be carried out by filling a liquid (immersion medium) having a refractive index higher than air between a resist layer (photosensitive layer) and a lens. Thus, the resolution properties can be enhanced. Though any liquid having a refractive index higher than air can be used as the immersion medium, pure water is preferable. Furthermore, in order that the immersion medium and the resist layer may not come into direct contact with each other during the immersion exposure, an overcoat layer may be further provided on the resist layer. Thus, elution of the composition from the resist layer into the immersion medium is suppressed, and the development defects are reduced.

An immersion liquid which is used in the immersion exposure is hereunder described.

As the immersion liquid, a liquid which is transparent against the exposure wavelength and which has a temperature coefficient of refractive index as small as possible for the purpose of controlling a strain of an optical image to be projected on the resist in the minimum level is preferable. In particular, when the exposure light source is an ArF excimer laser (wavelength: 193 nm), water is preferably used in view of easiness of availability and easiness of handling in addition to the foregoing viewpoints.

A medium having a refractive index of 1.5 or more can also be used in view of the matter that the refractive index can be further improved. This medium may be an aqueous solution or may be an organic solvent.

When water is used as the immersion liquid, for the purposes of not only reducing a surface tension of water but also increasing a surface-active power, an additive (liquid) which does not dissolve the resist layer on a wafer and whose influences against an optical coat on a lower face of a lens element can be neglected may be added in a little proportion. As such an additive, an aliphatic alcohol having a refractive index substantially equal to water is preferable. Specific examples thereof include methyl alcohol, ethyl alcohol, and isopropyl alcohol. By adding an alcohol having a refractive index substantially equal to water, even when the alcohol component in water is evaporated, whereby the concentration of the alcohol changes, an advantage such that the change in refractive index as the whole liquid can be made extremely small. On the other hand, when an opaque substance against the light of 193 nm or an impurity having a refractive index largely different from water is incorporated, a strain of an optical image to be projected on the resist is generated. Accordingly, the water to be used is preferably distilled water. Pure water obtainable by further filtration of the distilled water through an ion exchanging filter may be used, too.

The water is desired to have an electrical resistance of 18.3 MΩcm or more, is desired to have a TOC (total organic carbon) of not more than 20 ppb and is desired to be water having been subjected to a deaeration treatment.

Furthermore, by increasing the refractive index of the immersion liquid, it is possible to enhance a lithography performance. From such viewpoints, an additive capable of increasing a refractive index may be added in the water, or heavy water ($D_2O$) may be used in place of the water.

In order that the resist layer may not come into direct contact with the immersion liquid, a layer which is sparingly soluble in the immersion liquid (hereinafter referred to as "top coat") may be provided between the resist layer (photosensitive layer) according to the positive composition of the invention and the immersion liquid. Examples of the function necessary as a top coat include coating aptitude for a resist upper layer, transparence against radiations, especially radiations of 193 nm, and sparing solubility in the immersion liquid. It is preferable that the top coat does not mix with the resist and is able to be uniformly coated on the resist upper layer.

With respect to the top coat, from the viewpoint of transparency against radiations of 193 nm, an aromatic ring-free polymer is preferable. Specific examples thereof include hydrocarbon polymers, acrylic ester polymers, polymethacrylic acids, polyacrylic acids, polyvinyl ethers, silicon-containing polymers, and fluorine-containing polymers. From the viewpoint that when an impurity elutes from the top coat into the immersion liquid, it stains an optical lens, it is preferable that the amount of residual monomer components of the polymer contained in the top coat is small.

In stripping the top coat, the developing solution may be used, or a stripper may be separately used. As the stripper, a solvent having low penetration into the resist is preferable. In view of the matter that the stripping step can be carried out simultaneously with the developing treatment step of the resist, it is preferable that stripping can be achieved by the alkaline developing solution. From the viewpoint that stripping is achieved by the alkaline developing solution, it is preferable that the top coat is acidic. However, from the viewpoint of non-intermixing properties with the resist, the top coat may also be neutral or alkaline.

When a difference in refractive index between the top coat and the immersion liquid is small, the resolving power is improved. In an ArF excimer laser (wavelength: 193 nm), when water is used as the immersion liquid, it is preferable that the top coat for ArF immersion exposure has a refractive index closed to that of the immersion liquid. From the viewpoint of making the refractive index of the top coat closed to that of the immersion liquid, it is preferable that the top coat contains a fluorine atom. Furthermore, a thin layer is preferable from the viewpoints of transparency and refractive index.

It is preferable that the top coat does not mix with the resist and does not mix with the immersion liquid. From this viewpoint, when the immersion liquid is water, it is preferable that a solvent of the top coat is a medium which is sparingly soluble in the resist solvent and insoluble in water. In addition, when the immersion liquid is an organic solvent, the top coat may be soluble in water or may be insoluble in water.

It is preferable that when the positive photosensitive composition of the invention is formed into a resist layer, it has a receding contact angle of water against the resist layer of 65° or more. Here, the receding contact angle is one at the ordinary temperature under an atmospheric pressure. The receding contact angle is a receding contact angle when the resist layer is inclined and a droplet starts to drop. In general, the receding contact angle is substantially correlated with a sliding angle, and it is meant that the higher the receding contact angle and the smaller the sliding angle, the better the water repellency is.

EXAMPLES

The invention is hereunder described in detail with reference to the following Examples, but it should not be construed that the invention is limited thereto.

Synthesis Example 1

Synthesis of Resin (RA-1)

8.6 g of cyclohexanone was charged in a three-necked flask and heated at 80° C. under a nitrogen gas stream. A solution of 7.8 g of norbornane lactone methacrylate, 3.5 g of 3-hydroxyadamantyl methacrylate, 8.2 g of 2-methyl-2-adamantyl methacrylate, 2.5 g of cyclohexyl methacrylate and 5% by mole, based on the monomers, of an initiator V-601 (manufactured by Wako Pure Chemical Industries, Ltd.) dissolved in 79 g of cyclohexanone was added dropwise therein over 6 hours. After completion of the dropwise addition, the mixture was further reacted at 80° C. for 2 hours. After allowing the reaction solution to stand for cooling, the resulting reaction solution was added dropwise in a mixed solution of 700 mL of hexane and 300 mL of ethyl acetate over 20 minutes, and a deposited powder was collected by filtration and dried to obtain 19 g of a resin (RA-1). The thus obtained resin had a weight average molecular weight of 10,000 as reduced into standard polystyrene and a degree of dispersion (Mw/Mn) of 1.89.

Other resins were synthesized in the same measure.

A structure, a weight average molecular weight (Mw) and a degree of dispersion (Mw/Mn) of each of resins (RA-1) to (RA-21) and (RX-1) to (RX-4) used in the following Examples and Comparative Examples are shown below.

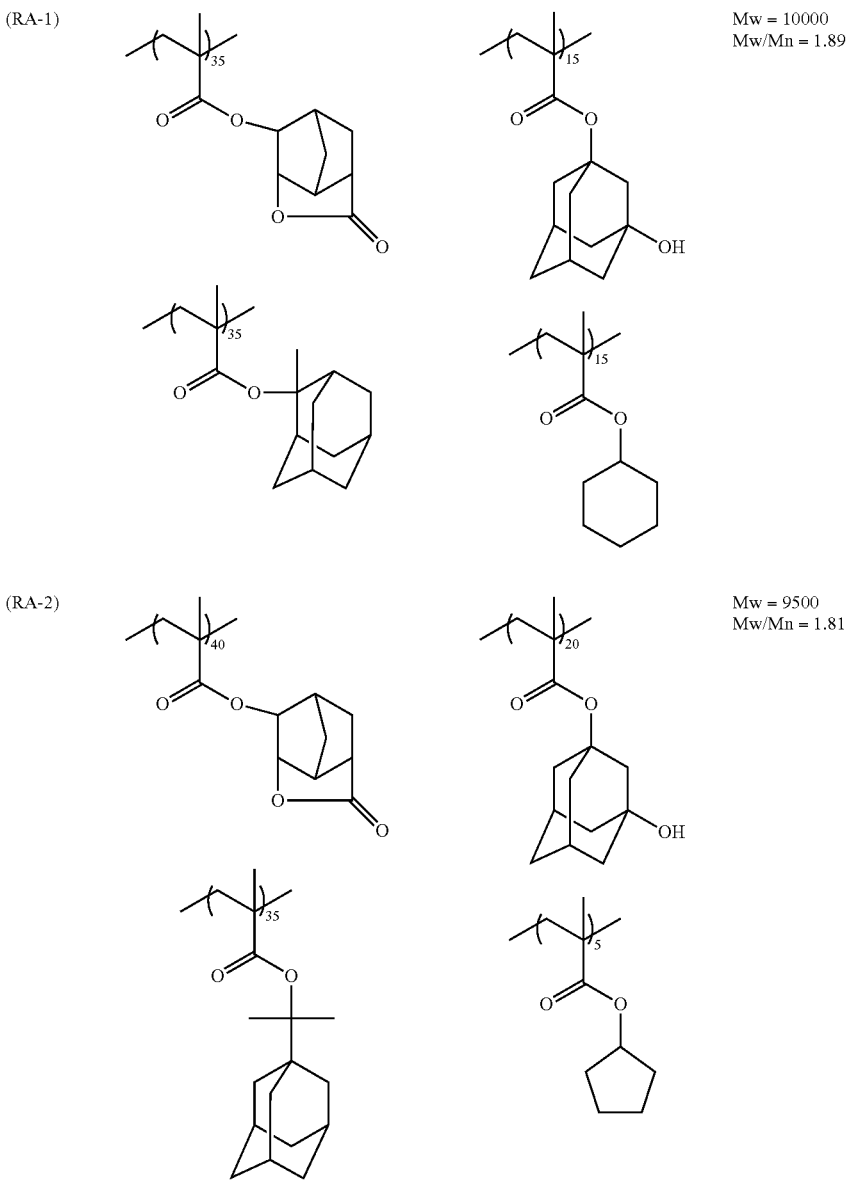

-continued
(RA-3) 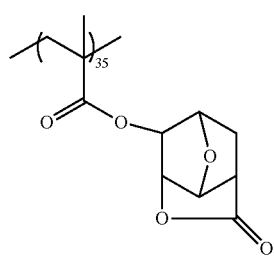 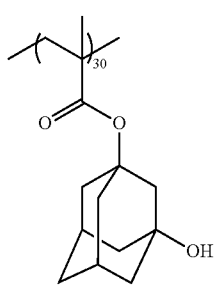
Mw = 7000
Mw/Mn = 1.65
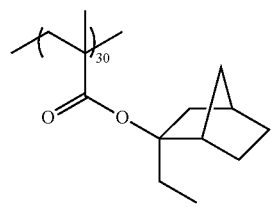 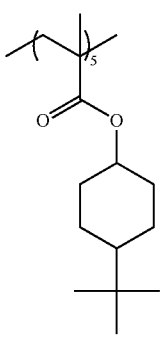
(RA-4) 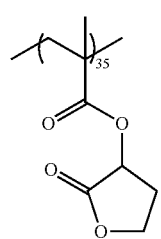 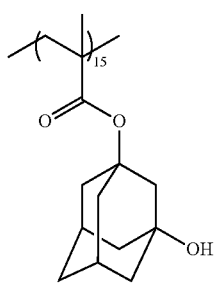
Mw = 13800
Mw/Mn = 1.80
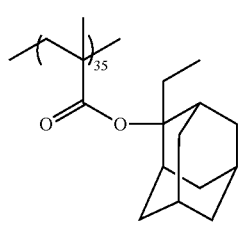 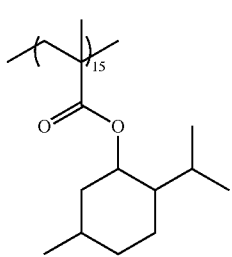

-continued
(RA-5) 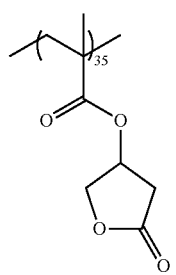 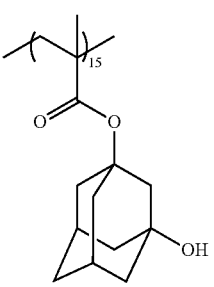
Mw = 9900
Mw/Mn = 1.82
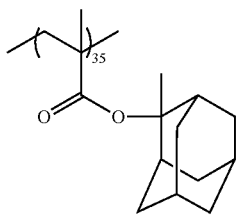 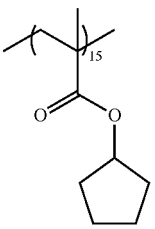
(RA-6) 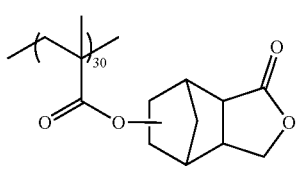 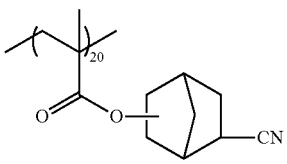
Mw = 5400
Mw/Mn = 1.59
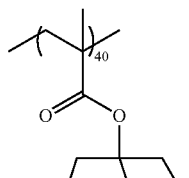 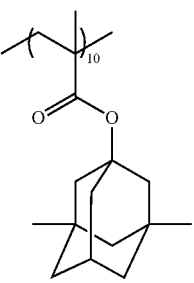
(RA-7) 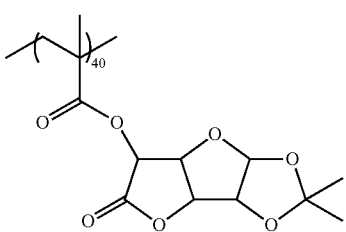 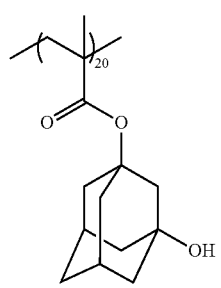
Mw = 8300
Mw/Mn = 1.34
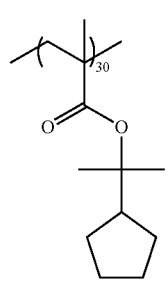 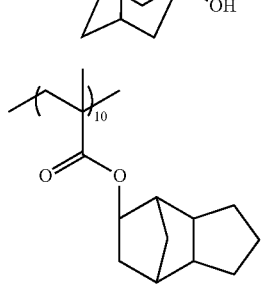

-continued
(RA-8) 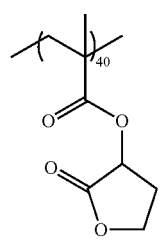 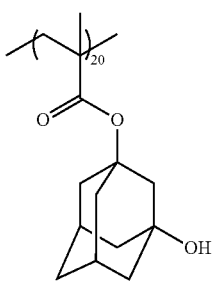 Mw = 7900
Mw/Mn = 1.77
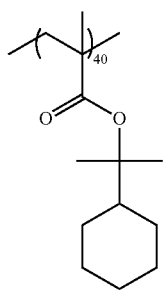 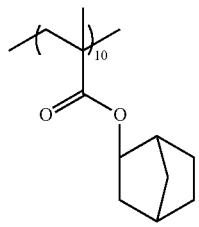
(RA-9) 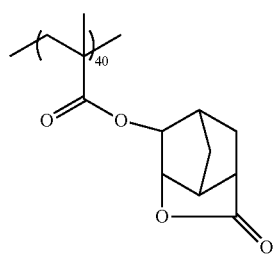 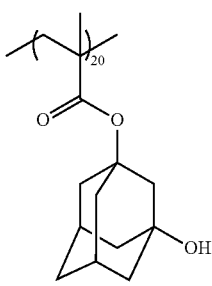 Mw = 6500
Mw/Mn = 1.70
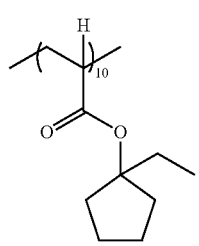 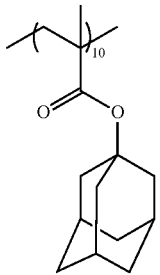

-continued
(RA-10) 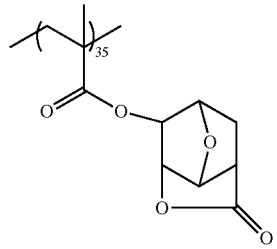 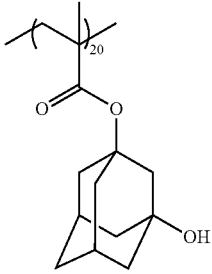  Mw = 7600
Mw/Mn = 1.89
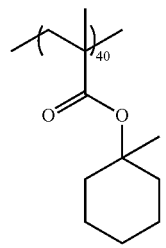 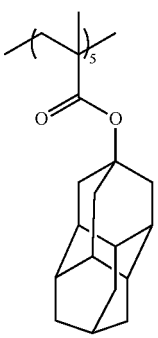
(RA-11) 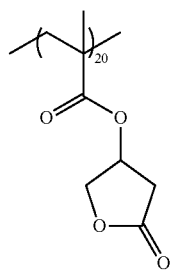 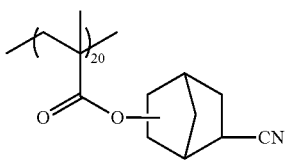  Mw = 16400
Mw/Mn = 2.15
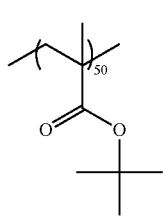 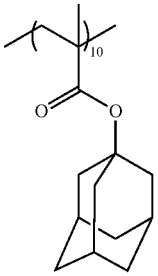

-continued
(RA-12) 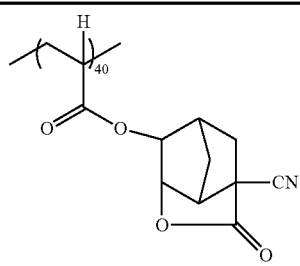 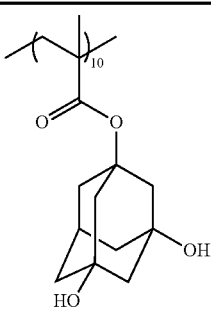 Mw = 6900
Mw/Mn = 1.66
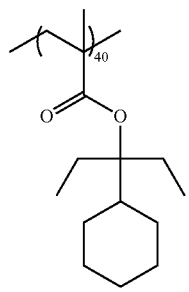 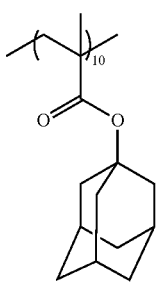
(RA-13) 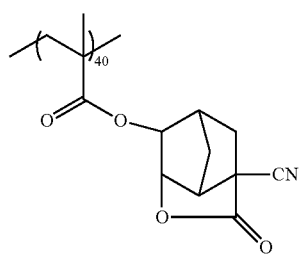 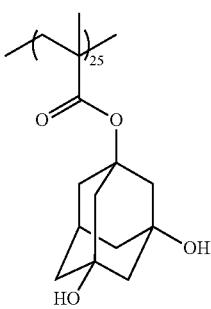 Mw = 8200
Mw/Mn = 1.78
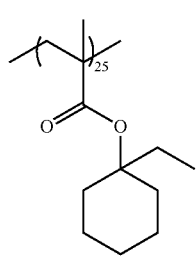 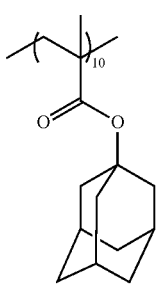

-continued
(RA-14) 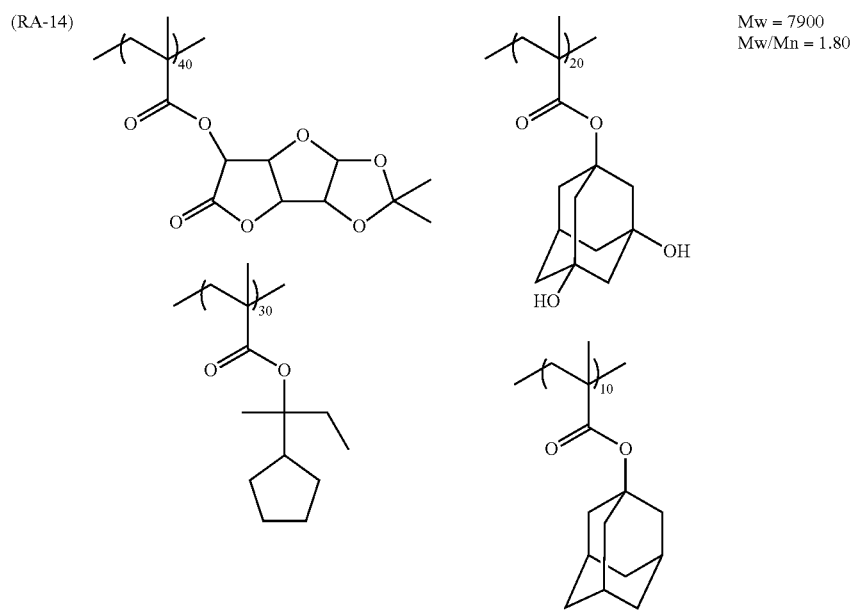 Mw = 7900
Mw/Mn = 1.80
(RA-15) 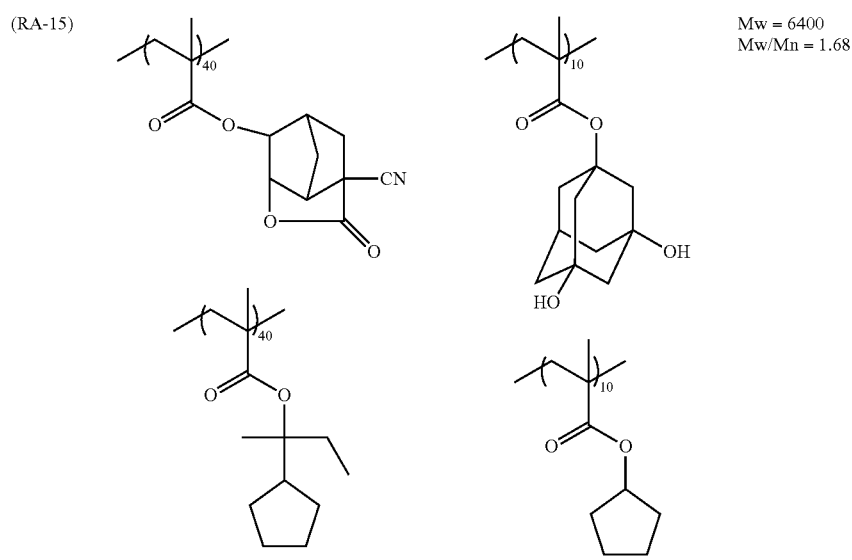 Mw = 6400
Mw/Mn = 1.68

(RA-16) 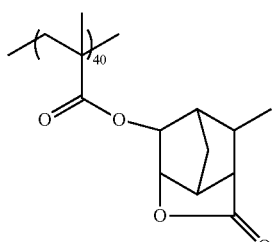 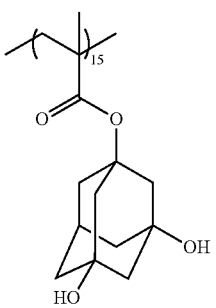
Mw = 6600
Mw/Mn = 1.67
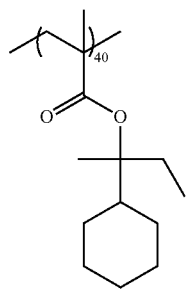 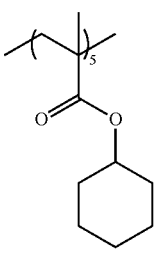
(RA-17) 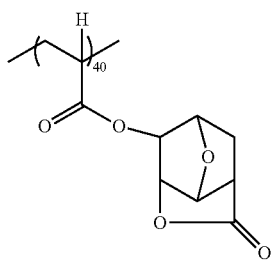 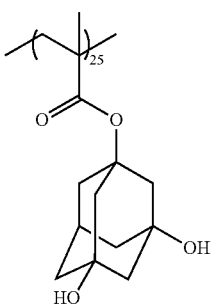
Mw = 10500
Mw/Mn = 1.98
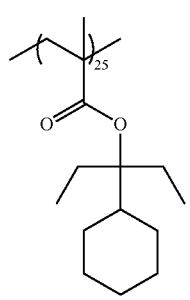 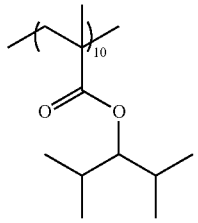

-continued
(RA-18) 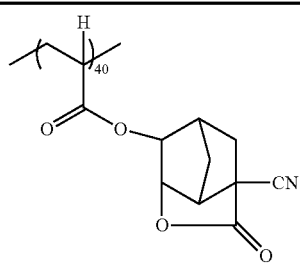 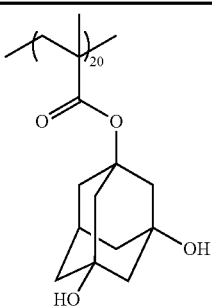  Mw = 5900
Mw/Mn = 1.64
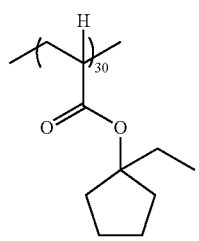 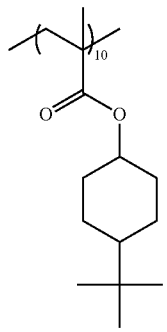
(RA-19) 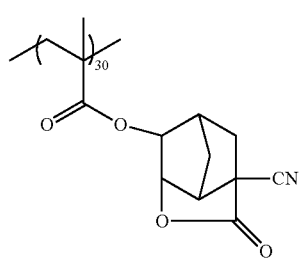 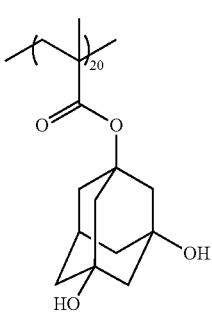  Mw = 8100
Mw/Mn = 1.79
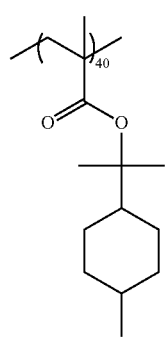 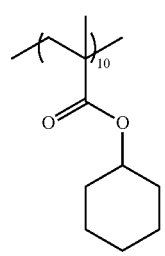

(RA-20) 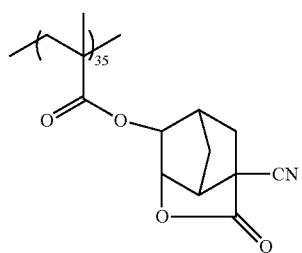 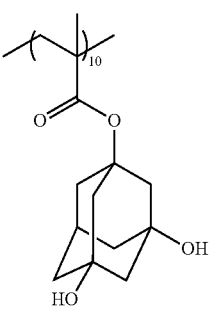
Mw = 10600
Mw/Mn = 1.84
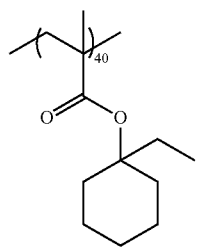 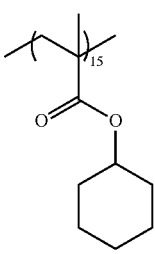
(RA-21) 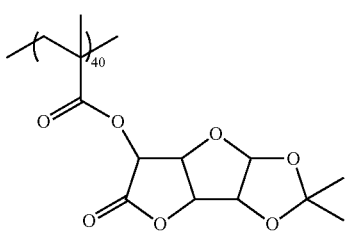 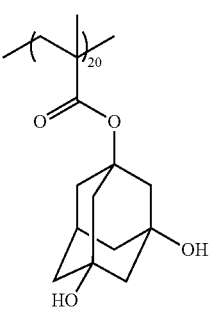
Mw = 8400
Mw/Mn = 1.78
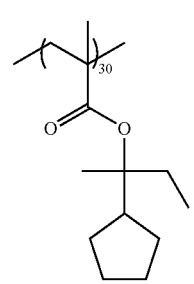 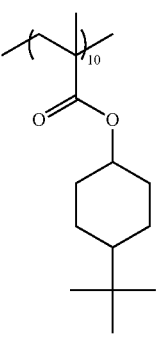

-continued
(RX-1) 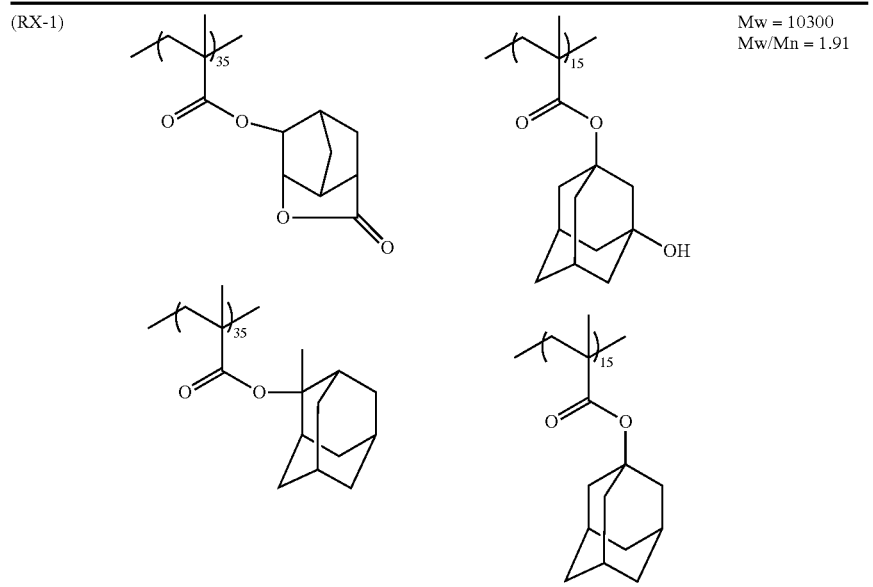
Mw = 10300
Mw/Mn = 1.91
(RX-2) 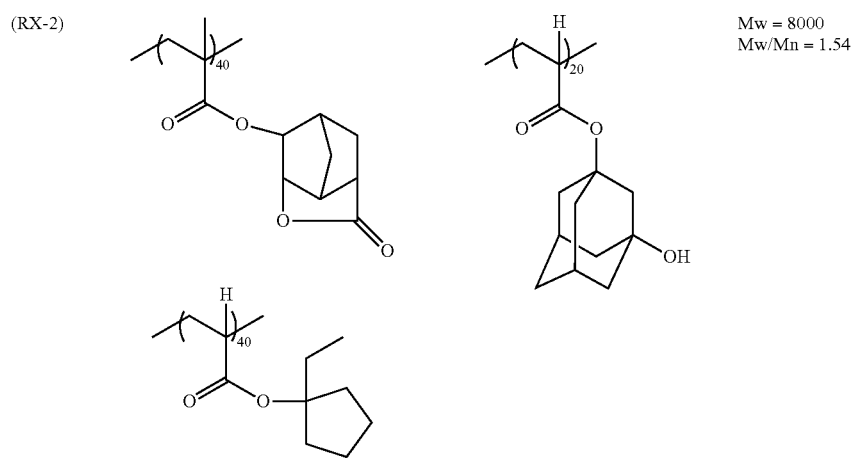
Mw = 8000
Mw/Mn = 1.54
(RX-3) 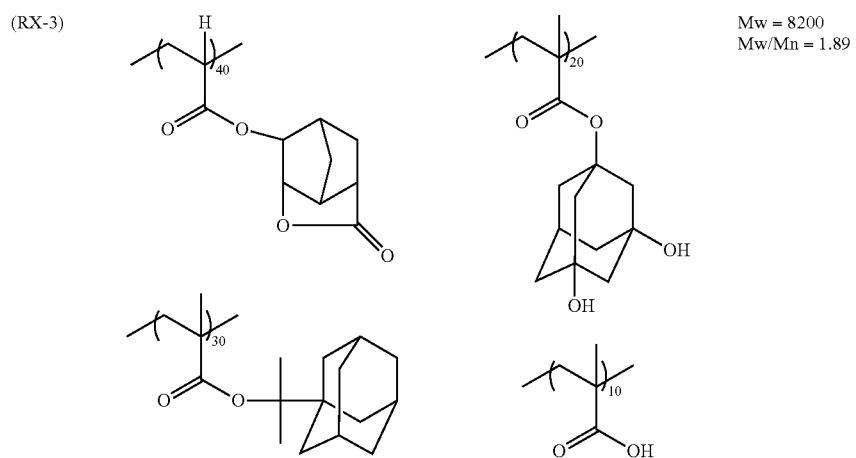
Mw = 8200
Mw/Mn = 1.89

-continued

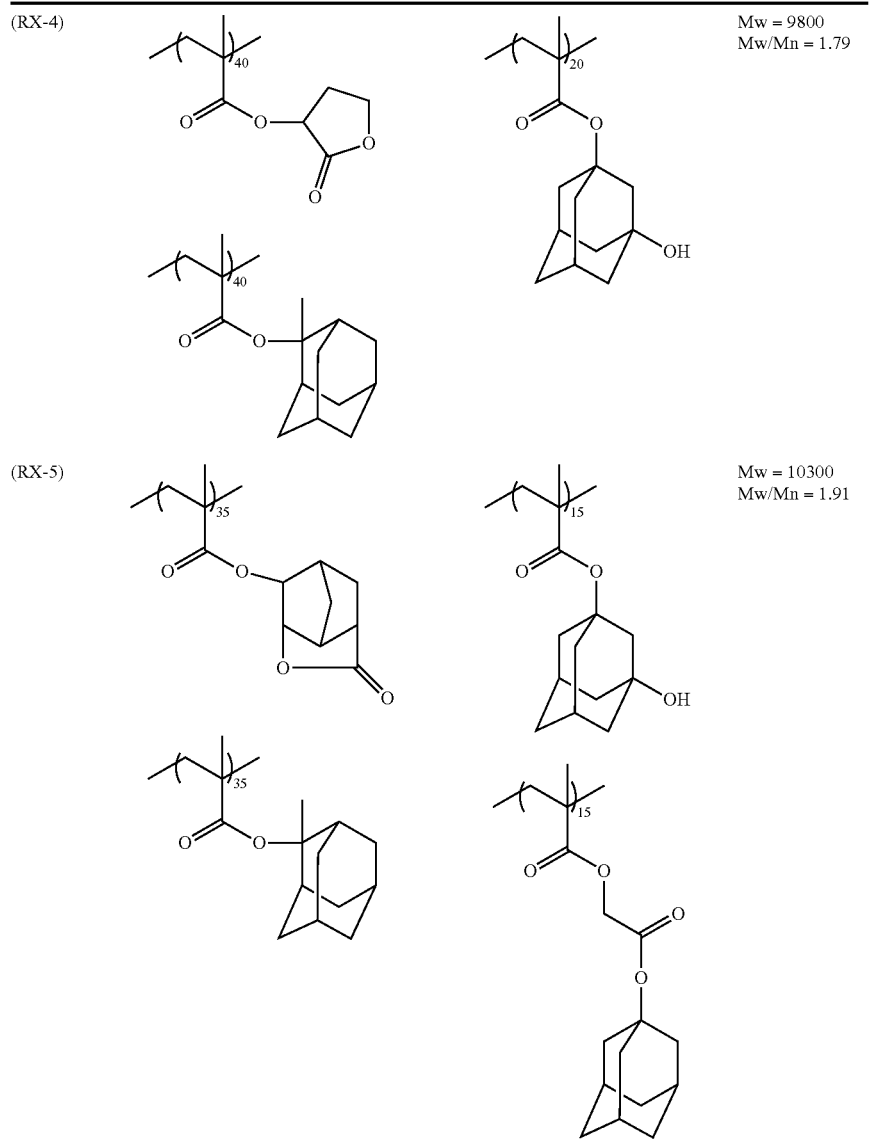

Examples 1 to 25 and Comparative Examples 1 and 2

(Evaluation of Pattern Collapse and Development Defects)

A solution having a solids concentration of 9% by weight and having components shown in the following Table 1 dissolved in a solvent was prepared and filtered by a 0.03-μm polyethylene filter, thereby preparing a positive resist solution. The prepared positive resist solution was evaluated by the following methods. The obtained results are also shown in Table 1.

TABLE 1

| | Acid generator (g) | Resin (10 g) | Basic compound (g) | Surfactant (g) | Solvent | Pattern collapse (number) | Development defects (nm) | Isolated DOF (μm) | Resolving power (nm) | PEB temperature dependency (nm/° C.) |
|---|---|---|---|---|---|---|---|---|---|---|
| Example 1 | z2 (0.3) | RA-1 | DIA (0.03) | W-4 (0.01) | S1/S5 = 60/40 | 60 | 2600 | 0.275 | 65 | 3.1 |
| Example 2 | z23 (0.3) | RA-2 | TPA (0.05) | W-2 (0.02) | S1/S4/S6 = 80/5/15 | 60 | 3200 | 0.275 | 65 | 3.4 |
| Example 3 | z63 (0.2) | RA-3 | TEA (0.02) | W-1 (0.01) | S1/S6 = 95/5 | 60 | 3300 | 0.275 | 65 | 3.2 |
| Example 4 | z23 (0.3) | RA-4 | DIA (0.03) | W-4 (0.01) | S1/S5 = 60/40 | 60 | 2300 | 0.275 | 65 | 3.1 |
| Example 5 | z15 (0.2) | RA-5 | PEA (0.02) | W-4 (0.01) | S1/S5 = 80/20 | 60 | 3100 | 0.275 | 65 | 3.6 |
| Example 6 | z1 (0.2) z3 (0.2) | RA-6 | DIA (0.02) PEA (0.02) | W-4 (0.01) | S1/S4/S6 = 80/5/15 | 60 | 1300 | 0.275 | 65 | 3.2 |

TABLE 1-continued

| | Acid generator (g) | Resin (10 g) | Basic compound (g) | Surfactant (g) | Solvent | Pattern collapse (number) | Development defects (nm) | Isolated DOF (µm) | Resolving power (nm) | PEB temperature dependency (nm/°C.) |
|---|---|---|---|---|---|---|---|---|---|---|
| Example 7 | z16 (0.3) | RA-7 | TMEA (0.03) | W-3 (0.03) | S1/S5 = 60/40 | 60 | 1100 | 0.275 | 65 | 3.5 |
| Example 8 | z55 (0.3) | RA-8 | TBAH (0.04) | W-1 (0.005) | S1/S6 = 80/20 | 58 | 1200 | 0.275 | 65 | 3.0 |
| Example 9 | z51 (0.5) | RA-9 | DBA (0.03) | W-3 (0.02) | S1/S5 = 60/40 | 58 | 1600 | 0.275 | 65 | 3.3 |
| Example 10 | z5 (0.3) | RA-10 | TPSA (0.05) | W-3 (0.01) | S1/S5 = 60/40 | 58 | 1400 | 0.275 | 65 | 3.2 |
| Example 11 | z44 (0.6) | RA-11 | TPI (0.03) | W-4 (0.01) | S1/S3 = 60/40 | 55 | 1500 | 0.25 | 68 | 3.9 |
| Example 12 | z2 (0.2) z47 (0.3) | RA-12 | DIA (0.03) | W-4 (0.01) | S1/S5 = 60/40 | 55 | 900 | 0.275 | 65 | 3.1 |
| Example 13 | z23 (0.4) | RA-13 | PEA (0.01) | W-2 (0.02) | S1/S5 = 60/40 | 55 | 890 | 0.275 | 65 | 3.3 |
| Example 14 | z65 (0.2) z4 (0.1) | RA-14 | PEA (0.04) | W-4 (0.01) | S1/S3 = 60/40 | 55 | 1000 | 0.275 | 65 | 3.5 |
| Example 15 | z23 (0.1) z51 (0.3) | RA-15 | DIA (0.02) PEA (0.02) | W-2 (0.02) | S1/S5 = 60/40 | 55 | 150 | 0.3 | 62 | 2.7 |
| Example 16 | z55 (0.2) z51 (0.2) | RA-16 | DIA (0.02) PEA (0.02) | W-2 (0.01) | S1/S3 = 60/40 | 50 | 580 | 0.3 | 62 | 2.6 |
| Example 17 | z23 (0.2) z55 (0.4) | RA-17 | DIA (0.02) TEA (0.02) | W-4 (0.01) | S1/S3 = 60/40 | 50 | 300 | 0.3 | 62 | 2.9 |
| Example 18 | z62 (0.4) z2 (0.1) | RA-18 | PBI (0.02) PEA (0.01) | W-4 (0.01) | S1/S5/S7 = 59/40/1 | 50 | 130 | 0.3 | 62 | 2.6 |
| Example 19 | z62 (0.3) z67 (0.1) | RA-19 | DIA (0.02) PEA (0.02) | W-4 (0.01) | S1/S5/S7 = 59/40/1 | 50 | 140 | 0.3 | 62 | 2.3 |
| Example 20 | z65 (0.3) | RA-20 | DIA (0.03) | W-4 (0.01) | S3 = 100 | 50 | 150 | 0.3 | 62 | 2.6 |
| Example 21 | z64 (0.3) z23 (0.05) | RA-21 | DIA (0.01) | W-4 (0.01) | S1/S4/S6 = 70/5/25 | 50 | 260 | 0.3 | 62 | 2.8 |
| Example 22 | z38 (0.2) z8 (0.15) | RA-15 (5) RX-2 (5) | PEA (0.02) DBA (0.02) | W-4 (0.01) | S1/S3 = 60/40 | 50 | 110 | 0.3 | 62 | 2.4 |
| Example 23 | z23 (0.3) z55 (0.1) | RA-19 (5) RX-3 (5) | PEA (0.04) | W-4 (0.01) | S1/S3 = 60/40 | 50 | 120 | 0.3 | 62 | 2.8 |
| Example 24 | z55 (0.2) z4 (0.2) | RA-18 (5) RX-4 (5) | DIA (0.02) DBA (0.02) | W-4 (0.01) | S1/S3 = 60/40 | 50 | 110 | 0.3 | 62 | 2.2 |
| Example 25 | z2 (0.3) | RX-1 (10) | DIA (0.03) | W-4 (0.01) | S1/S5 = 60/40 | 68 | 26000 | 0.3 | 65 | 3.7 |
| Comparative Example 1 | z2 (0.3) | RP-1 | DIA (0.03) | W-4 (0.01) | S1/S5 = 60/40 | 70 | 76000 | 0.225 | 70 | 6.7 |
| Comparative Example 2 | z2 (0.3) | RP-2 | DIA (0.03) | W-4 (0.01) | S1/S5 = 60/40 | 70 | 56000 | 0.225 | 70 | 7.2 |

(Acid Generator)

The acid generators shown in Table 1 are shown below.

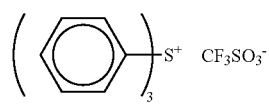

(z1)

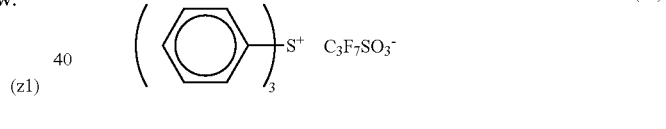

(z5)

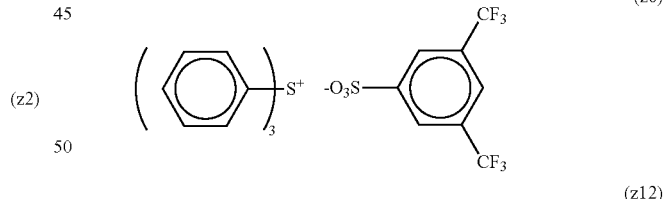

(z2)

(z6)

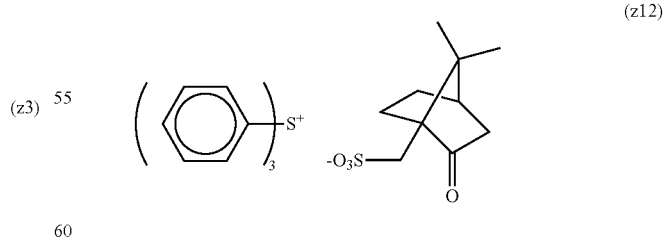

(z3)

(z12)

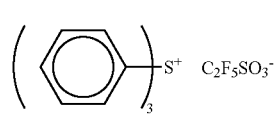

(z4)

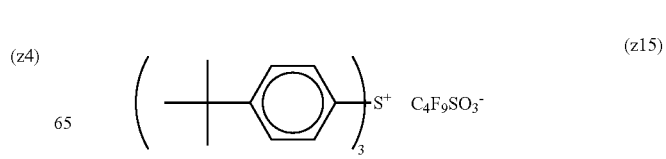

(z15)

-continued
(z16) 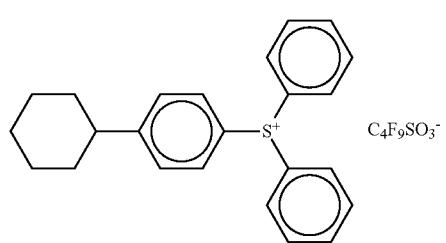
(z23) 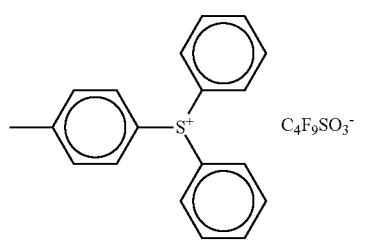
(z38) 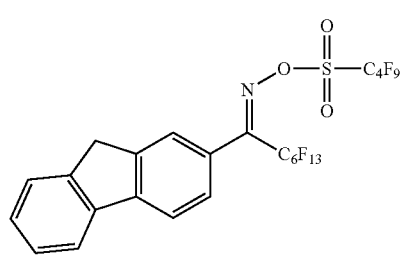
(z44) 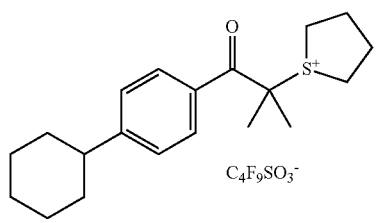
(z47) 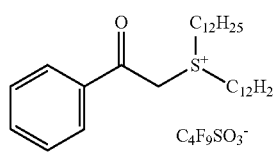
(z51) 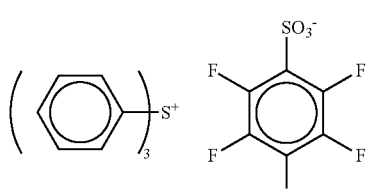
(z55) 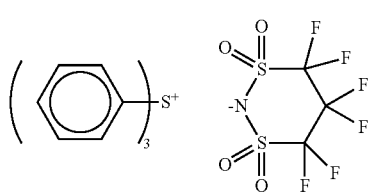
-continued
(z61) 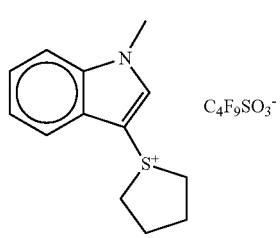
(z62) 
(z63) 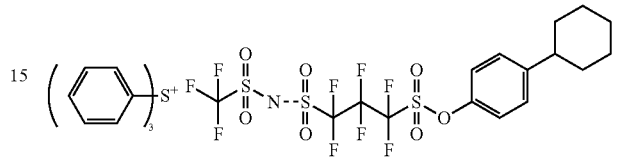
(z64) 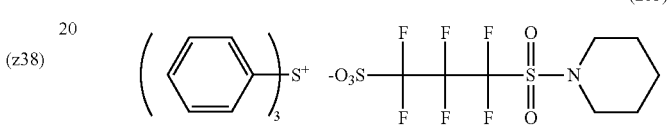
(z65) 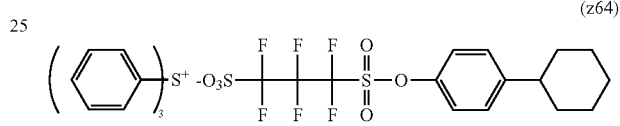
(z66) 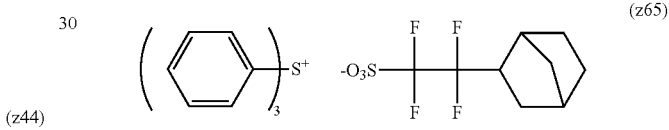
(z67) 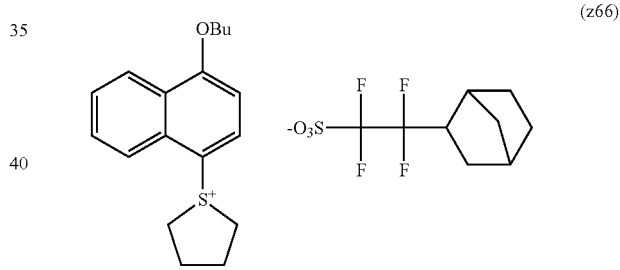
The abbreviations shown in Table 1 are as follows.
(Basic Compound)
TPI: 2,4,5-Triphenylimidazole
TPSA: Triphenylsulfonium acetate
DIA: 2,6-Diisopropylaniline
TEA: Triethanolamine
TPA: Tripentylamine
DBA: N,N-Dibutylaniline
PBI: 2-Phenylbenzimidazole
TMEA: Tris(methoxyethoxyethyl)amine
PEA: N-Phenyldiethanolamine (Surfactant)
W-1: MEGAFAC F176 (manufactured by Dainippon Ink and Chemicals, Incorporated) (fluorine based surfactant)
W-2: MEGAFAC R08 (manufactured by Dainippon Ink and Chemicals, Incorporated) (fluorine and silicon based surfactant)
W-3: Polysiloxane polymer KP-341 (manufactured by Shin-Etsu Chemical Co., Ltd.) (silicon based surfactant)
W-4: TROYSOL S-366 (manufactured by Troy Chemical Corporation)
(Solvent)
S1: Propylene glycol methyl ether acetate
S2: 2-Heptane
S3: Cyclohexanone
S4: γ-Butyrolactone
S5: Propylene glycol methyl ether
S6: Ethyl lactate
S7: Propylene carbonate
(Evaluation)

An antireflective coating DUV-42 (manufactured by Brewers Science, Ltd.) was uniformly coated in a thickness of 600 angstroms on a hexamethyldisilazane-treated silicon substrate by using a spin coater, dried on a hot plate at 100° C. for 90 seconds, and then heated for drying at 190° C. for 240 seconds. Thereafter, each positive resist solution was coated by using a spin coater and dried at 110° C. for 90 seconds to form a 160 nm-thick resist layer.

This resist layer was exposed through a mask by using an ArF excimer laser stepper (manufactured by ASML, NA=0.75, ⅔ annular) and immediately after the exposure, was heated on a hot plate at 120° C. for 90 seconds. In addition, the resulting resist layer was developed with a 2.38% by weight tetramethylammonium hydroxide aqueous solution at 23° C. for 60 seconds, rinsed with pure water for 30 seconds, and then dried to obtain a line pattern.

Evaluation Method of Pattern Collapse:

In defining an exposure amount for reproducing an 80 nm line and space 1:1 mask pattern as an optimum exposure amount and making a line width of a line pattern formed by further increasing the exposure amount from the optimum exposure amount narrow, the pattern collapse was defined in terms of a line width at which the line pattern was resolved without causing collapse. It is meant that when the value is small, a finer pattern is resolved without causing collapse, the pattern collapse is hardly generated, and the resolving power is high.

Evaluation Method of Development Defects:

The positive resist solution was uniformly coated on a hexamethyldisilazane-treated silicon substrate of 6 inches by using a spin coater and heated and dried on a hot plate at 120° C. for 90 seconds to form a 0.20 µm-thickness resist layer. This resist layer was heated on a hot plate at 110° C. for 90 seconds without being exposed. In addition, the resulting resist layer was developed with a 2.38% by weight tetramethylammonium hydroxide aqueous solution at 23° C. for 60 seconds, rinsed with pure water for 30 seconds, and then dried. The thus obtained sample wafer was measured for the number of development defects by a KLA2112 machine (manufactured by KLA-Tencor Corporation) (threshold 12, pixel size=0.39).

(Evaluation of DOF at the Time of Forming Isolated Line Pattern, Resolving Power, and PEB Temperature Dependency)

A solution having a solids concentration of 7% by weight and having the components shown in the following Table 1 dissolved in a solvent was prepared and filtered by a 0.1-µm polyethylene filter, thereby preparing a positive resist solution. The prepared positive resist solution was evaluated by the following methods. The result of the evaluation was shown in Table 1.

An organic antireflective coating ARC29A (manufactured by Nissan Chemical Industries, Ltd.) was coated on a silicon wafer and baked at 205° C. for 60 seconds to form a 78 nm-thick antireflection layer. The prepared positive resist solution was coated thereon and baked at 115° C. for 60 seconds to form a 150 nm-thick resist layer. The thus obtained wafer was subjected to pattern exposure by using ArF excimer laser scanner (manufactured by ASML, PAS5500/1100, NA0.75, σo/σI=0.85/0.55). After the exposure, the resist layer was heated at 120° C. for 90 seconds and then developed with a tetramethylammonium hydroxide aqueous solution (2.38%) for 30 seconds. After rinsing with pure water, a resist pattern was obtained by spin drying.

(Defocus Latitude (DOF) at the Time of Formation of Isolated Line Pattern)

DOF shows a fluctuation width (µm) of a focal point which is satisfied with the range of a line width of [130 nm±13 nm (±10%)] when a position of the focal point is fluctuated in an exposure amount at which an isolated line pattern of 210 nm is reproduced into a line width of 130 nm.

(Resolving Power)

The resolving power shows a width (nm) of a line pattern which can be resolved in a minimum exposure amount at which a line pattern of 80 nm is reproduced, namely a critical resolving power.

(PEB Temperature Dependency)

An exposure amount at which a line and space 1/1 of a mask size of 80 nm is reproduced in post heating at 120° C. for 90 seconds was defined as an optimum exposure amount; exposure was carried out in the optimum exposure amount; post heating was carried out at two temperatures of +2° C. and −2° C. against the preceding post heating temperature (namely, 122° C. and 118° C.), respectively; and each obtained line and space was measured, thereby determining line widths $L_1$ and $L_2$, respectively. The PEB temperature dependency was defined as a fluctuation of the line width per 1° C. of the PEB temperature change and calculated according to the following expression.

$$[\text{PEB temperature dependency (nm/}^\circ\text{ C.)}]=|L_1-L_2|/4$$

It is meant that the smaller the value, the smaller the change of performance against the temperature change is so that the PEB temperature dependency is good.

It is evident from Table 1 that the positive photosensitive composition of the invention is improved with respect to the pattern collapse, the development defects, DOF at the time of forming isolated line pattern, resolving power, and PEB temperature dependency.

(Immersion Exposure)
(Preparation of Positive Photosensitive Composition (Positive Resist Solution))

A solution having a solids concentration of 7% by weight and having the components of each of Examples 1 to 25 and Comparative Example 1 dissolved in a solvent was prepared and filtered by a 0.03-µm polyethylene filter, thereby preparing a positive resist solution. The prepared positive resist solution was evaluated by the following methods.

(Evaluation of Resolution Properties)

An organic antireflective coating ARC29A (manufactured by Nissan Chemical Industries, Ltd.) was coated on a silicon wafer and baked at 205° C. for 60 seconds to form a 78 nm-thick antireflection layer. The prepared positive resist solution was coated thereon and baked at 115° C. for 60 seconds to form a 150 nm-thick resist layer.

The thus obtained wafer was subjected to two-beam interference exposure (wet exposure) by using pure water as an immersion liquid. Incidentally, in the two-beam interference exposure (wet exposure), as illustrated in FIG. 1, a wafer 10 having an antireflective layer and a resist layer was provided on the wafer stage 11, and exposed through a prism 8 and an immersion liquid (pure water) 9 by using a laser 1, an aperture 2, a shutter 3, three reflection mirrors 4, 5, 6 and a condensing lens 7. The laser 1 had a wavelength of 193 nm, and the prism 8 capable of forming a 65-nm line and space pattern was used. Immediately after the exposure, the resist layer was heated at 115° C. for 90 seconds and then developed with a tetramethylammonium hydroxide aqueous solution (2.38%) for 60 seconds. After rinsing with pure water, a resist pattern obtained by spin drying was observed by using a scanning electron microscope (S-9260, manufactured by Hitachi, Ltd.). When the positive resist solution of each of Examples 1 to 24 was used, the 65-nm line and space pattern was resolved without causing pattern collapse. When the positive resist solution of Example 25 was used, though the 65-nm line and space pattern was resolved, pattern collapse was partially observed.

It is turned out that the positive photosensitive composition of the invention has a good image forming ability in the exposure method via an immersion liquid, too.

The composition A2 of the invention is hereunder described in detail with reference to the following Examples, but it should not be construed that the invention is limited thereto.

Synthesis Example 2

(Synthesis of Resin (RB-1))

The following monomers (U-1), (U-2), (U-3) and (U-4) were dissolved in a proportion of 45/30/20/5 in terms of a molar ratio in tetrahydrofuran, thereby preparing a solution having a solids content of 50% by weight. This solution was charged in a three-necked flask and heated at 80° C. under a nitrogen gas stream. At the point of time when the reaction temperature became stable, 5% by mole of a radical initiator V-60, manufactured by Wako Pure Chemical Industries, Ltd. was added, thereby initiating the reaction. After heating for 6 hours, the reaction mixture was diluted twice with tetrahydrofuran, and hexane in an amount of 5 times the reaction solution was added, thereby depositing a white powder. The deposited powder was taken out by filtration and dried to obtain a desired resin (RB-1).

The following resins (RB-2) to (RB-21) of the invention and resins (RP-1) to (RP-3) of the comparison were obtained in the same manner. The solvent to be used for dissolution is not limited to tetrahydrofuran. The same resins can also be obtained by using, for example, cyclohexanone or propylene glycol monomethyl ether.

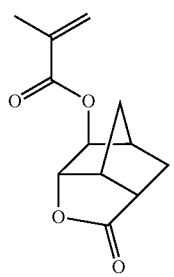
(U-1)

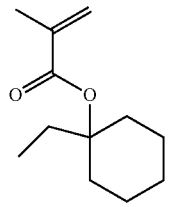
(U-2)

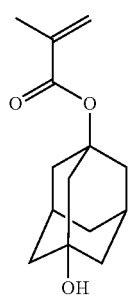
(U-3)

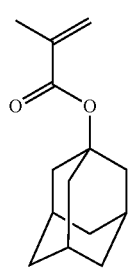
(U-4)

Examples 1B to 18B and Comparative Examples 1B to 2B (Evaluation)

A solution having a solids concentration of 9% by weight and having components shown in the following Table 2 dissolved in a solvent was prepared and filtered by a 0.03-μm polyethylene filter, thereby preparing a positive resist composition. The prepared positive resist composition was evaluated by the same methods in the foregoing Examples 1 to 25 and Comparative Examples 1 and 2.

(Evaluation of Defocus Latitude (DOF) at the Time of Formation of Isolated Line Pattern, Resolving Power and PEB Temperature Dependency)

A solution having a solids concentration of 7% by weight and having components shown in the following Table 2 dissolved in a solvent was prepared and filtered by a 0.1-μm polyethylene filter, thereby preparing a positive resist composition. The prepared positive resist composition was evaluated by the same methods in the foregoing Examples 1 to 25 and Comparative Examples 1 and 2.

The obtained results are also shown in Table 2.

TABLE 2

| | Resin | | Acid generator 1 | | Acid generator 2 | | Basic compound 1 | |
|---|---|---|---|---|---|---|---|---|
| | Resin No. | Parts by weight | Compound No. | Parts by weight | Compound No. | Parts by weight | Compound No. | Parts by weight |
| Example 1B | RB-1 | 95.8 | PAG-1 | 3 | PAG-3 | 0.5 | N-1 | 0.25 |
| Example 2B | RB-2 | 96.7 | PAG-2 | 2.5 | | | N-2 | 0.3 |
| Example 3B | RB-3 | 94.8 | PAG-7 | 4 | | | N-5 | 0.25 |
| Example 4B | RB-4 | 95.4 | PAG-3 | 2.3 | PAG-7 | 1.5 | N-3 | 0.3 |
| Example 5B | RB-5 RP-3 | 65.2 30 | PAG-3 | 2.5 | PAG-8 | 1.5 | N-5 | 0.3 |
| Example 6B | RB-6 | 94.8 | PAG-4 | 4.7 | | | | |
| Example 7B | RB-7 RB-17 | 65.3 30 | PAG-1 | 3.5 | PAG-5 | 0.2 | N-2 | 0.4 |
| Example 8B | RB-8 | 94.9 | PAG-5 | 4.5 | | | N-7 | 0.15 |
| Example 9B | RB-9 | 96.5 | PAG-2 | 2.5 | PAG-5 | 0.1 | N-6 | 0.25 |
| Example 10B | RB-10 RB-18 | 42.4 50 | PAG-6 | 6 | | | N-3 | 0.5 |
| Example 11B | RB-11 RB-19 | 71.9 25 | PAG-2 | 2 | | | N-1 | 0.1 |
| Example 12B | RB-12 | 92.9 | PAG-2 | 3.5 | PAG-6 | 2 | N-3 | 0.4 |
| Example 13B | RB-13 | 96.5 | PAG-2 | 2.5 | PAG-5 | 0.1 | N-6 | 0.25 |
| Example 14B | RB-14 RB-20 | 42.4 50 | PAG-6 | 6 | | | N-3 | 0.5 |
| Example 15B | RB-15 RB-21 | 71.9 25 | PAG-2 | 2 | | | N-1 | 0.1 |
| Example 16B | RB-16 | 92.9 | PAG-2 | 3.5 | PAG-6 | 2 | N-3 | 0.4 |
| Example 17B | RB-1 | 95.8 | PAG-1 | 3 | PAG-3 | 0.5 | N-1 | 0.25 |
| Example 18B | RB-1 | 95.8 | PAG-1 | 3 | PAG-3 | 0.5 | N-1 | 0.25 |
| Comparative Example 1B | RP-1 | 94.6 | PAG-1 | 4.5 | | | N-8 | 0.4 |
| Comparative Example 2B | RP-2 | 93.5 | PAG-1 | 5 | PAG-2 | 0.5 | N-3 | 0.4 |

| | Basic compound 2 | | Additive | | Surfactant | |
|---|---|---|---|---|---|---|
| | Compound No. | Parts by weight | Compound No. | Parts by weight | Compound No. | Parts by weight |
| Example 1B | | | | | W-1 | 0.5 |
| Example 2B | | | | | W-2 | 0.5 |
| Example 3B | | | AD-1 | 0.5 | W-2 | 0.5 |
| Example 4B | | | | | W-2 | 0.5 |
| Example 5B | | | | | W-2 | 0.5 |
| Example 6B | | | | | W-1 | 0.5 |
| Example 7B | N-1 | 0.1 | | | W-1 | 0.5 |
| Example 8B | | | | | W-4 | 0.5 |
| Example 9B | N-3 | 0.15 | | | W-2 | 0.5 |
| Example 10B | N-1 | 0.15 | | | W-4 | 1 |
| Example 11B | | | | | W-2 | 1 |
| Example 12B | N-6 | 0.25 | | | W-4 | 1 |
| Example 13B | N-3 | 0.15 | | | W-2 | 0.5 |
| Example 14B | N-1 | 0.15 | | | W-4 | 1 |
| Example 15B | | | | | W-2 | 1 |
| Example 16B | N-6 | 0.25 | | | W-4 | 1 |
| Example 17B | | | | | W-1 | 0.5 |
| Example 18B | | | | | W-1 | 0.5 |
| Comparative Example 1B | | | | | W-2 | 0.5 |
| Comparative Example 2B | N-1 | 0.1 | | | W-2 | 0.5 |

| | Solvent | | | | | |
|---|---|---|---|---|---|---|
| | Solvent 1 | Parts by weight | Solvent 2 | Parts by weight | Solvent 3 | Parts by weight |
| Example 1B | SL-1 | 1140 | SL-6 | 760 | | |
| Example 2B | SL-1 | 1354 | SL-5 | 531 | SL-8 | 15 |
| Example 3B | SL-1 | 1354 | SL-6 | 531 | SL-8 | 15 |
| Example 4B | SL-1 | 1369 | SL-4 | 531 | | |
| Example 5B | SL-1 | 1369 | SL-4 | 531 | | |
| Example 6B | SL-1 | 1656 | SL-6 | 244 | | |
| Example 7B | SL-1 | 1641 | SL-6 | 244 | SL-8 | 15 |
| Example 8B | SL-1 | 1438 | SL-6 | 442 | SL-7 | 20 |
| Example 9B | SL-1 | 1369 | SL-4 | 531 | | |
| Example 10B | SL-1 | 1369 | SL-6 | 531 | | |
| Example 11B | SL-2 | 1369 | SL-6 | 531 | | |
| Example 12B | SL-3 | 1765 | SL-7 | 135 | | |
| Example 13B | SL-1 | 1369 | SL-4 | 531 | | |

TABLE 2-continued

| | | | | |
|---|---|---|---|---|
| Example 14B | SL-1 | 1369 | SL-6 | 531 |
| Example 15B | SL-2 | 1369 | SL-6 | 531 |
| Example 16B | SL-3 | 1765 | SL-7 | 135 |
| Example 17B | | | | |
| Example 18B | | | | |
| Comparative Example 1B | SL-1 | 1420 | SL-4 | 480 |
| Comparative Example 2B | SL-1 | 1550 | SL-5 | 350 |

| | Performance evaluation | | | | |
|---|---|---|---|---|---|
| | Pattern collapse | Development defects (number) | Isolated DOF (μm) | Resolving power (nm) | PEB temperature dependency (nm/° C.) |
| Example 1B | 60 | 2200 | 0.3 | 65 | 3.2 |
| Example 2B | 60 | 2300 | 0.3 | 65 | 3.1 |
| Example 3B | 60 | 3000 | 0.3 | 65 | 2.9 |
| Example 4B | 60 | 1900 | 0.3 | 65 | 3.2 |
| Example 5B | 60 | 2400 | 0.3 | 65 | 3.3 |
| Example 6B | 60 | 1300 | 0.25 | 75 | 3.5 |
| Example 7B | 60 | 1800 | 0.3 | 65 | 3.3 |
| Example 8B | 60 | 1900 | 0.3 | 65 | 3.5 |
| Example 9B | 60 | 2000 | 0.3 | 65 | 3.4 |
| Example 10B | 60 | 1900 | 0.3 | 65 | 3.2 |
| Example 11B | 60 | 1800 | 0.3 | 65 | 3.1 |
| Example 12B | 60 | 2600 | 0.3 | 65 | 3.2 |
| Example 13B | 60 | 3100 | 0.3 | 65 | 2.3 |
| Example 14B | 60 | 3100 | 0.3 | 65 | 2.4 |
| Example 15B | 60 | 2500 | 0.3 | 65 | 2.5 |
| Example 16B | 60 | 1700 | 0.3 | 65 | 2.3 |
| Example 17B | 68 | 9600 | 0.3 | 65 | 3.4 |
| Example 18B | 68 | 11200 | 0.25 | 68 | 3.9 |
| Comparative Example 1B | 70 | 87000 | 0.15 | 75 | 5.3 |
| Comparative Example 2B | 70 | 91000 | 0.15 | 75 | 5.4 |

A structure, a weight average molecular weight, a degree of dispersion, a molar composition ratio (corresponding to the order of the repeating units from the left-hand side) of each of the resins (RB-1) to (RB-21) and (RP-1) to (RP-3) in Table 2 are shown in Table 3.

TABLE 3

| Resin | Structure No. | Mw | Mw/Mn | Composition ratio | | | |
|---|---|---|---|---|---|---|---|
| RB-1 | A-1 | 8300 | 1.95 | 45 | 30 | 20 | 5 |
| RB-2 | A-2 | 7500 | 1.85 | 40 | 30 | 25 | 5 |
| RB-3 | A-3 | 8700 | 1.96 | 50 | 20 | 20 | 10 |
| RB-4 | A-4 | 9500 | 1.83 | 35 | 35 | 25 | 5 |
| RB-5 | A-5 | 9500 | 1.9 | 35 | 35 | 20 | 10 |
| RB-6 | A-6 | 9900 | 1.82 | 40 | 30 | 25 | 5 |
| RB-7 | A-7 | 6800 | 1.87 | 50 | 20 | 20 | 10 |
| RB-8 | A-8 | 8300 | 2.01 | 45 | 35 | 15 | 5 |
| RB-9 | A-9 | 9400 | 1.9 | 50 | 20 | 20 | 10 |
| RB-10 | A-10 | 7600 | 1.84 | 40 | 30 | 25 | 5 |
| RB-11 | A-11 | 7900 | 1.98 | 40 | 35 | 20 | 5 |
| RB-12 | A-12 | 7100 | 1.98 | 40 | 35 | 20 | 5 |
| RB-13 | A-13 | 9200 | 1.89 | 40 | 40 | 10 | 10 |
| RB-14 | A-14 | 8600 | 1.71 | 45 | 40 | 5 | 10 |
| RB-15 | A-15 | 8010 | 1.77 | 45 | 40 | 5 | 10 |
| RB-16 | A-16 | 7300 | 1.8 | 45 | 40 | 5 | 10 |
| RB-17 | A-8 | 8100 | 2.06 | 45 | 35 | 15 | 5 |
| RB-18 | A-10 | 5600 | 1.79 | 40 | 30 | 25 | 5 |
| RB-19 | A-3 | 5600 | 1.79 | 50 | 20 | 20 | 10 |
| RB-20 | A-10 | 5600 | 1.79 | 40 | 30 | 25 | 5 |
| RB-21 | A-3 | 5600 | 1.79 | 50 | 20 | 20 | 10 |
| RP-1 | P-1 | 7700 | 1.94 | 60 | 20 | 20 | |
| RP-2 | P-2 | 7910 | 1.91 | 45 | 20 | 20 | 15 |
| RP-3 | P-1 | 8100 | 2.06 | 40 | 20 | 40 | |

The resin structures (A-1) to (A-16) and (P-1) to (P-2) are shown below.

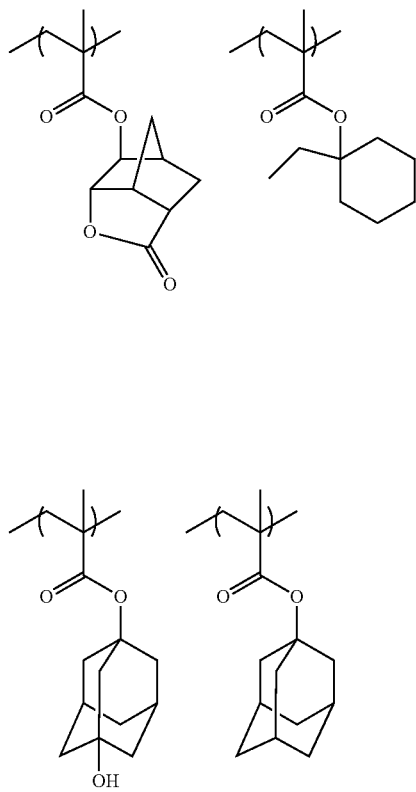

(A-1)

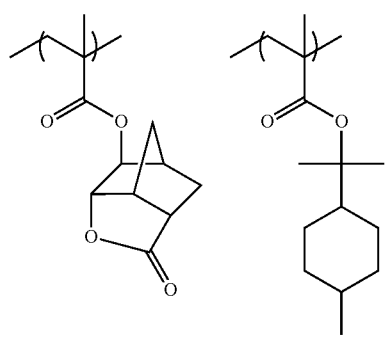
(A-2)
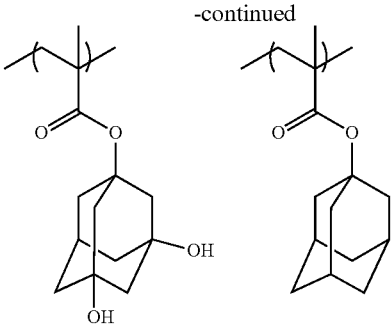
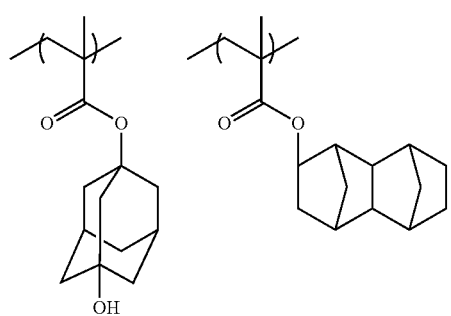
(A-3)
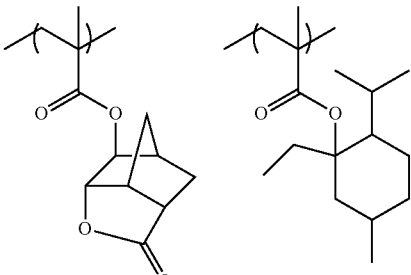
(A-5)
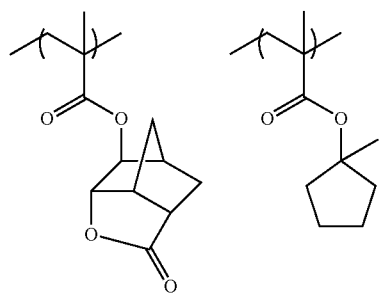
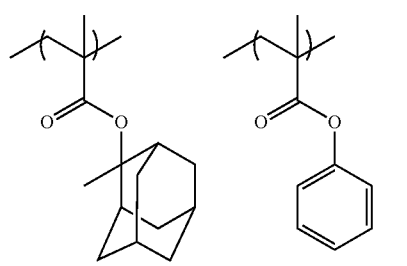
(A-4)
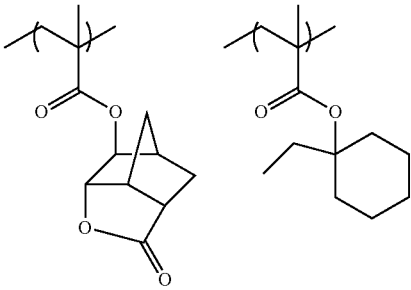
(A-6)
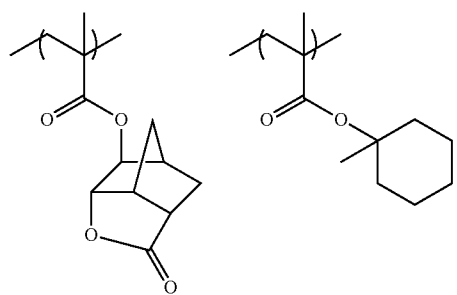
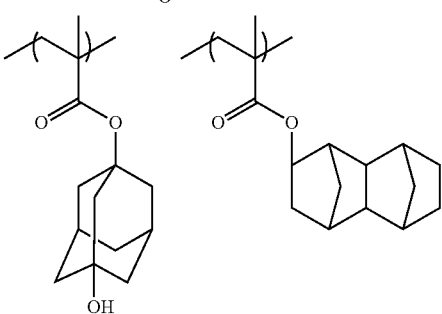

-continued
(A-7)
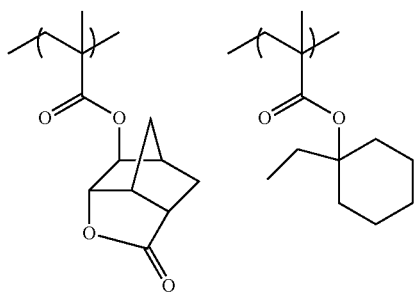
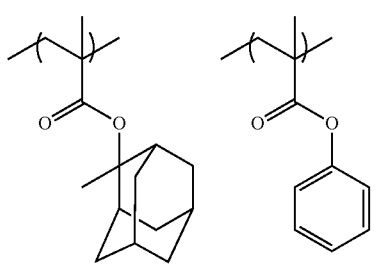
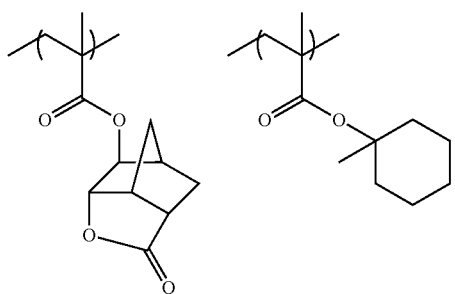
(A-8)
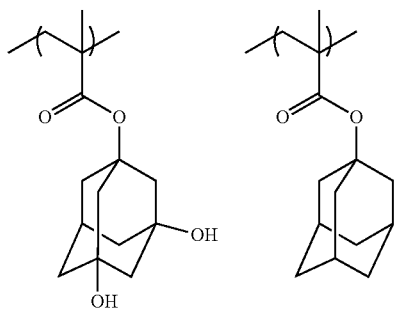
(A-9)
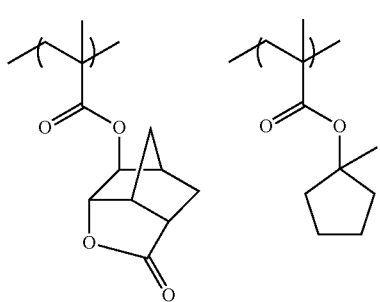
-continued
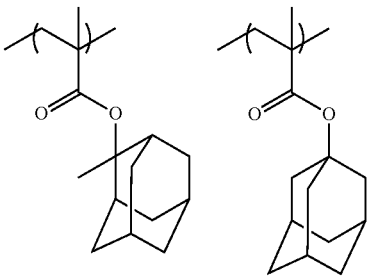
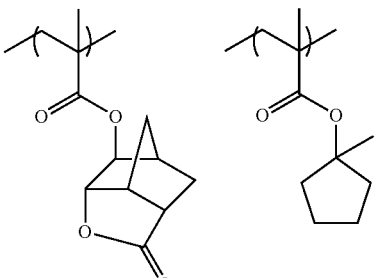
(A-10)
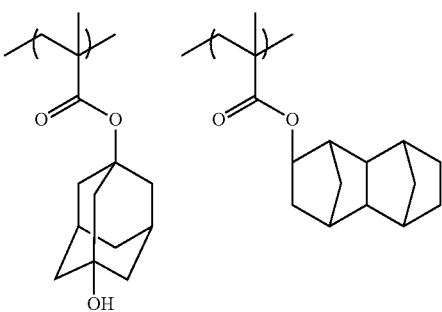
(A-11)
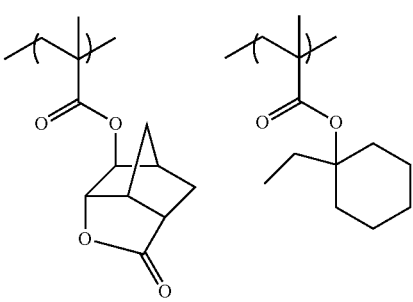
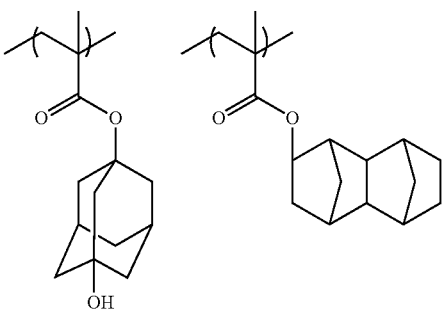

(A-12)
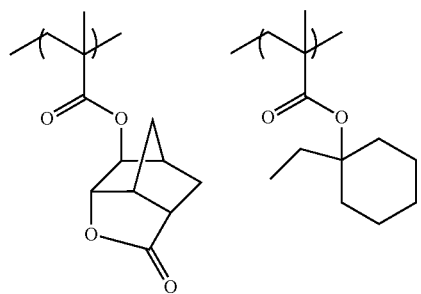
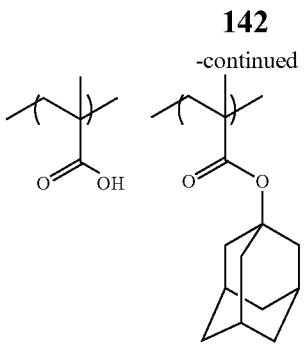
(A-15)
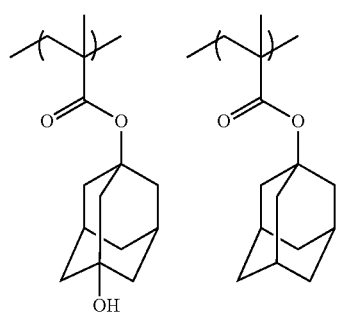
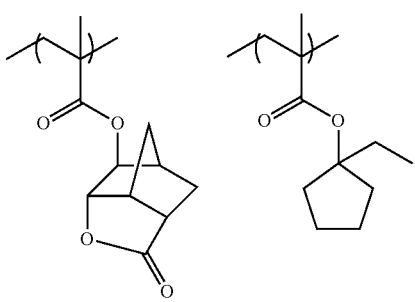
(A-13)
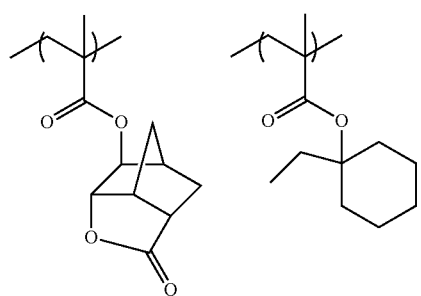
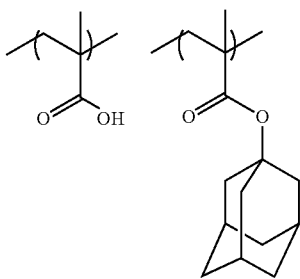
(A-16)
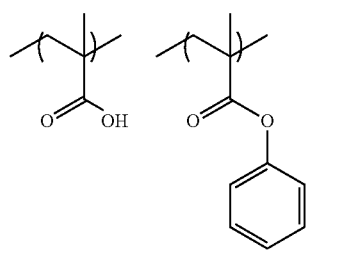
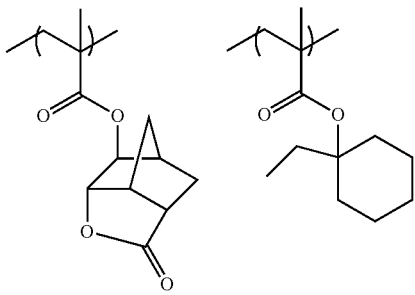
(A-14)
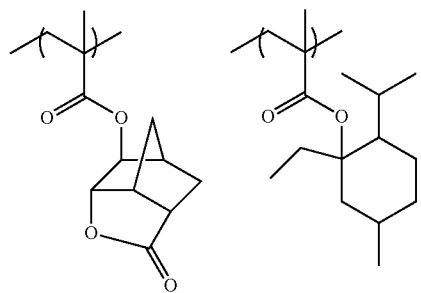
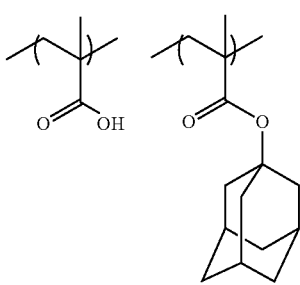

143
-continued
(P-1)
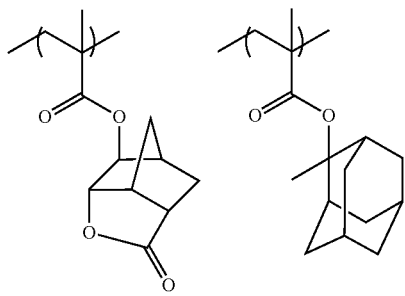
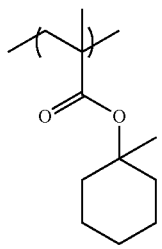
(P-2)
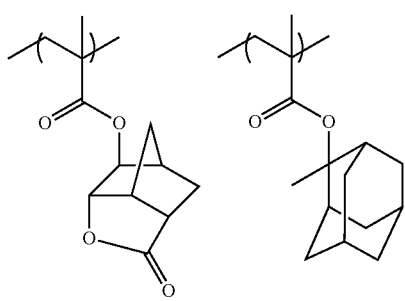
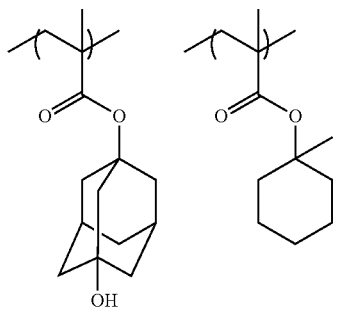
The symbols in Table 2 are as follows.
(Acid Generator)
PAG-1
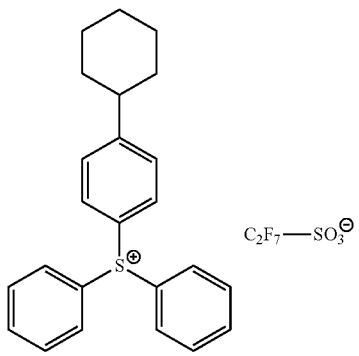
144
-continued
PAG-2
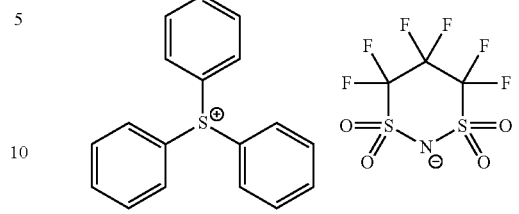
PAG-3
PAG-4
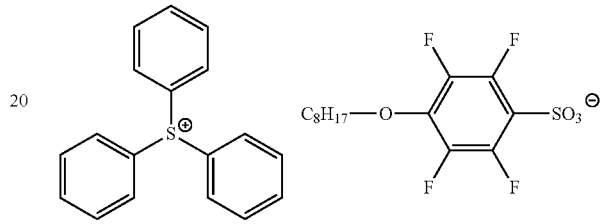
PAG-5
PAG-6
PAG-7
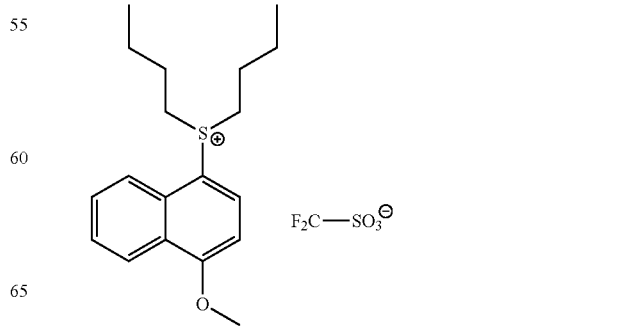

-continued

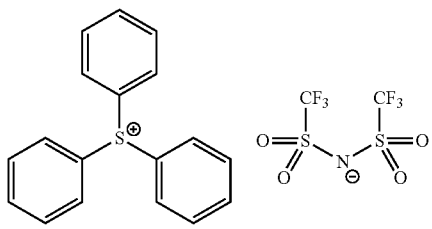

PAG-8

N-1: N,N-Dibutylaniline
N-2: Tri-n-octylamine
N-3: N,N-Dihydroxyethylaniline
N-4: 2,4,5-Triphenylismidazole
N-5: 2,6-Diisopropylaniline
N-6: Hydroxyantipyrine
N-7: Trismethoxymethoxyethylamine
N-8: Triethanolamine
W-1: MEGAFAC F176 (manufactured by Dainippon Ink and Chemicals, Incorporated) (fluorine Based Surfactant)
W-2: MEGAFAC R08 (manufactured by Dainippon Ink and Chemicals, Incorporated) (fluorine and Silicon Based Surfactant)
W-4: TROYSOL S-366 (manufactured by Troy Chemical Corporation)
(Solvent)
Group a
SL-1: Propylene glycol monomethyl ether acetate
SL-2: Propylene glycol monomethyl ether propionate
SL-3: 2-Heptane
Group b
SL-4: Ethyl lactate
SL-5: Propylene glycol monomethyl ether
SL-6: Cyclohexanone
Group c
SL-7: γ-Butyrolactone
SL-8: Propylene glycol
(Additive)

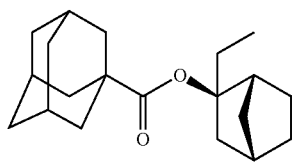

AD-1

It is evident from Table 2 that the positive resist composition of the invention is excellent in especially resolving power, isolated DOF and FEB temperature dependency in addition to pattern collapse and development defect.

The present application claims foreign priority based on Japanese Patent Application (JP 2006-015348) filed Jan. 24 of 2006, Japanese Patent Application (JP 2006-064476) filed Mar. 9 of 2006, the contents of which is incorporated herein by reference.

What is claimed is:

1. A positive photosensitive composition comprising:
a resin (A) whose dissolution rate in an alkaline developing solution increases by the action of an acid, the resin (A) containing an acid decomposable repeating unit represented by a general formula (I) and an acid nondecomposable repeating unit represented by a general formula (II);
a compound (B) capable of generating an acid upon irradiation with one of active rays and radiations; and
a basic compound (C):

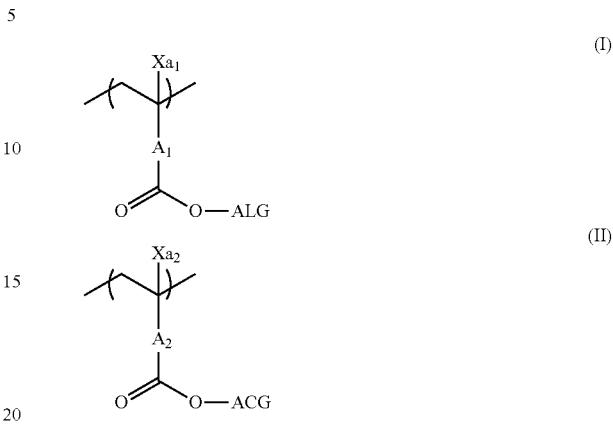

wherein
$Xa_1$ represents one of a hydrogen atom, an alkyl group, a cyano group and a halogen atom,
$A_1$ represents one of a single bond and a divalent connecting group,
ALG represents an acid leaving hydrocarbon group and has a polycyclic hydrocarbon structure,
$Xa_2$ represents one of a hydrogen atom, an alkyl group, a cyano group and a halogen atom,
$A_2$ represents one of a single bond and a divalent connecting group, and
ACG represents an acid nonleaving hydrocarbon group which does not have a polycyclic hydrocarbon structure and does not contain a polar substituent,
and further wherein the acid nondec mposable repeating unit represented by the general formula (II) is contained in an amount of 1 to 25% by mole based on all of the repeating nits in the resin (A), and
the content of the acid decomposable repeating unit represented by formula (I) is 40 to 60% by mole based on all of the repeating units in the resin (A).

2. The positive photosensitive composition according to claim 1, wherein the acid decomposable repeating unit represented by the general formula (I) is an acid decomposable repeating unit represented by a general formula (I-1):

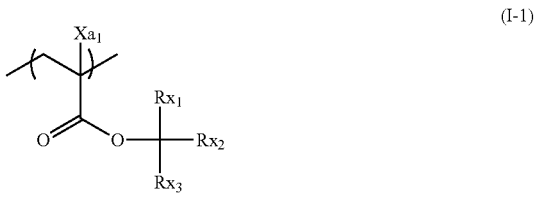

wherein
$Xa_1$ represents one of a hydrogen atom, an alkyl group, a cyano group and a halogen atom,
$Rx_1$ to $Rx_3$ each independently represents a linear or branched alkyl group, or a monocyclic or polycyclic alkyl group, provided that at least two of $Rx_1$ to $Rx_3$ may be taken together to form one of a monocyclic and polycyclic alkyl group, and
the $-O(Rx_1)(Rx_2)(Rx_3)$ moiety includes a polycyclic hydrocarbon structure.

3. The positive photosensitive composition according to claim 1, wherein the acid nondecomposable repeating unit represented by the general formula (II) is an acid nondecomposable repeating unit represented by a formula (II-1):

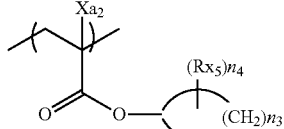

(II-1)

wherein

Xa$_2$ represents one of a hydrogen atom, an alkyl group, a cyano group and a halogen atom, Rx$_5$ represents a linear or branched alkyl group, or a monocyclic alkyl group, n$_3$ represents one of 4 and 5, and n$_4$ represents from 0 to 3.

4. The positive photosensitive composition according to claim 1, wherein the component (A) further comprises at least one kind of a repeating unit selected from a lactone-group containing repeating unit, a hydroxyl-group containing repeating unit, a cyano-group containing repeating unit, and an acid-group containing repeating unit.

5. A method of forming a pattern comprising:

forming a photosensitive layer with the positive photosensitive composition according to claim 1; and pattern-wise exposing and developing the photosensitive layer.

6. The method of forming a pattern according to claim 5, wherein the pattern-wise exposure step is a pattern-wise immersion exposure.

7. The positive photosensitive composition according to claim 1, wherein the acid decomposable repeating unit represented by ALG in the general formula (I) is selected from the group consisting of the following repeating units:

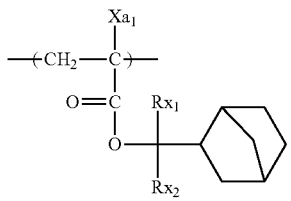

I-1a-6

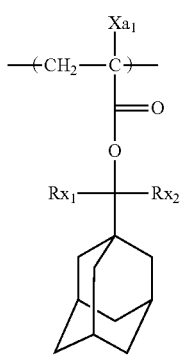

I-1a-7

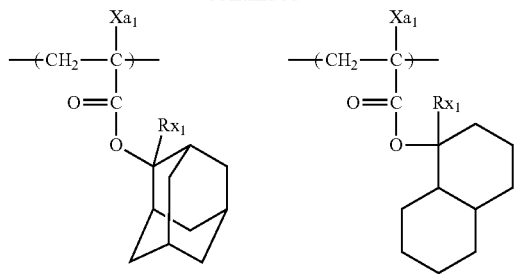

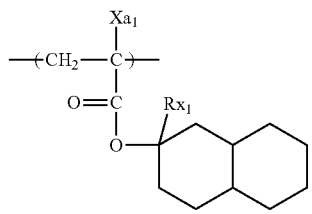

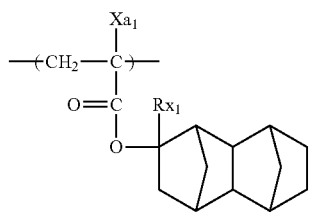

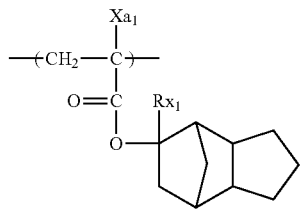

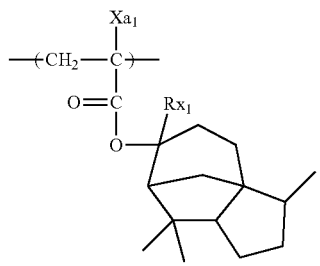

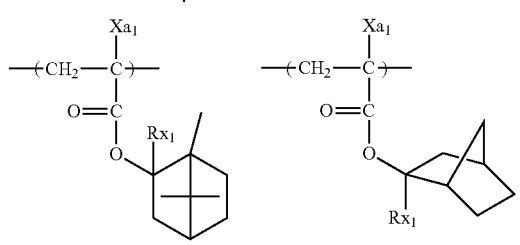

wherein Xa$_1$ represents one of a hydrogen atom, an alkyl group, a cyano group and a halogen atom; and Rx$_1$ and Rx$_2$ each independently represents a linear or branched alkyl group, or a monocyclic alkyl group.

8. The positive photosensitive composition according to claim 1, wherein the acid non-decomposable repeating unit represented by formula (II) is selected from the group consisting of the following repeating units:

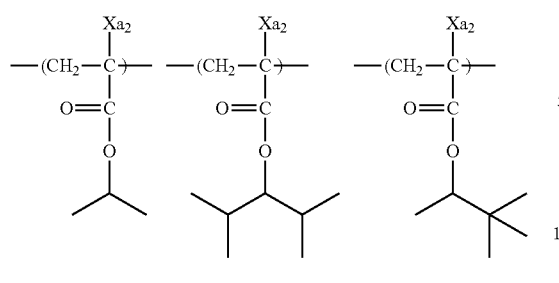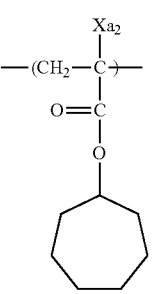

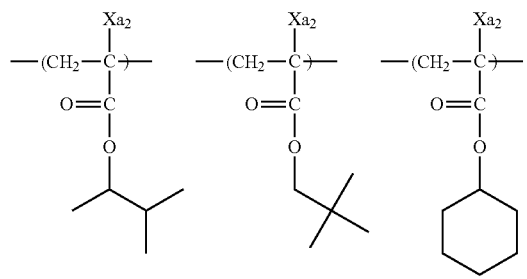

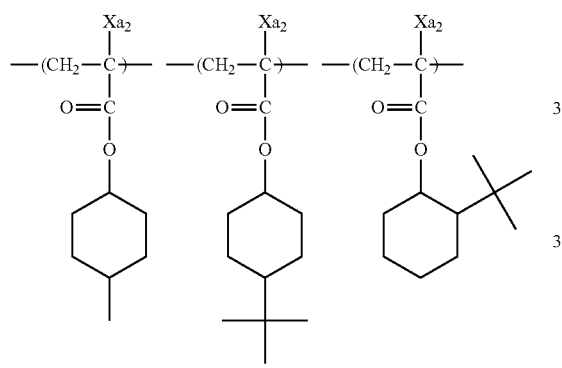

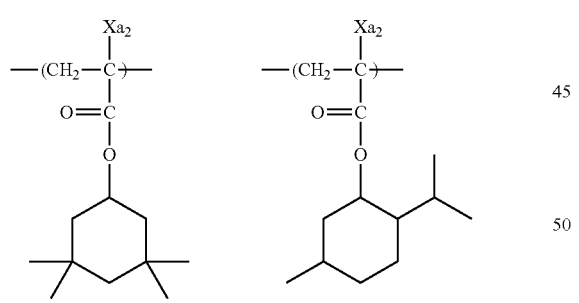

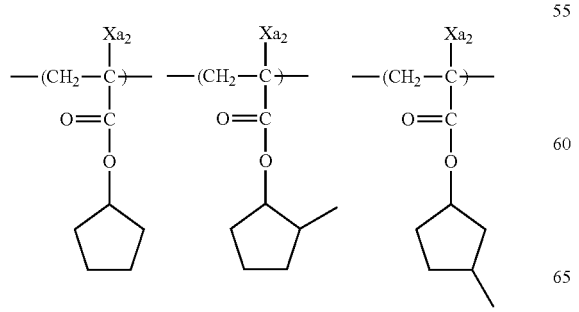

wherein $Xa_2$ represents one of a hydrogen atom, an alkyl group, a cyano group and a halogen atom.

9. The positive photosensitive composition according to claim 1, wherein the acid nonleaving hydrocarbon group represented by ACG in formula (II) is a hydrocarbon group composed of only carbon atoms and hydrogen atoms.

10. The positive photosensitive composition according to claim 1, wherein the resin (A) contains a repeating unit containing a group having a lactone structure represented by any one of the following general formulae (LC1-1) to (LC1-16):

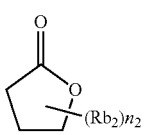

LC1-1

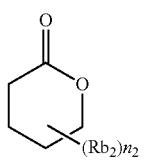

LC1-2

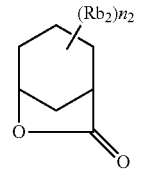

LC1-3

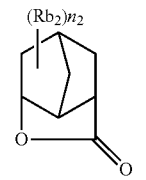

LC1-4

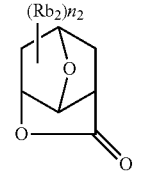

LC1-5

-continued

LC1-6 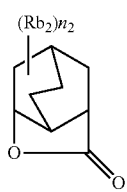

LC1-7 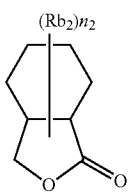

LC1-8 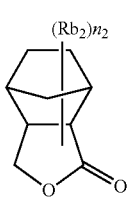

LC1-9 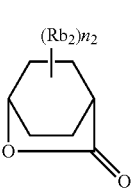

LC1-10 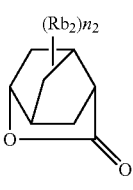

LC1-11 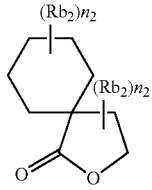

LC1-12 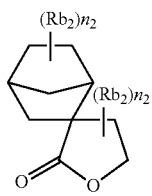

LC1-13 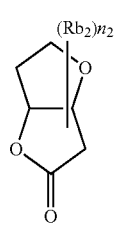

-continued

LC1-14 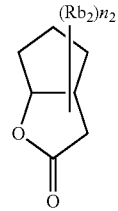

LC1-15 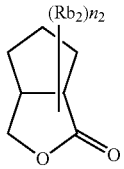

LC1-16 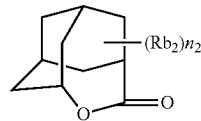

wherein $Rb_2$ represents an alkyl group having from 1 to 8 carbon atoms, an alkoxy group having from 1 to 8 carbon atoms, an alkoxycarbonyl group having from 1 to 8 carbon atoms, a carboxyl group, a halogen atom, a hydroxyl group, a cyano group, or an acid decomposable group; and $n_2$ represents an integer of from 0 to 4.

11. The positive photosensitive composition according to claim 1, wherein the resin (A) does not contain an aromatic group.

12. The positive photosensitive composition according to claim 1, wherein the composition contains a mixed solvent of a solvent containing a hydroxyl group in a structure thereof and a hydroxyl group-free solvent as the organic solvent.

13. The positive photosensitive composition according to claim 1, wherein the resist composition further contains a carboxyl acid onium salt.

14. The positive photosensitive composition according to claim 1, wherein the acid nondecomposable repeating unit represented by the general formula (II) is contained in an amount of 5 to 15% by mole based on all of the repeating units in the resin (A).

15. The positive photosensitive composition according to claim 1, wherein the compound (B) is represented by formula (ZI) or (ZII):

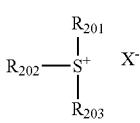  ZI

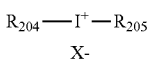  ZII wherein $R_{201}$, $R_{202}$ and $R_{203}$ each independently represents an organic group, $R_{204}$ and $R_{205}$ each independently represents an aryl group, an alkyl group, or a cycloalkyl group, and X⁻ is an organic anion represented by formula (AN1), $Rc_1$—$SO_3^\ominus$  AN1 wherein $Rc_1$ is a group represented by the following formula:

wherein $Rc_6$ represents a perfluoroalkylene group having not more than 4 carbon atoms, or a phenylene group substituted with from 1 to 4 fluorine atoms and/or from 1 to 3 fluoroalkyl groups, Ax represents a connecting group, and $Rc_7$ represents a monocyclic or polycyclic alkyl group, or an aryl group.

16. The positive photosensitive composition according to claim 15, wherein Ax is a connecting group selected from the group consisting of —O—, —$CO_2$—, —S—, —$SO_3$— and —$SO_2N(Rd_1)$-, where $Rd_1$ represents a hydrogen atom or an alkyl group and may be taken together with $Rc_7$ to form a ring structure.

17. The positive photosensitive composition according to claim 15, wherein $Rc_7$ is an adamantyl group.

18. The positive photosensitive composition according to claim 10, wherein the group having a lactone structure is represented by (LC1-4).

19. The positive photosensitive composition according to claim 1, wherein the content of the acid decomposable repeating unit represented by formula (II) is 5 to 10% by mole based on all the repeating units.

20. The positive photosensitive composition according to claim 1, wherein ACG in formula (II) is a linear or branched hydrocarbon structure.

21. The positive photosensitive composition according to claim 1, wherein all repeating units of the resin (A) are (meth)acrylate based repeating units.

* * * * *